(12) United States Patent
Price

(10) Patent No.: US 10,406,802 B2
(45) Date of Patent: Sep. 10, 2019

(54) COMPUTER-AIDED MANUFACTURING PROCESS FOR GENERATING MODULAR DIRECT CURRENT BATTERY ADAPTER AND VOLTMETER DEVICE

(71) Applicant: Thomas Alexander Price, Austin, TX (US)

(72) Inventor: Thomas Alexander Price, Austin, TX (US)

( * ) Notice: Subject to any disclaimer, the term of this patent is extended or adjusted under 35 U.S.C. 154(b) by 143 days.

(21) Appl. No.: 15/438,416

(22) Filed: Feb. 21, 2017

(65) Prior Publication Data

US 2017/0288357 A1    Oct. 5, 2017

Related U.S. Application Data

(60) Provisional application No. 62/317,384, filed on Apr. 1, 2016.

(51) Int. Cl.
| | | |
|---|---|---|
| *B33Y 50/00* | (2015.01) | |
| *G01R 31/36* | (2019.01) | |
| *B33Y 10/00* | (2015.01) | |
| *G01R 31/3835* | (2019.01) | |
| *G01R 19/00* | (2006.01) | |
| *G01R 31/378* | (2019.01) | |

(52) U.S. Cl.
CPC .............. *B33Y 50/00* (2014.12); *B33Y 10/00* (2014.12); *G01R 19/00* (2013.01); *G01R 31/3835* (2019.01); *G01R 31/378* (2019.01)

(58) Field of Classification Search
CPC .............. G01R 31/378; G01R 31/3835; G01R 31/3842; G01R 31/385; B33Y 50/00
See application file for complete search history.

(56) References Cited

U.S. PATENT DOCUMENTS

| | | | | |
|---|---|---|---|---|
| 4,860,901 | A * | 8/1989 | Hochreuther | .......... G01D 11/24 |
| | | | | 206/586 |
| 5,317,247 | A | 5/1994 | Chong | |
| 6,255,815 | B1 * | 7/2001 | Davey | .................. G01R 33/028 |
| | | | | 324/202 |
| 6,867,604 | B2 | 3/2005 | Haldeman | |
| 7,468,602 | B2 * | 12/2008 | Sleeman | .............. G01R 15/125 |
| | | | | 324/115 |
| 8,311,753 | B2 | 11/2012 | Rocci | |
| 2011/0068734 | A1 | 3/2011 | Waldron | |
| 2015/0066416 | A1 | 3/2015 | Loftus | |
| 2016/0218523 | A1 | 7/2016 | Curtis | |

FOREIGN PATENT DOCUMENTS

| | | |
|---|---|---|
| WO | 0313925 | 2/2003 |
| WO | 2008090378 A1 | 7/2008 |

* cited by examiner

*Primary Examiner* — Walter L Lindsay, Jr.
*Assistant Examiner* — Milton Gonzalez
(74) *Attorney, Agent, or Firm* — Edward J. Marshall

(57) ABSTRACT

A mobile voltmeter device housing for mating with a direct current battery terminal housing including two battery pin connector type terminals may include a voltmeter housing for housing a voltmeter microchip and a voltmeter digital display, a mating housing for mating the voltmeter device housing with a direct current battery having a terminal housing comprising two gendered pin connector type terminals, and a terminal housing for housing two electrically conductive wires and a portion of two device pin connector type terminals.

20 Claims, 47 Drawing Sheets

US 10,406,802 B2

COMPUTER-AIDED MANUFACTURING PROCESS FOR GENERATING MODULAR DIRECT CURRENT BATTERY ADAPTER AND VOLTMETER DEVICE

CROSS-REFERENCE TO RELATED APPLICATION

The present U.S. Utility Patent Application claims priority pursuant to 35 U.S.C. § 119(e) to U.S. Provisional Application Ser. No. 62/317,384, entitled "Computer-Aided Manufacturing Process for Generating Modular Direct Current Battery Adapter and Voltmeter Device," filed on Apr. 1, 2016, which is hereby incorporated herein by reference in its entirety and made part of the present U.S. Utility patent application for all purposes.

FIELD OF THE DISCLOSURE

The present disclosure generally relates to direct current battery power storage measurement and computer-aided manufacturing processes for generating devices capable of measuring remaining voltage of a direct current battery.

BACKGROUND

Many portable devices in several different industries require the use of direct current (DC) batteries. There is no single, or unified standard for the shape, size, or design of the DC battery pin connector type terminals or DC battery terminal housings that allow the DC batteries to mate with the portable devices they power. As a consequence, DC battery terminal housings have many different designs and/or configurations, and those who wish to mate a given DC battery with a device must design the mating housing for that device to mate with that specific DC battery's terminal housing. Similarly, a power-reading device that assesses the remaining power in a DC battery must also be capable of reading the remaining voltage of the battery, regardless of the terminals or terminal housings used by that battery.

Additionally, portable devices often require DC battery replacements due to rapid depletion of the DC battery. With some portable devices, such as robotics devices, aeronautics devices, avionics devices, cellular telephone devices, and radio communication devices, it is often important to determine whether the DC battery within the device will hold charge for the duration of time the user will spend away from a charging station or a source of replacement batteries. In those cases, it is important to have an efficient way to assess the remaining power in a DC battery having a terminal housing of any shape, size, or design.

Often times, users of portable devices need to assess the remaining power for a given DC battery, or for a potential replacement battery quickly and efficiently. For example, in a robotics competition, competitors often have a matter of moments between competitive rounds, requiring the DC battery to be replaced. As another example, maintenance crews in the aeronautics industry have a short amount of time to perform all necessary maintenance on aircraft in between flights, leaving a minimal amount of time to ensure all required DC batteries have been adequately charged, or replaced with adequately charged DC batteries. Thus, there is a need in the art to ensure an accurate, rapid power measurement of DC batteries having any type of terminal housing configuration or design. Embodiments of the voltmeter device housing for mating with a direct current battery terminal housing with at least two pin connector type terminals, and the computer-aided manufacturing process for fabricating such an apparatus described herein solve this problem.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

Figure 1A:
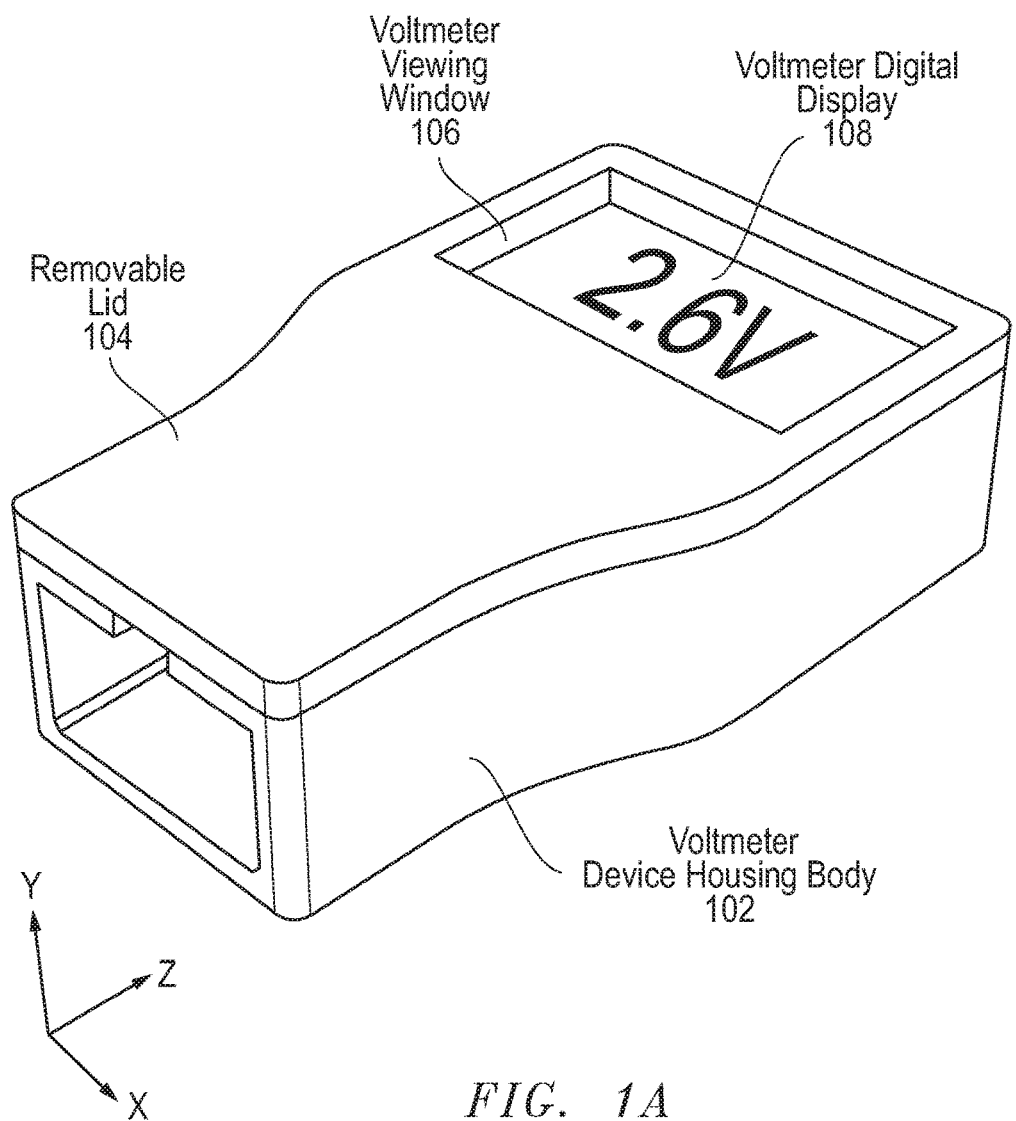
FIG. 1A is a graphical diagram illustrating a perspective view of an integrated voltmeter device housing according to an embodiment of the present disclosure.

The following description in combination with the Figures is provided to assist in understanding the teachings disclosed herein. The following discussion will focus on specific implementations and embodiments of the teachings.

This focus is provided to assist in describing the teachings and should not be interpreted as a limitation on the scope or applicability of the teachings. However, other teachings may be utilized in this application, as well as in other applications.

For purposes of this disclosure, a voltmeter device housing for mating with a direct current battery terminal housing with at least two pin connector type terminals may include any instrumentality or aggregate of instrumentalities operable to house a voltmeter in such a way that the voltmeter may measure the remaining voltage of a direct current battery, wherein the direct current battery has any orientation or number of pin connector type terminals in the battery terminal housing. For example, a voltmeter housed within the voltmeter device housing for mating with a direct current battery terminal housing with at least two pin connector type terminals may be capable of measuring the remaining power in a battery of any voltage, amperage, or use, and the voltmeter device housing allows an electrically conductive connection to be made between the device pin connector type terminals and the battery pin connector type terminals regardless of the number or orientation of battery pin connector type terminals in the battery terminal housing, or the design of the battery terminal housing itself.

A voltmeter device housing for mating with a direct current battery terminal housing with at least two pin connector type terminals may vary in size, shape, performance, functionality, and price. A pin connector type terminal in an embodiment may include, but may not be limited to a female socket connector, or a male pin connector. A voltmeter may be housed within the voltmeter device housing and may operate to measure the remaining voltage of a direct current battery having a male terminal housing, a female terminal housing, or a terminal housing having both male and female aspects combined. A voltmeter device housing for mating with a direct current battery terminal housing with at least two pin connector type terminals may house a voltmeter, at least two electrically conductive wires, at least two electrically conductive device pin connector type terminals, and may comprise a voltmeter housing, a terminal housing, and a mating housing or equivalent structures. Additional embodiments may include a water resistant coating applied to the voltmeter, a voltmeter having the ability measure voltages of at least 7.2 Volts and accuracy within 0.036 Volts, a voltmeter capable of providing voltage readings within one second of connection to the battery, mating housing terminal structures for insertion of a male battery terminal housing into a female device mating housing, and/or mating terminal channels for insertion of the male device mating housing into the female direct current battery terminal housing.

For further purposes of this disclosure, a computer-aided manufacturing process for generating a voltmeter device housing for mating with a direct current battery terminal housing with at least two pin connector type terminals may include any manufacturing process or aggregate of manufacturing processes operable to generate a three-dimensional model of and fabricate an apparatus operable to measure the remaining voltage of a direct current battery with a voltmeter, wherein the direct current battery has any orientation or number of pin connector type terminals in the battery terminal housing, and to integrate a voltmeter, electrically conductive wires, and two or more pin connector type terminals within the voltmeter device housing. A computer-aided manufacturing process for manufacturing a voltmeter device housing for mating with a direct current battery terminal housing with at least two pin connector type terminals may vary in method of generating a computer-aided three-dimensional digital model of the apparatus, the method of fabrication of the apparatus, materials used in the fabrication process, performance, manufacturing speed, and price. Additional computer-aided manufacturing processes for manufacturing the apparatus may include three-dimensional printing methods, specifically.

It is understood that aspects of the disclosed invention may be embodied as an apparatus, system, method, manufacturing process, or product by process. Aspects of the disclosed embodiments are described below with reference to flow diagrams and/or graphical diagrams of methods and apparatus.

Embodiments of the computer-aided manufacturing process for manufacturing a voltmeter device housing for mating with a direct current battery terminal housing with at least two pin connector type terminals described herein fulfill the need to fabricate devices that house voltmeters in such a way as to allow for measurement of the remaining power in any given DC battery with any given pin connector type terminal or battery terminal housing design rapidly and efficiently. Further, embodiments of the voltmeter device housing for mating with a direct current battery terminal housing with at least two pin connector type terminals described herein fulfill the need to measure the remaining power in any given DC battery rapidly and efficiently. These embodiments describe a voltmeter device housing comprising a voltmeter housing, terminal housing, and gendered mating housing which is designed specifically to mate with the oppositely gendered DC battery to be measured, as well as a method for manufacturing such a voltmeter device housing. The embodiments can include different mating housings for different DC batteries, allowing for the manufacture of devices to be used to measure power readings of any DC battery, regardless of pin connector type terminals or battery terminal housing design. In addition, these embodiments allow a solid mating to be made between the device mating housing and battery terminal housing, ensuring an accurate reading. Finally, these embodiments are small, lightweight, portable, and provide a quick and efficient power-reading for any DC battery.

FIG. 1A

FIG. 1A is a graphical diagram illustrating a perspective view of an integrated voltmeter device housing according to an embodiment of the present disclosure. As described in greater detail below, in an embodiment, a voltmeter device comprising a voltmeter digital display 108, a voltmeter microchip (not shown), and two or more electrically conductive wires (not shown) may be operably connected to two or more pin connector type terminals (not shown). A voltmeter device housing in an embodiment may comprise a voltmeter device housing body 102 and a removable lid 104 having a voltmeter viewing window 106. As also described in greater detail below, the voltmeter digital display 108, voltmeter microchip (not shown), two or more electrically conductive wires (not shown), and two or more pin connector type terminals (not shown) may be housed within the voltmeter device housing, such that pin connector type terminals of a battery (not shown) may mate with the side of the voltmeter device housing opposite the voltmeter digital display 108, make electrically conductive contact with the two or more pin connector type terminals (not shown) housed within the voltmeter device housing, causing the voltmeter digital display 108 to display the voltage remaining within the batter (not shown).

As shown in FIG. 1A, the voltmeter digital display 108 in an embodiment may be enclosed within a voltmeter device housing body 102 by a removable lid 104 adhered to the voltmeter device housing body 102. As also shown in FIG. 1A, the voltmeter digital display 108 may be visible through the voltmeter viewing window 106 after the voltmeter digital display 108 is enclosed within the voltmeter device housing body 102. Other embodiments may include the voltmeter digital display 108 being enclosed within a sloped voltmeter device housing body (not shown) by a sloped removable lid (not shown) adhered to the sloped voltmeter device housing body (not shown), as described in greater detail below.

FIG. 1B

Figure 1B:
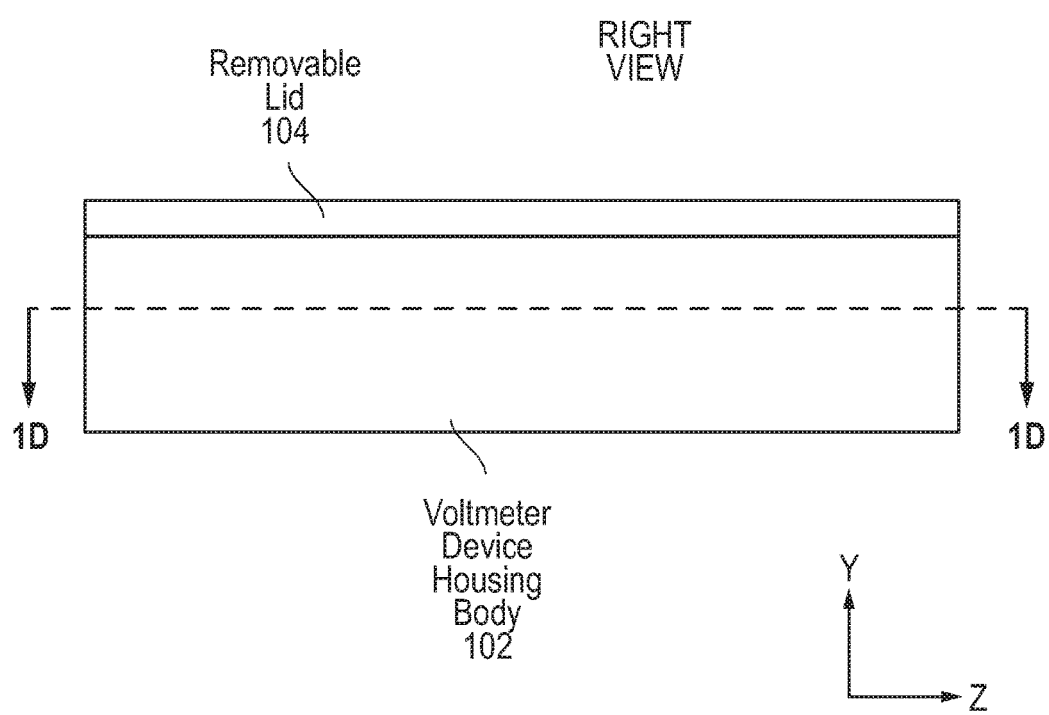
FIG. 1B is a graphical diagram illustrating a right side view of an integrated voltmeter device housing according to an embodiment of the present disclosure.

FIG. 1B is a graphical diagram illustrating a right side view of an integrated voltmeter device housing according to an embodiment of the present disclosure. As described above, a voltmeter device housing in an embodiment may comprise a voltmeter device housing body 102 and a removable lid 104. The voltmeter device housing body 102 and removable lid 104 may operate to enclose a voltmeter digital display, a voltmeter microchip, two or more electrically conductive wires, and two or more pin connector type terminals, such that two or more pin connector type terminals of a battery may mate with the side of the voltmeter device housing opposite the voltmeter digital display, and make electrically conductive contact with the two or more pin connector type terminals housed within the voltmeter device housing, causing the voltmeter digital display to display the voltage remaining within the battery.

FIG. 1C

Figure 1C:
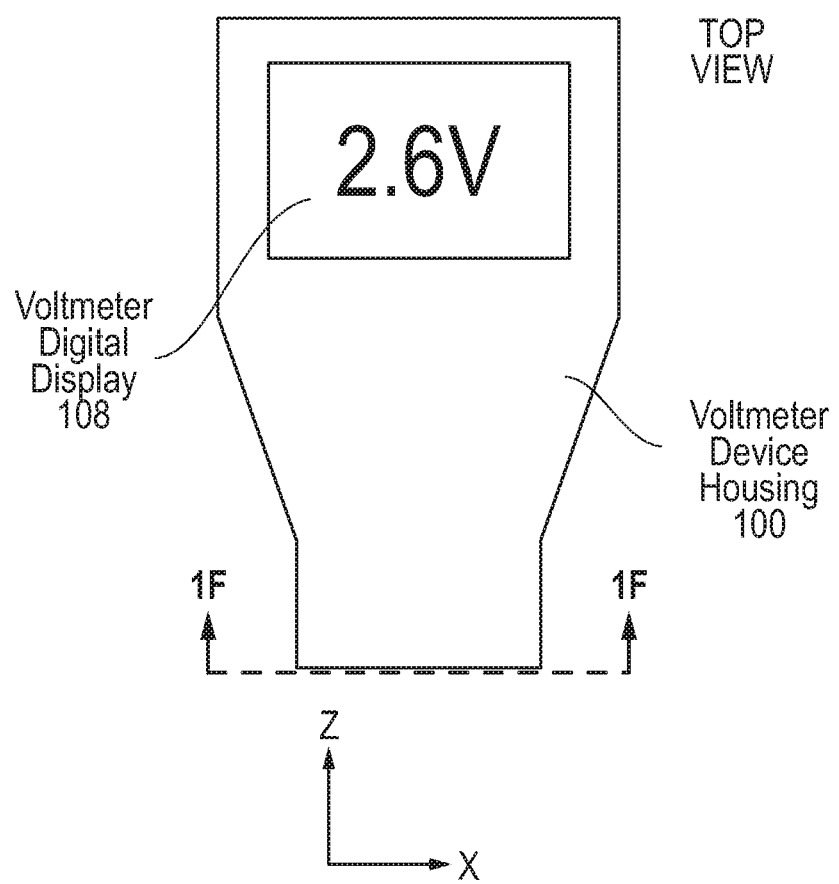
FIG. 1C is a graphical diagram illustrating a top view of an integrated voltmeter device housing according to an embodiment of the present disclosure.

FIG. 1C is a graphical diagram illustrating a top view of an integrated voltmeter device housing according to an embodiment of the present disclosure. As shown in FIG. 1C, the voltmeter digital display 108 in an embodiment may be enclosed within a voltmeter device housing 100. As also shown in FIG. 1C, the voltmeter digital display 108 may be visible through the voltmeter viewing window after the voltmeter digital display 108 is enclosed within the voltmeter device housing 100.

FIG. 1D

Figure 1D:
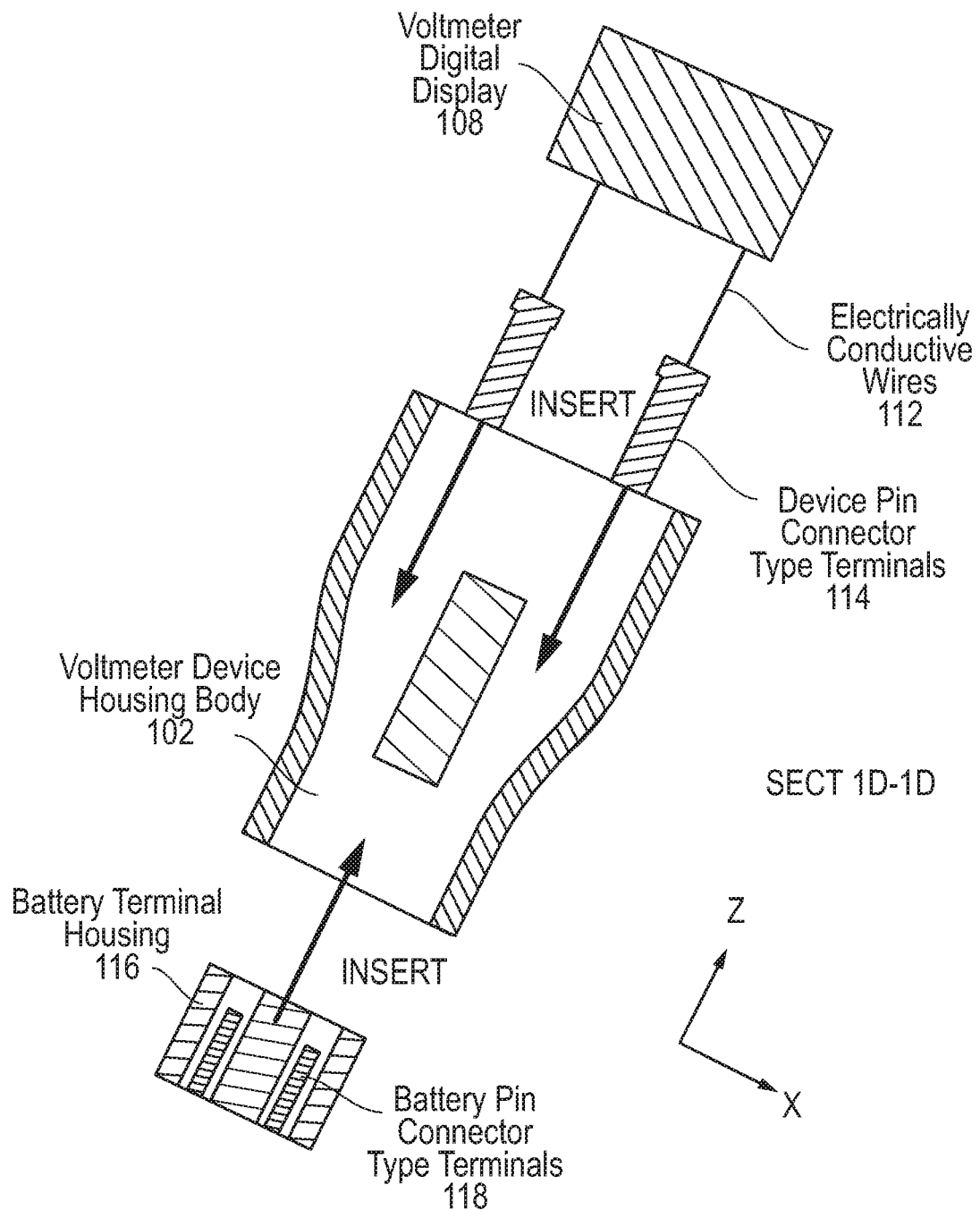
FIG. 1D is a graphical diagram illustrating an exploded, cross-sectional view of an integrated voltmeter device housing according to an embodiment of the present disclosure.

FIG. 1D is a graphical diagram illustrating an exploded, cross-sectional view of an integrated voltmeter device housing according to an embodiment of the present disclosure. As shown in FIG. 1D, a voltmeter in an embodiment may comprise a voltmeter digital display 108. Two or more electrically conductive wires 112 in an embodiment may each be operatively connected to the voltmeter microchip, which may be operatively connected to the voltmeter digital display 108, and to a device pin connector type terminal 114. As shown in FIG. 1D, the voltmeter digital display 108, voltmeter microchip (not shown), electrically conductive wires 112 and device pin connector type terminals 114 may be inserted into the voltmeter device housing body 102.

A voltmeter digital display 108 in an embodiment may include, but may not be limited to an LED display of a number value representing the measured remaining voltage. In other embodiments, a voltmeter digital display 108 may include other indicators of measured remaining voltage, including, but not limited to a series of individual LEDs that each represent a measured voltage as a ratio of the battery's full capacity capability. For example, in an embodiment, a voltmeter digital display 108 may include five LEDs, each representing 20% of the total capacity of the battery. In such an embodiment, if the measured voltage were equivalent to 40% of the battery's capacity, two of the five LEDs may emit light.

As also shown in FIG. 1D, a battery terminal housing 116 may house two oppositely gendered battery pin connector type terminals 118, and may operate to mate with a voltmeter device housing body 102. As shown in FIG. 1D, in an embodiment, the voltmeter device housing body 102 may comprise a female mating housing for mating with a male battery terminal housing 116 by inserting the male battery terminal housing 116 into the voltmeter device housing body 102 via the mating housing. However, in other embodiments, the voltmeter device housing body 102 may comprise a male mating housing for mating with a female battery terminal housing (not shown), as discussed in greater detail below, or may include a mating housing with both male and female aspects for mating with a battery terminal housing having the opposites gendered male and female aspects.

Inserting the voltmeter digital display 108, voltmeter microchip (not shown), electrically conductive wires 112, and device pin connector type terminals 114 into the voltmeter device housing body 102, then mating the battery terminal housing 116 with the voltmeter device housing body 102 may allow each device pin connector type terminal 114 to make electrically conductive contact with one of the battery pin connector type terminals 118. Once the device pin connector type terminals 114 make electrically conductive contact with the battery pin connector type terminals 118, current may circulate between the battery and the voltmeter microchip 110, allowing the voltmeter microchip 110 to assess the remaining voltage of the DC battery, and to display the remaining voltage of the DC battery upon the voltmeter digital display 108.

FIG. 1E

Figure 1E:
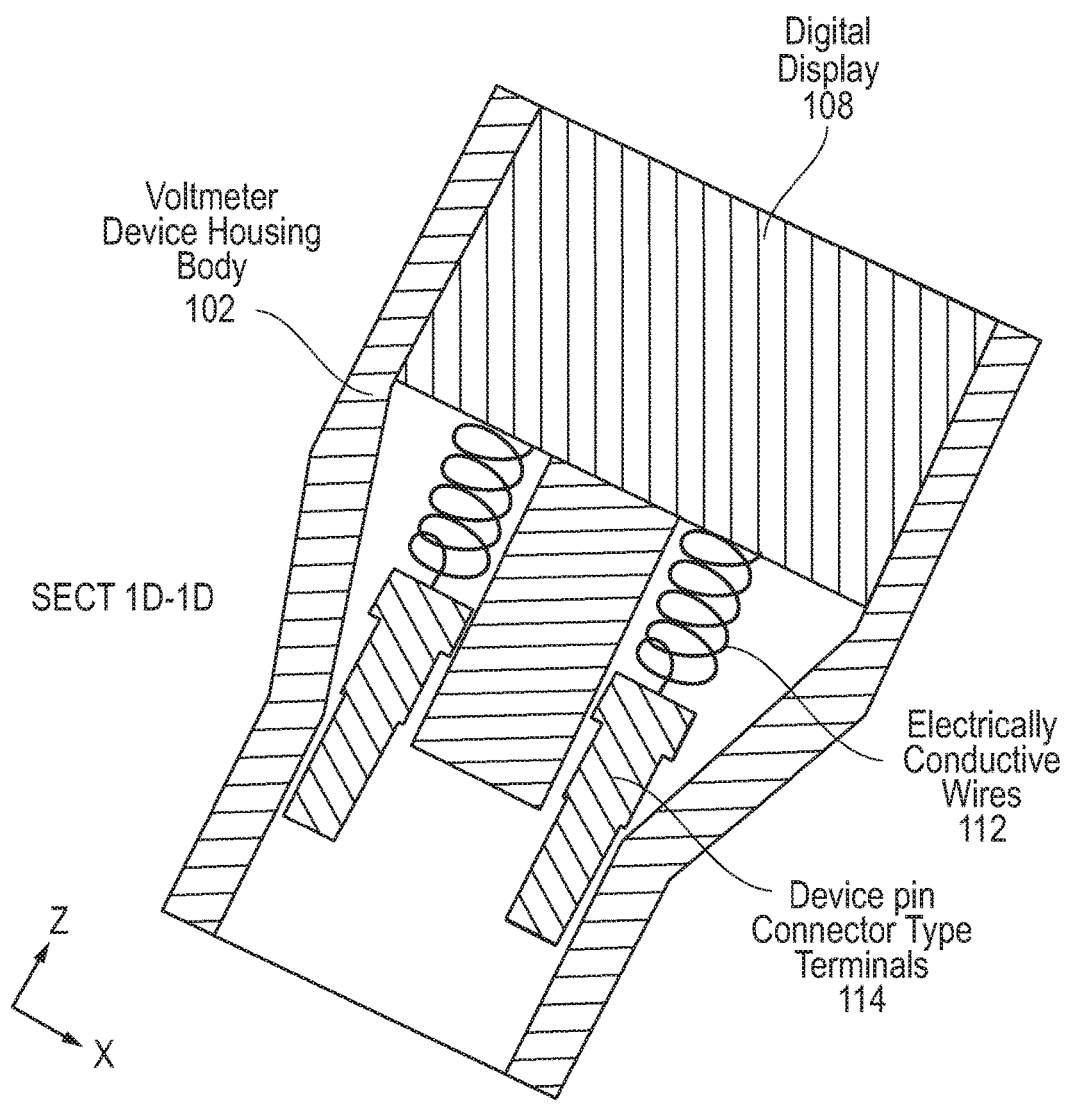
FIG. 1E is a graphical diagram illustrating a cross-sectional view of an integrated voltmeter device housing according to an embodiment of the present disclosure.

FIG. 1E is a graphical diagram illustrating a cross-sectional view of an integrated voltmeter device housing according to an embodiment of the present disclosure. As shown in FIG. 1E, the device pin connector type terminals 114 may be inserted toward the end of the voltmeter device housing body 102 which may mate with a battery terminal housing, such that a portion of each of the device pin connector type terminals 114 is disposed within the exterior walls of the mating housing. The device pin connector type terminals 114 may extend a distance into the mating housing to allow for electrically conductive contact to be made between each of the device pin connector type terminals 114 and one of the battery pin connector type terminals (not shown) upon mating of the voltmeter device housing body 102 and a battery terminal housing (not shown).

As discussed above, a voltmeter device housing may incorporate a gendered mating housing for mating with a battery terminal housing having the opposite gender. For example, the mating housing may be a female mating housing for housing socket (female) terminals, and for mating with a male battery terminal housing, as shown in FIG. 1E. As also shown in FIG. 1E, the electrically conductive wires 112, voltmeter digital display 108, and voltmeter microchip (not shown) may be inserted into the voltmeter device housing body 102.

FIG. 1F

Figure 1F:
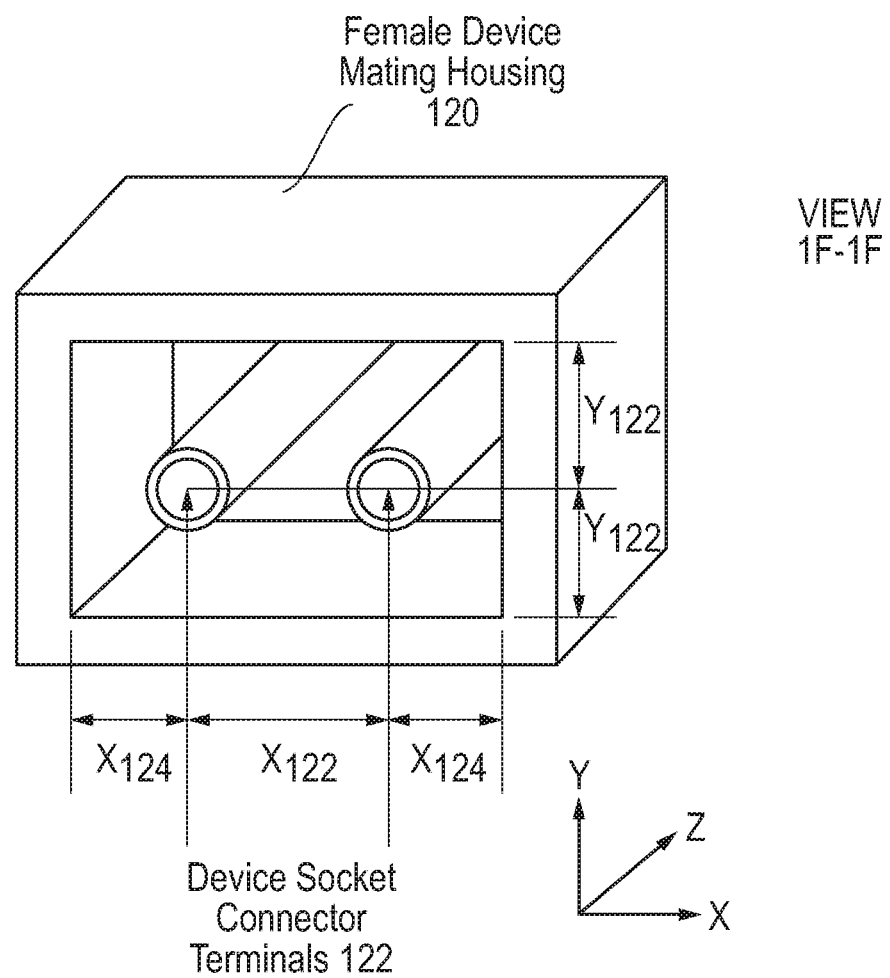
FIG. 1F is a graphical diagram illustrating a partial view of a voltmeter device housed within an integrated voltmeter device housing according to an embodiment of the present disclosure.

FIG. 1F is a graphical diagram illustrating a partial view of a voltmeter device housed within an integrated voltmeter device housing according to an embodiment of the present disclosure. A mating housing may be female, male, or may incorporate aspects of both genders. This is only one example of an embodiment and is not intended to limit the scope of this disclosure to a specific gender. A female device mating housing in an embodiment may be a device mating housing for mating with the voltmeter device housing with a DC battery having a battery terminal housing comprising two battery pin connector terminals.

As shown in FIG. 1F, the female device mating housing 120 in an embodiment may operate to partially enclose two device socket connector terminals 122. The device socket connector terminals 122 in an embodiment may be partially enclosed within the female device mating housing 120 such that the four exterior walls of the female device mating housing 120 enclose the device socket connector terminals 122 for a portion of the device socket terminals' 122 depth. In other words, a portion of the device socket connector terminals 122 may extend beyond the depth of the female device mating housing 120 (and into a terminal housing (not shown)) in an embodiment, as described in greater detail below.

The radial centers of the device socket connector terminals 122 in an embodiment may also be spaced a horizontal distance $X_{122}$ apart from one another, which may be equivalent to the horizontal distance between the radial centers of the battery pin connector terminals (not shown) with which the device socket connector terminals 122 may mate, as described in greater detail below. Each device socket connector terminal 122 may also be placed such that their radial centers lie a horizontal distance $X_{124}$ apart from a nearest interior vertical wall of the female device mating housing 120, which may be equivalent to the horizontal distance between the radial centers of each battery pin connector terminal and a nearest vertical exterior wall of the male battery terminal housing (not shown) with which the female device mating housing 120 may mate, as described in greater detail below. Each device socket connector terminal 122 may also be placed such that its radial center lies a vertical distance $Y_{122}$ apart from the interior ceiling and interior floor of the female device mating housing 120, which may be equivalent to the horizontal distance between the radial center of each battery pin connector terminal (not shown) and a horizontal exterior wall of the male battery terminal housing (not shown) with which the female device mating housing 120 may mate, as described in greater detail below. In such a way, a male battery terminal housing (not shown) may insert into the female device mating housing 120 in an embodiment, allowing the battery pin connector terminals (not shown) to make electrically conductive contact with the device socket connector terminals 122.

FIG. 2A

Figure 2A:
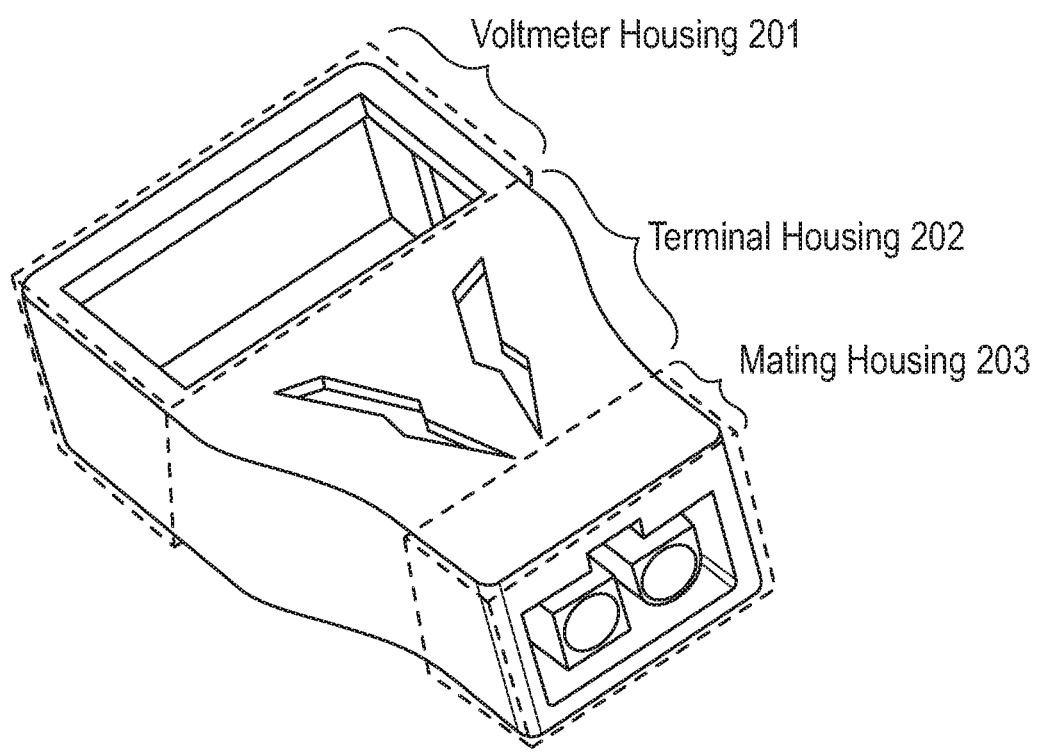
FIG. 2A is a graphical diagram illustrating a perspective view of a three-dimensional digital model of an integrated voltmeter device housing according to an embodiment of the present disclosure.

FIG. 2A is a graphical diagram illustrating a perspective view of a three-dimensional digital model of an integrated voltmeter device housing according to an embodiment of the present disclosure. As shown in FIG. 2A, a voltmeter device housing 200 may comprise a voltmeter housing 201, a female mating housing 203, and a terminal housing 202. In an embodiment, a voltmeter housing 201 may operate to enclose a voltmeter microchip and a voltmeter digital display, wherein the voltmeter microchip is operatively connected to the voltmeter digital display and to two or more electrically conductive wires, and wherein each of the two or more electrically conductive wires are further operatively connected to a gendered device pin connector type terminal.

A female device mating housing 203 in an embodiment may operate to mate with a battery terminal housing of the battery of which the user wishes to know the remaining voltage. In an embodiment, the battery terminal housing may house two or more battery pin connector type terminals having the opposite gender as the gendered device pin connector type terminals that may each be operatively connected to one of the electrically conductive wires. The female device mating housing 203 in an embodiment may operate to enclose a portion of the device pin connector type terminals and to mate with the battery terminal housing so as to form an electrically conductive contact between each of the device pin connector type terminals and each of the battery pin connector type terminals. As shown in FIG. 2A, in an embodiment, the voltmeter device housing 200 may comprise a female device mating housing 203 for mating with a male battery terminal housing (not shown) by inserting the male battery terminal housing (not shown) into the voltmeter device housing 200 via the female device mating housing 203. However, in other embodiments, the voltmeter device housing 200 may comprise a male device mating housing (not shown) for mating with a female battery terminal housing (not shown), as discussed in greater detail below, or may include a mating housing with both male and female aspects for mating with a battery terminal housing having the opposites gendered male and female aspects.

In an embodiment, the terminal housing 202 may operate to house a portion of the device pin connector type terminals and the electrically conductive wires. In an embodiment, the terminal housing 202 may also insulate these elements from one another such that the terminal housing 202 disallows electrically conductive contact to be made between each of the device pin connector type terminals, between each of the electrically conductive wires, or between any device pin connector type terminal and any electrically conductive wire not operatively connected to that device pin connector type terminal prior to insertion of the terminals and wires into the voltmeter device housing.

FIG. 2B

Figure 2B:
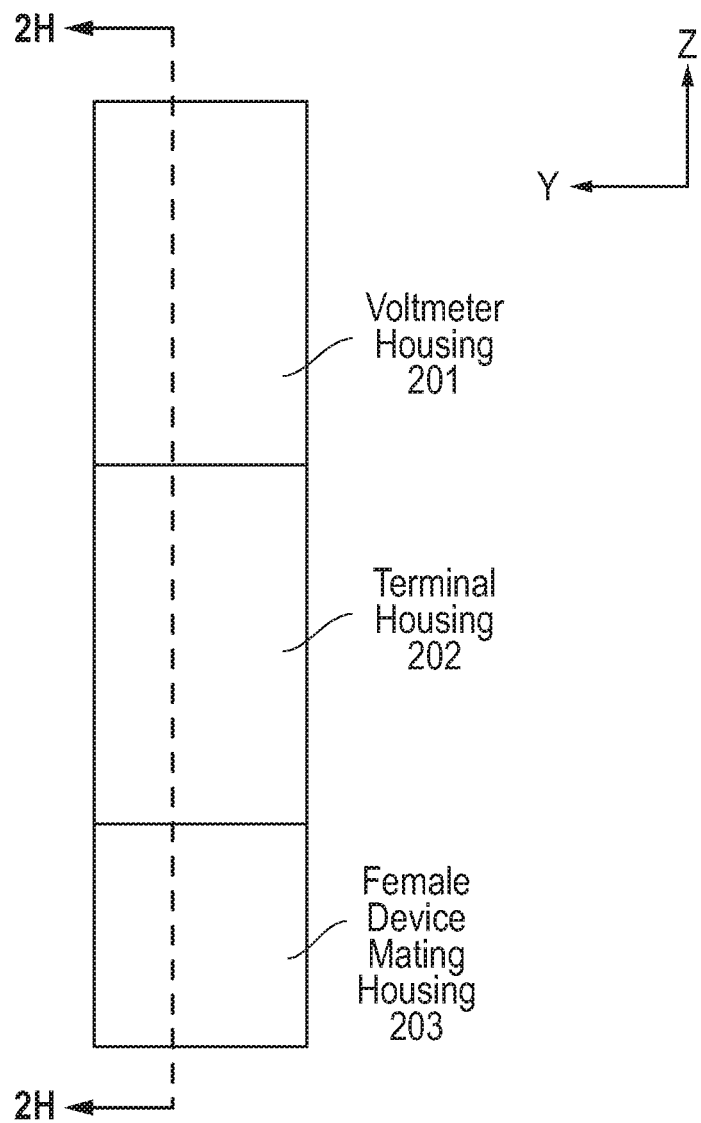
FIG. 2B is a graphical diagram illustrating a right side view of a three-dimensional digital model of an integrated voltmeter device housing according to an embodiment of the present disclosure.

FIG. 2B is a graphical diagram illustrating a right side view of a three-dimensional digital model of an integrated voltmeter device housing according to an embodiment of the present disclosure. As described above, the three-dimensional digital model of an integrated voltmeter device housing in an embodiment may comprise three-dimensional digital models of a voltmeter housing 201, a terminal housing 202, and a female device mating housing 203. The front of the terminal housing 202 in an embodiment may lie flush with the rear of the voltmeter housing 201, and the rear of the terminal housing 202 may lie flush with the front of the female device mating housing 203. In the embodiment described with reference to FIG. 2B, the voltmeter housing 201, terminal housing 202, and female device mating housing 203 may share a linear, flat floor and linear, flat ceiling, and the ceilings and floors of the voltmeter housing 201, terminal housing 202, and female device mating housing 203 may be spaced a uniform distance apart throughout the depths of the voltmeter housing 201, terminal housing 202, and female device mating housing 203. In other embodiments, the distance between the floor and ceiling of the voltmeter housing 201, terminal housing 202, and female device mating housing 203 may vary along the depth of any or all of the voltmeter housing 201, terminal housing 202, and female device mating housing 203.

FIG. 2C

Figure 2C:
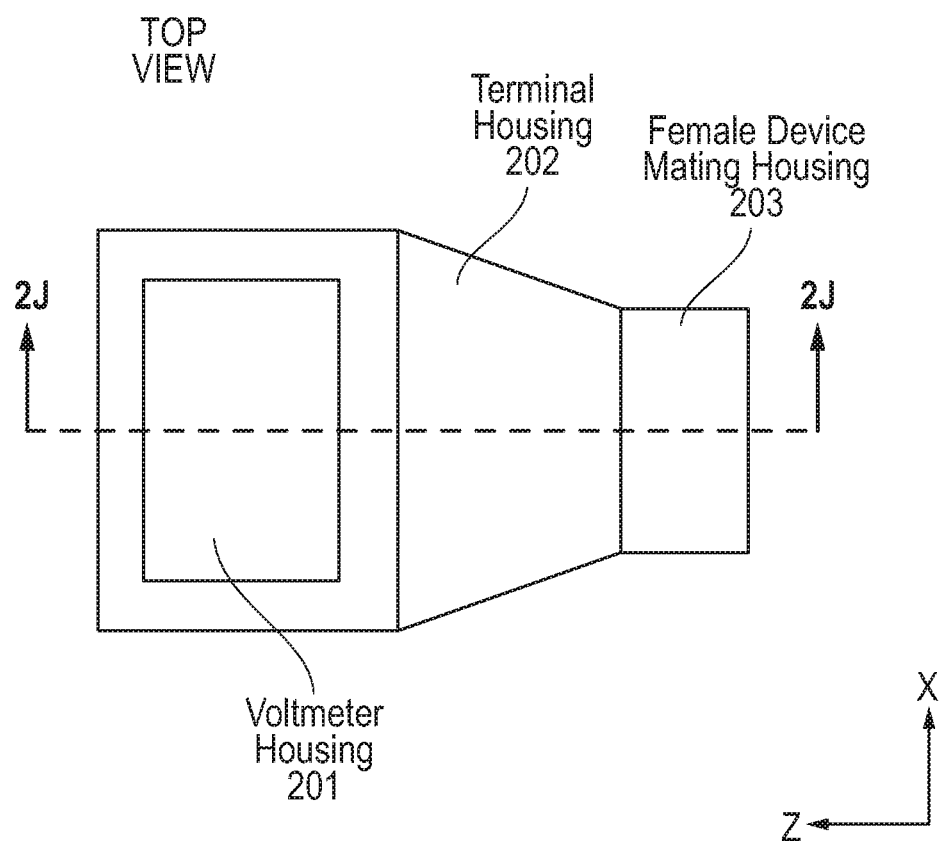
FIG. 2D is a graphical diagram illustrating a partial view of a three-dimensional digital model of an integrated voltmeter device housing according to an embodiment of the present disclosure.
FIG. 2E is a graphical diagram illustrating a partial, cross-sectional view of a three-dimensional digital model of an integrated voltmeter device housing according to an embodiment of the present disclosure.
FIG. 2F is a graphical diagram illustrating an exploded, partial view of a three-dimensional digital model of an integrated voltmeter device housing according to an embodiment of the present disclosure.
FIG. 2G is a graphical diagram illustrating a partial view of a three-dimensional digital model of an integrated voltmeter device housing according to an embodiment of the present disclosure.
FIG. 2H is a graphical diagram illustrating a cross-sectional view of a three-dimensional digital model of an integrated voltmeter device housing according to an embodiment of the present disclosure.
FIG. 2I is a graphical diagram illustrating a cross-sectional view of a three-dimensional digital model of an integrated voltmeter device housing according to an embodiment of the present disclosure.
FIG. 2J is a graphical diagram illustrating a cross-sectional view of a three-dimensional digital model of an integrated voltmeter device housing according to an embodiment of the present disclosure.

FIG. 2C is a top view of a three-dimensional digital model of an integrated voltmeter device housing according to an embodiment of the present disclosure. As described above, the three-dimensional digital model of an integrated voltmeter device housing in an embodiment may comprise three-dimensional digital models of a voltmeter housing 201, a terminal housing 202, and a female device mating housing 203. As also described above, the front of the terminal housing 202 in an embodiment may lie flush with the rear of the voltmeter housing 201, and the rear of the terminal housing 202 may lie flush with the front of the female device mating housing 203. The width of the terminal housing 202 in an embodiment may vary along the depth of the depth of the terminal housing 202. For example, the left and right sides of the terminal housing 202 may have a curvilinear shape that may provide a better grip for a user as she mates the female device mating housing 203 with a male battery terminal housing (not shown), and removes the male battery terminal housing (not shown) from the female device mating housing 203. In other embodiments, and as shown in FIG. 2C, the left and right sides of the terminal housing 202 may have a straight-line shape.

FIG. 2D

Figure 2D:
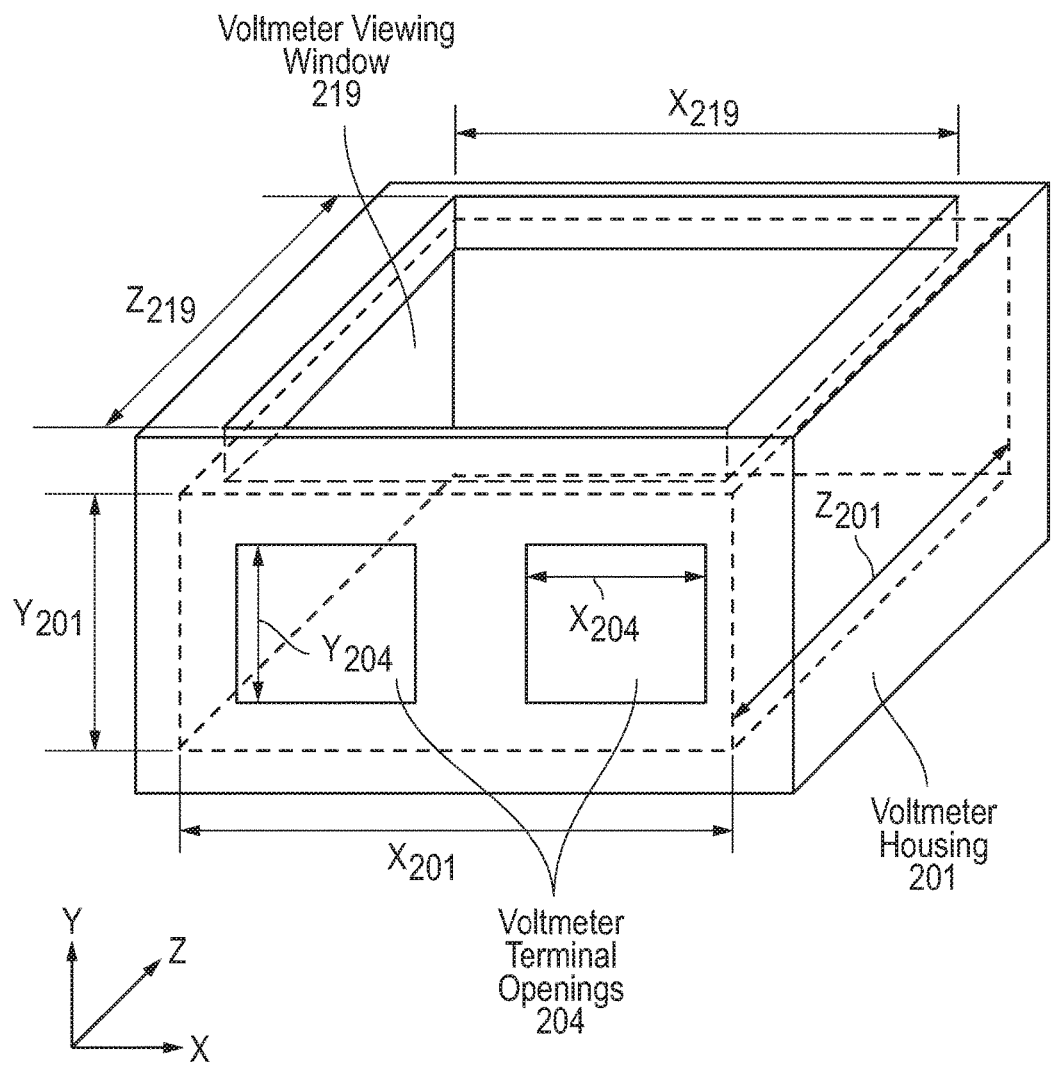

FIG. 2D is a graphical diagram illustrating a partial view of a three-dimensional digital model of an integrated voltmeter device housing according to an embodiment of the present disclosure. More particularly, FIG. 2D depicts a voltmeter housing 201 in an embodiment. In an embodiment, a voltmeter housing 201 may operate to enclose a voltmeter microchip and a voltmeter digital display. As shown in FIG. 2D, a voltmeter housing 201 may include six walls to partially enclose a voltmeter microchip and a voltmeter digital display. The distance $X_{201}$ between the interior right and left walls of the voltmeter housing 201 in an embodiment may be equivalent to or greater than the width of the voltmeter microchip or the voltmeter digital display, whichever is greater. The distance $Y_{201}$ between the interior ceiling and floor of the voltmeter housing 201 in an embodiment may be equivalent to or greater than the combined height of the voltmeter microchip and the voltmeter digital display. The distance $Z_{201}$ between the interior front and back walls of the voltmeter housing 201 in an embodiment may be equivalent to or greater than the depth of the voltmeter microchip or the voltmeter digital display, whichever is greater.

Also as shown in FIG. 2D, a voltmeter housing 201 in an embodiment may include a voltmeter viewing window 219. In an embodiment, a voltmeter viewing window 219 may operate to allow for visibility of the voltmeter digital display while it is enclosed within the voltmeter housing 201. The voltmeter viewing window 219 in an embodiment may have a width $X_{219}$ that is less than the interior width $X_{201}$ of the voltmeter digital display, but large enough to ensure the voltmeter housing 201 does not impair a user's ability to view the reading on a voltmeter digital display housed within the voltmeter housing 201. The voltmeter viewing window 219 in an embodiment may have a depth $Z_{219}$ that is less than the depth $Z_{219}$ of the voltmeter digital display, but large enough to ensure the voltmeter housing 201 does not impair a user's ability to view a reading on a voltmeter digital display housed within the voltmeter housing 201.

FIG. 2E

Figure 2E:
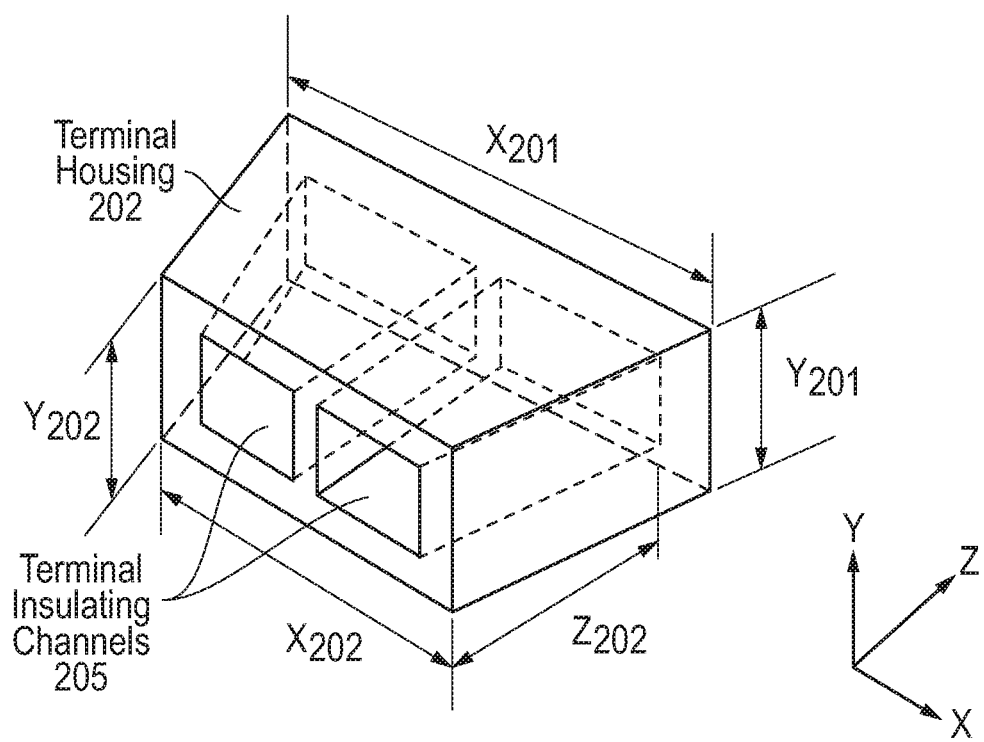

FIG. 2E is a graphical diagram illustrating a partial, cross-sectional view of a three-dimensional digital model of an integrated voltmeter device housing according to an embodiment of the present disclosure. More particularly, FIG. 2E depicts a terminal housing 202 in an embodiment. In an embodiment, the terminal housing 202 may operate to house a portion of the device pin connector type terminals and the electrically conductive wires, as described in greater detail below. In an embodiment, the terminal housing 202 may also include two terminal insulating channels 205 which operate to disallow electrically conductive contact to be made between each of the device pin connector type terminals, between each of the electrically conductive wires, or between any device pin connector type terminal and any electrically conductive wire not operatively connected to that device pin connector type terminal prior to insertion of the device pin connector type terminals and electrically conductive wires into the voltmeter device housing.

As shown in FIG. 2E, in an embodiment, the terminal housing 202 may have a fixed or variable width along its depth. The terminal housing 202 in an embodiment may have a width $X_{201}$ along the face of the terminal housing 202 lying adjacent to a face of the voltmeter housing (not shown), as described in greater detail below. The width $X_{201}$ may be equivalent to the width of the outer wall of the voltmeter housing lying adjacent to the terminal housing 202. The terminal housing 202 in an embodiment may also have a width $X_{202}$ along the face of the terminal housing 202 lying adjacent to a face of the mating housing (not shown), as described in greater detail below. The width $X_{202}$ may be equivalent to the width of the outer wall of the mating housing lying adjacent to the terminal housing 202.

The terminal housing 202 in an embodiment may have a fixed or variable height across its depth. In an embodiment, the terminal housing 202 may have a height $Y_{201}$ along the face of the terminal housing 202 lying adjacent to a face of the voltmeter housing. The height $Y_{201}$ may be equivalent to the height of the outer wall of the voltmeter housing lying adjacent to the terminal housing 202. The terminal housing 202 in an embodiment may also have a height $Y_{202}$ along the face of the terminal housing 202 lying adjacent to a face of the mating housing. The height $Y_{202}$ may be equivalent to the height of the outer wall of the mating housing lying adjacent to the terminal housing 202. As shown above, the height of the terminal housing 202 in an embodiment may be fixed, if the heights $Y_{201}$ and $Y_{202}$ are equivalent. In other embodiments, the height may vary (e.g., if the heights $Y_{201}$ and $Y_{202}$ are not equivalent (not shown)).

As also shown in FIG. 2E, the terminal housing 202 in an embodiment may comprise two terminal insulating channels 205. In an embodiment, a device pin connector type terminal may be operatively connected to an electrically conductive wire, and both the device pin connector type terminal and the electrically conductive wire to which it is operatively connected may be inserted into a terminal insulating channel 205. Each terminal insulating channel 205 in an embodiment may partially house a device pin connector type terminal and the electrically conductive wire to which it is operatively connected. The terminal insulating channels 205 in an embodiment may take any shape, so long as three conditions are met. First, the terminal housing 202 of an embodiment may maintain structural rigidity. Second, the terminal insulating channels 205 in an embodiment may be disposed within the exterior walls of the terminal housing 202 and disposed throughout the depth of the terminal housing 202. Third, the terminal insulating channels 205 in an embodiment may operate to disallow electrically conductive contact to be made between each of the device pin connector type terminals, between each of the electrically conductive wires, or between any device pin connector type terminal and any electrically conductive wire not operatively connected to that device pin connector type terminal prior to insertion of the terminals and wires into the voltmeter device housing. FIG. 2E illustrates only one possible embodiment of the terminal insulating channels 205 and additional embodiments of the terminal insulating channels 205 are described below in greater detail.

The terminal housing 202 of an embodiment may take any shape so long as it two conditions are met. First, the terminal housing 202 of an embodiment may be disposed between the voltmeter housing and the mating housing, such that one of the terminal housing 202 exterior walls, through which the terminal insulating channels 205 are disposed, lies flush with the mating housing. Second, the other terminal housing 202 exterior wall in an embodiment, through which the terminal insulating channels 205 are disposed, may lie flush with the voltmeter housing. For example, in the embodiment described with reference to FIG. 2E, each of the terminal insulating channels 205 in an embodiment may be disposed throughout the terminal housing 202 such that the opening formed in one of the exterior walls of the terminal housing 202 has a smaller cross-sectional area than the opening formed in the opposite exterior wall of the terminal housing 202. (Compare the size of the openings formed by the terminal insulating channels 205 in the wall having a width of $X_{201}$ to the size of the openings formed by the terminal insulating channels 205 in the wall having a width of $X_{202}$). In such an embodiment, the exterior wall of the terminal housing 202 having the openings of the smaller cross-sectional area (and having the width $X_{202}$) may lie flush with the mating housing, and the opposite exterior wall of the terminal housing 202, having the openings of the larger cross-sectional area (and having the width $X_{201}$) may lie flush with the voltmeter housing.

In an embodiment, the right and left walls of the terminal mating housing 202 which join the terminal mating housing 202 wall lying flush with the voltmeter housing to the terminal mating housing 202 wall lying flush with the mating housing may take several different shapes. For example, the right and left walls of the terminal mating housing 202 in an embodiment may take a rectangular, planar shape, as shown in FIG. 2E. As another example, and as described in greater detail above, the right and left walls of the terminal housing 202 may be curved inward along its length, such that it may be easier for a user grasping the voltmeter device housing in his hand, with the voltmeter housing in the palm of his hand and his thumb and forefinger placed on the right and left walls of the terminal housing 202, respectively, to mate and separate the mating housing from the battery terminal housing.

FIG. 2F

Figure 2F:
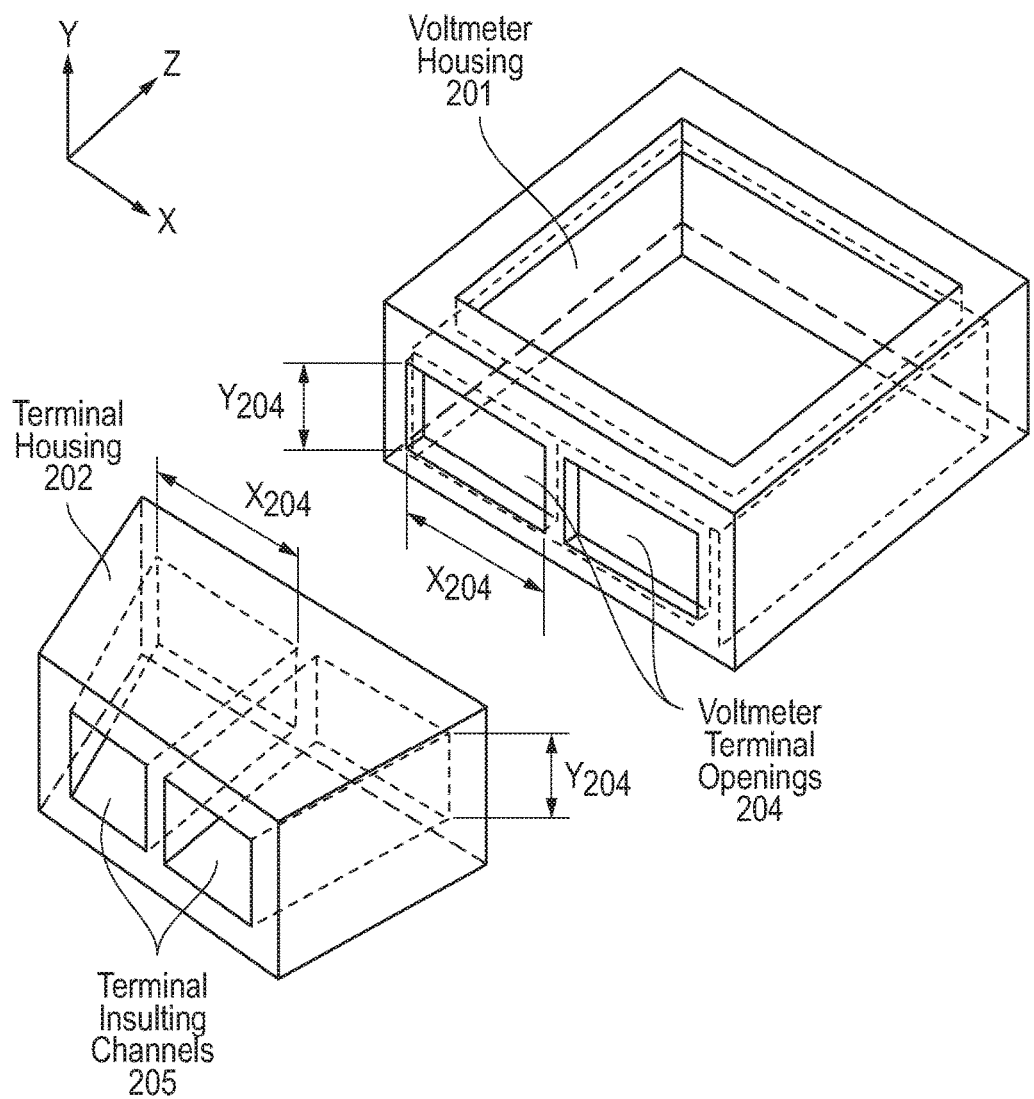

FIG. 2F is a graphical diagram illustrating an exploded, partial view of a three-dimensional digital model of an integrated voltmeter device housing according to an embodiment of the present disclosure. More particularly, FIG. 2F depicts an exploded view of a voltmeter housing 201 and a terminal housing 202 in an embodiment. The voltmeter housing 201 and the terminal housing 202 are depicted in FIG. 2F in such an exploded configuration only for descriptive purposes, in order to more easily depict certain aspects of the voltmeter terminal openings 204. In an embodiment, the terminal housing 202 may lie adjacent to the voltmeter housing 201 such that the voltmeter terminal openings 204 abut the wall of the terminal housing 202 wherein the terminal insulating channels 205 measure a horizontal distance $X_{204}$ and a vertical distance $Y_{204}$. For example, in the embodiment described above, the voltmeter housing 201 and the terminal housing 202 lie adjacent to and flush with one another.

As shown in FIG. 2F, one or more voltmeter terminal openings 204 may be disposed throughout the depth of the wall of the voltmeter housing 201 lying adjacent to the terminal housing 202 in an embodiment. One or more voltmeter terminal openings 204 may have any dimensions or take any shape, so long as two conditions are met. First, the voltmeter terminal openings 204 in an embodiment may allow for insertion of each of the two or more device pin connector type terminals and the two or more electrically conductive wires to which they are operatively connected into one of the two terminal insulating channels 205. Second, the voltmeter terminal openings 204 of an embodiment may not compromise the structural integrity of the voltmeter housing 201. As just one example embodiment, the two voltmeter terminal openings 204 may be disposed throughout the wall of the voltmeter housing 201 lying adjacent to the terminal housing 202. In that example embodiment, each voltmeter terminal opening 204 may have a width $X_{204}$, which may be equivalent to the width of the terminal insulating channel 205 at the front wall of the terminal housing 202 lying adjacent to the voltmeter housing 201. In that same embodiment, each voltmeter terminal opening 204 may have a height $Y_{204}$, which may be equivalent to the height of the terminal insulating channel 205 of the front wall of the terminal housing 202 lying adjacent to the voltmeter housing 201. The embodiment depicted in FIG. 2F is just one example of a voltmeter terminal opening 204 and other embodiments may include other dimensions or shapes, specifically including one or more cylindrical shapes, as described in greater detail below.

FIG. 2G

Figure 2G:
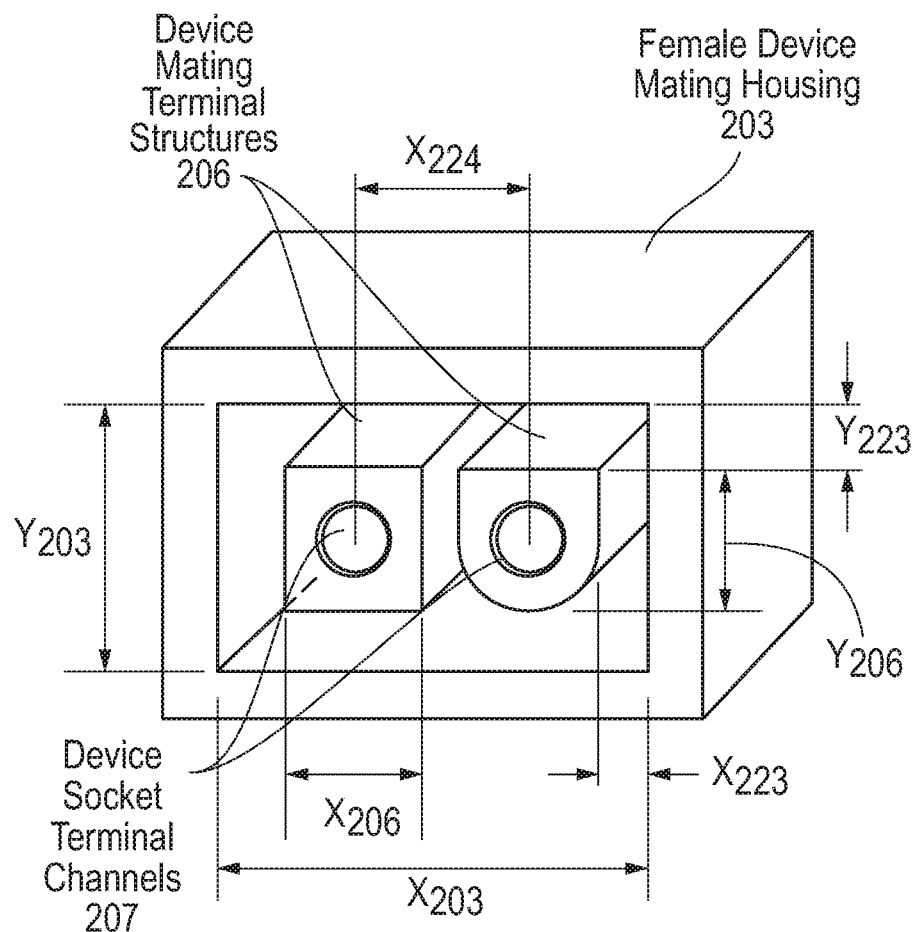

FIG. 2G is a graphical diagram illustrating a partial view of a three-dimensional digital model of an integrated voltmeter device housing according to an embodiment of the present disclosure. As discussed above, a mating housing may be female, male, or may incorporate aspects of both genders. A female device mating housing in an embodiment may be a device mating housing for mating with the voltmeter device housing with a DC battery having a battery terminal housing comprising two battery pin connector terminals. For example, in the embodiment described with reference to FIG. 2G, a female device mating housing 203 may comprise one or more exterior walls for partially housing two device socket connector terminals (not shown) disposed throughout the female device mating housing 203, such that each of the device socket connector terminals (not shown) may make electrically conductive contact with one of the battery pin connector terminals (not shown) upon mating the male battery terminal housing (not shown) with the female device mating housing 203, as described in greater detail above.

As shown in FIG. 2G, in an embodiment, the interior horizontal distance between the walls of a female device mating housing 203 may measure $X_{203}$, and the interior vertical distance between the walls of the female device mating housing 203 may measure $Y_{203}$. The interior horizontal distance $X_{203}$ in an embodiment may be equivalent to or greater than the horizontal distance between the exterior walls of a male battery terminal housing (not shown), as described in greater detail below. The interior vertical distance $Y_{203}$ in an embodiment may be equivalent to or greater than the vertical distance between the exterior walls of a male battery terminal housing (not shown), as described in greater detail below. In such a way, the exterior walls of the female device mating housing 203 in an embodiment may operate to enclose the exterior walls of the male battery terminal housing (not shown), as described in greater detail below.

As shown in FIG. 2G, the female device mating housing may further comprise each of the device socket connector terminals being disposed throughout the length of a device mating terminal structure 206. For example, the female device mating housing 203 may further comprise each of the device socket terminals (not shown) being disposed within a device socket terminal channel 207, and each of the device socket terminal channels 207 being disposed within and throughout a device mating terminal structure 206. The horizontal center points of each device socket terminal channel 207 in an embodiment, and thus, the horizontal center points of each device socket terminal (not shown) housed within a device socket terminal channel 207 may lie a distance X224 apart from one another. In an embodiment, the distance X224 may be equivalent to the distance between the center midpoints of the battery pin terminals housed within the battery terminal housing with which the female device mating housing 203 may mate, as described in greater detail below.

As shown in FIG. 2G, the female device mating housing 203 for mating with the male battery terminal housing (not shown) in an embodiment may comprise two device mating terminal structures 206 and two device socket terminal channels 207. Each device socket terminal channel 207 in an embodiment may be disposed throughout the length of one device mating terminal structure 206 and may operate to partially enclose a portion of a device socket connector terminal (not shown). Each device mating terminal structure 206 in an embodiment may operate to insert into a male battery terminal channel (not shown) upon insertion of the male battery terminal housing (not shown) within the female device mating housing 203, so as to allow electrically conductive contact to be made between each battery pin connector terminal (not shown) and each device socket connector terminal disposed within a device socket terminal channel 207, as described in greater detail below. Each device mating terminal structure 206 in an embodiment may have a width $X_{206}$ that may be equivalent to or less than the width of each battery terminal channel (not shown) of the male battery terminal housing (not shown), as described in greater detail below. The device mating terminal structures 206 in an embodiment may each have a height $Y_{206}$ that may be equivalent to or less than the height of each battery terminal channel (not shown) of the male battery terminal housing (not shown), as described in greater detail below. This is only one example embodiment and is meant to be descriptive, rather than restrictive of the scope of this disclosure. In other embodiments, the battery terminal channels may take any cross-sectional shape or orientation with respect to one another within the exterior walls of the male battery terminal housing, and may have differing widths, heights, or radii with respect to one another.

Further, the shape and orientation of the device terminal mating structures 206 in an embodiment may mirror the shape and orientation of the battery terminal channels (not shown) of the male battery terminal housing (not shown), as described in greater detail below. For example, the male battery terminal housing in an embodiment may comprise a u-shaped battery terminal channel having a left interior vertical wall located a horizontal distance away from the right-most exterior vertical wall of the male battery terminal housing (not shown). The female device mating housing 203 in such an embodiment may comprise a u-shaped device mating terminal structure having a right-most exterior vertical wall located the same horizontal distance $X_{223}$ away from the right-most interior vertical wall of the female device mating housing 203, operating to allow for insertion of the u-shaped device mating terminal structure within the u-shaped battery terminal channel. Each of the device mating terminal structures 206 may be located such that each of their top exterior walls is located a vertical distance $Y_{223}$ from the interior ceiling of the female device mating housing 203, which may be equivalent to or greater than the vertical distance between the interior ceilings of each of the battery terminal channels (not shown) and the exterior top wall of the male battery terminal housing (not shown), as described in greater detail below.

FIG. 2H

Figure 2H:
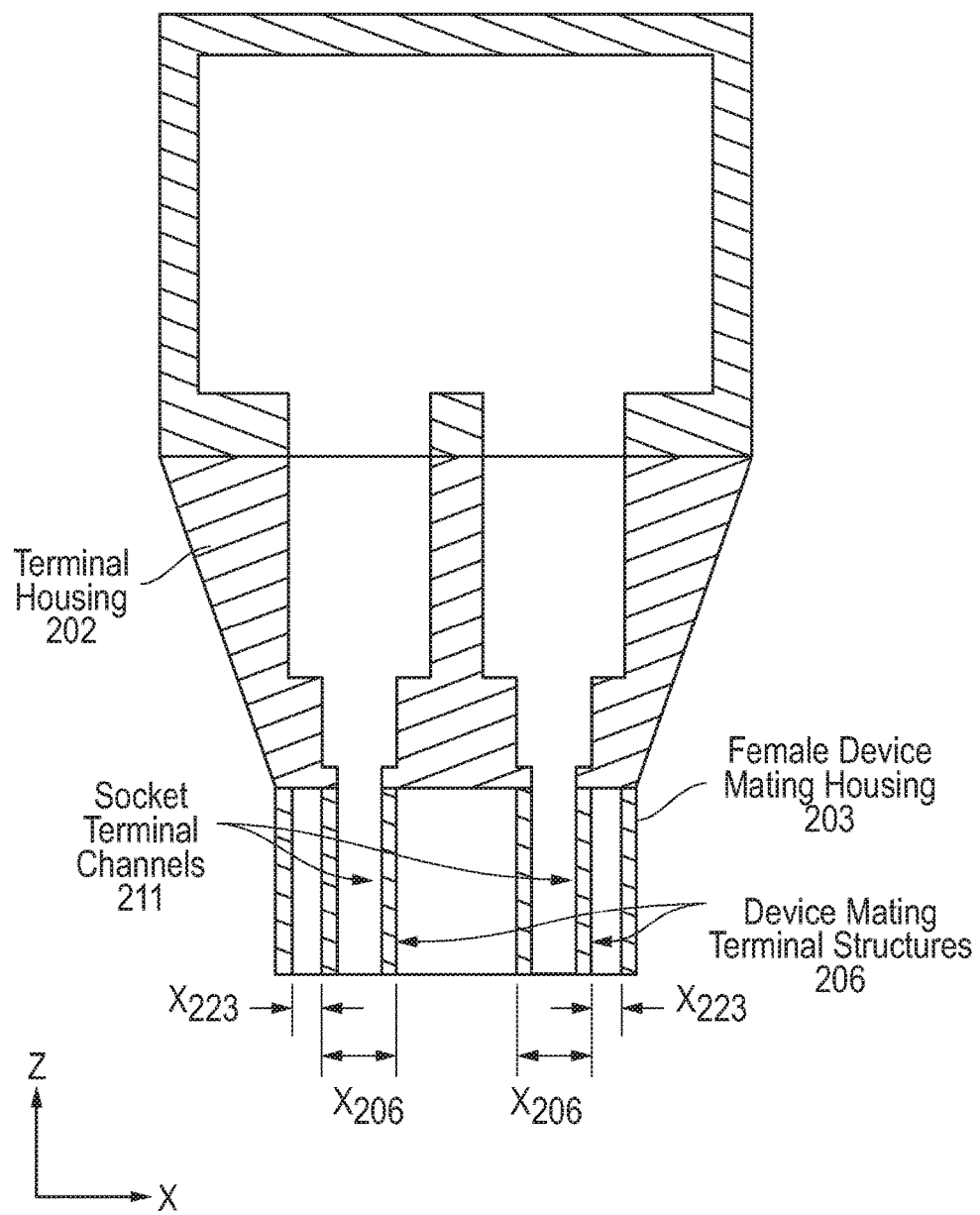

FIG. 2H is a graphical diagram illustrating a cross-sectional view of a three-dimensional digital model of an integrated voltmeter device housing according to an embodiment of the present disclosure. As shown in FIG. 2H, a female device mating housing 203 may include two device mating terminal structures 206, each operating to insert partially into a mating terminal channel of a male battery terminal housing, and to partially enclose a socket terminal channel 211. As discussed above, each socket terminal channel 211 may operate to partially enclose a socket terminal inserted through at least a portion of the socket terminal channel 211, such that a portion of the socket terminal inserted through the socket terminal channel 211 may extend into the female device mating housing 203. In the embodiment described with reference to FIG. 2H, such a socket terminal may insert through each socket terminal channel 211, and extend partially into each device mating terminal structure 206. Each device mating terminal structure 206 in an embodiment may have a width $X_{206}$, which may be equivalent to or less than the width of the battery terminal channels (not shown) of a male battery terminal housing (not shown) with which the female device mating housing 203 may mate, as described in greater detail below. Further, each device mating terminal structure 206 in an embodiment may be located such that its horizontal wall lying nearest to an internal wall of the female device mating housing 203 lies a horizontal distance $X_{223}$ away from the nearest internal wall of the female device mating housing 203, as described in greater detail above.

FIG. 2I

Figure 2I:
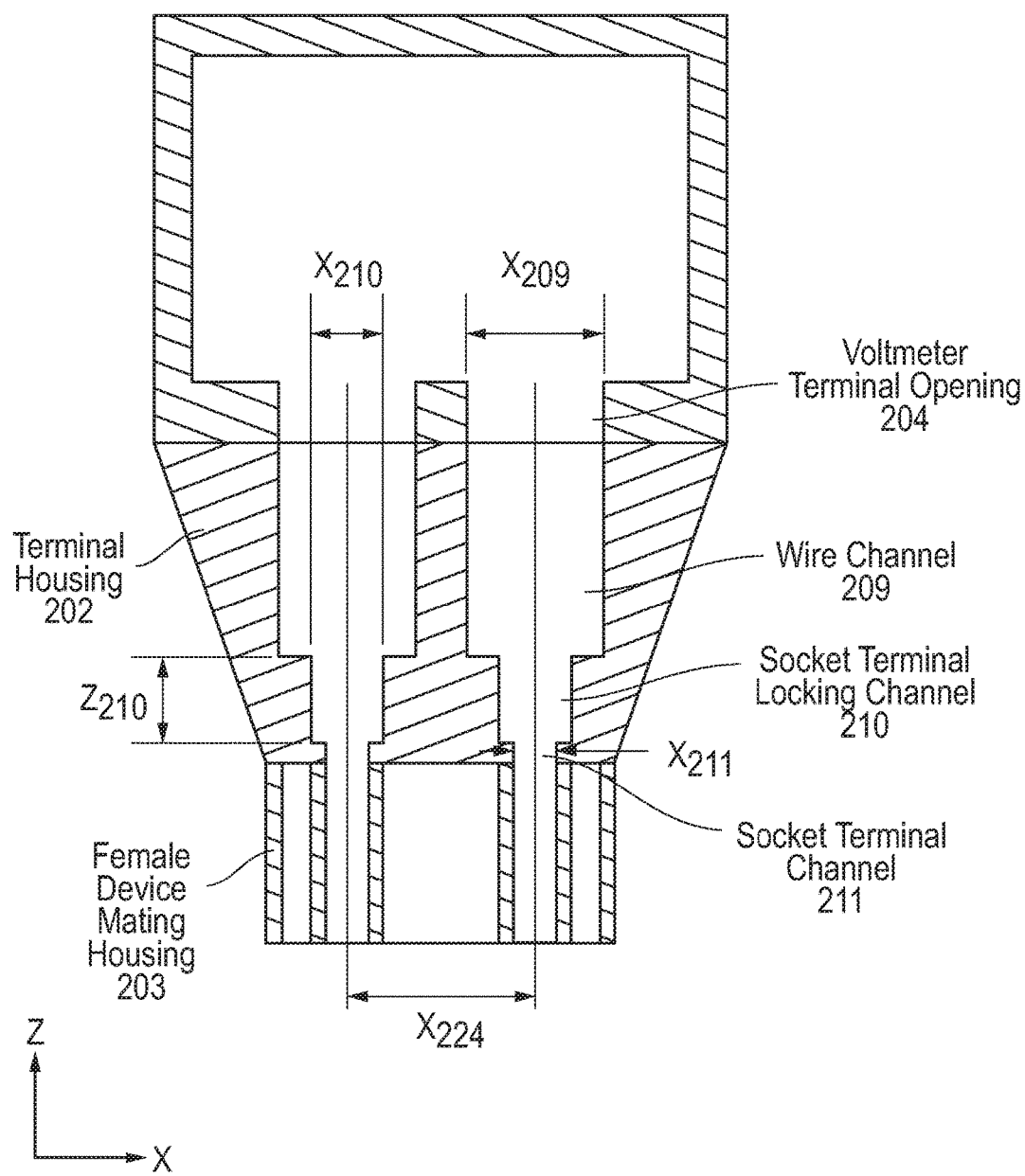

FIG. 2I is a graphical diagram illustrating a cross-sectional view of a three-dimensional digital model of an integrated voltmeter device housing according to an embodiment of the present disclosure. As discussed above, the terminal housing 202 in an embodiment may operate to house a portion of the device pin connector type terminals and the electrically conductive wires, and may also include two terminal insulating channels which operate to disallow electrically conductive contact to be made between each of the device pin connector type terminals, between each of the electrically conductive wires, or between any device pin connector type terminal and any electrically conductive wire not operatively connected to that device pin connector type terminal prior to insertion of the terminals and wires into the voltmeter device housing. As also described above, the terminal insulating channels may take any shape, so long as three conditions are met. First, the terminal housing 202 in an embodiment may maintain structural rigidity. Second, the terminal insulating channels in an embodiment may be disposed within the exterior walls of the terminal housing 202 and disposed throughout the depth of the terminal housing 202. Third, the terminal insulating channels in an embodiment may operate to disallow electrically conductive contact to be made between each of the device pin connector type terminals, between each of the electrically conductive wires, or between any device pin connector type terminal and any electrically conductive wire not operatively connected to the device pin connector type terminal prior to insertion of the terminals and wires into the voltmeter device housing.

The embodiment described with reference to FIG. 2I illustrates one possible shape a terminal insulating channel may take in an embodiment, and includes a combination of a wire channel 209, a socket terminal locking channel 210, and a portion of a socket terminal channel 211. Each of the socket terminal locking channels 210 and socket terminal channels 211, as shown in FIG. 2I may operate to partially enclose a device socket connector terminal. Other embodiments of the terminal housing 202 may include a combination of a wire channel 209, a pin terminal locking channel (not shown), and a portion of a pin terminal channel (not shown), as described in greater detail below.

As shown in FIG. 2I, in an embodiment, the terminal housing 202 in an embodiment may operate to house a portion of the device pin connector type terminals and the electrically conductive wires. The terminal housing 202 in an embodiment may also include two wire channels 209, two socket terminal locking channels 210, and two socket terminal channels 211, all of which operate to disallow electrically conductive contact to be made between each of the device socket connector terminals, between each of the electrically conductive wires, or between any device socket connector terminal and any electrically conductive wire not operatively connected to that device socket connector terminal prior to insertion of the terminals and wires into the voltmeter device housing.

In such an embodiment, a device socket connector terminal may be operatively connected to an electrically conductive wire and inserted through the voltmeter terminal opening 204, wire channel 209, the socket terminal locking channel 210, and at least partially into a socket terminal channel 211 such that a portion of the device socket connector terminal remains within the socket terminal locking channel 210 and a portion of the device socket connector terminal extends beyond the socket terminal locking channel 210 and into the female device mating housing 203. Another device socket connector terminal and operatively connected electrically conductive wire may be inserted in a similar way into another or the same voltmeter terminal opening 204, and through a separate wire channel 209, socket terminal locking channel 210, and socket terminal channel 211 in an embodiment. The wire channel 209, socket terminal locking channel 210, and socket terminal channel 211 in an embodiment may be enclosed by electrically insulating material so as to disallow electrically conductive contact to be made between each of the device socket connector terminals, between each of the electrically conductive wires, or between any device socket connector terminal and any electrically conductive wire not operatively connected to that device socket connector terminal prior to insertion of the terminals and wires into the voltmeter device housing.

The socket terminal channels 211 in an embodiment may be horizontally positioned such that their radial midpoints may lie a distance X224 apart. The horizontal distance X224 in an embodiment may be equivalent to the desired horizontal distance between the radial midpoints of the device socket connector terminals that may be inserted through the center of the socket terminal channels 211. The distance X224 in an embodiment may also be equivalent to the horizontal distance between the radial midpoints of the battery pin connector type terminals of a male battery terminal housing with which the female device mating housing 203 may mate. Thus, upon mating of the male battery terminal housing and the female device mating housing 203, each of the battery pin connector terminals may make electrically conductive contact with one of the device socket connector terminals inserted through the centers of the socket terminal channels 211.

Further, each socket terminal channel 211 in an embodiment may have a width X211 equivalent to or greater than the width of the socket mating channel of the device socket connector terminal (not shown) which may be inserted within the socket terminal channel 211, but less than the width of the first socket crimping channel of the device socket connector terminal (not shown), as described in greater detail below. In such an embodiment, the width of the socket terminal locking channel 210 being smaller than the width of the first socket crimping channel (not shown) may operate to inhibit movement of the leading edge of the first socket crimping channel (not shown) beyond the socket terminal locking channel 210, as described in greater detail above.

In an embodiment, the socket terminal locking channels 210 in an embodiment may have a width $X_{210}$ which may be greater than the width of the first socket crimping channel of a device pin connector type terminal, as described in greater detail above. Each socket terminal locking channel 210 in an embodiment may share a horizontal mid-line with the socket terminal channel 211 to which it is directly adjacent.

In an embodiment, the wire channels 209 may have a width $X_{209}$ which may be greater than the width of the second socket crimping channel (not shown) of the device socket connector terminal (not shown), as described in greater detail above. The dimensions of the wire channel 209 in an embodiment may vary based upon the type of device socket connector terminals used, and the length of the electrically conductive wires used. The wire channels 209 in an embodiment may have any dimensions so long as three conditions are met. First, the wire channels 209 in an embodiment may remain enclosed within the terminal housing 202. Second, each wire channel 209 in an embodiment may have sufficient volume to house the second socket crimping channel of a device socket connector terminal, and an electrically conductive wire operatively connected to the device socket connector terminal. Third, the wire channels 209 of an embodiment may operate to disallow electrically conductive contact to be made between each of the device socket connector terminals, between each of the electrically conductive wires, or between any device socket connector terminal and any electrically conductive wire not operatively connected to that device socket connector terminal prior to insertion of the terminals and wires into the voltmeter device housing. Each wire channel 209 in an embodiment may share a horizontal mid-line with the socket terminal locking channel 210 to which it is directly adjacent.

FIG. 2J

Figure 2J:
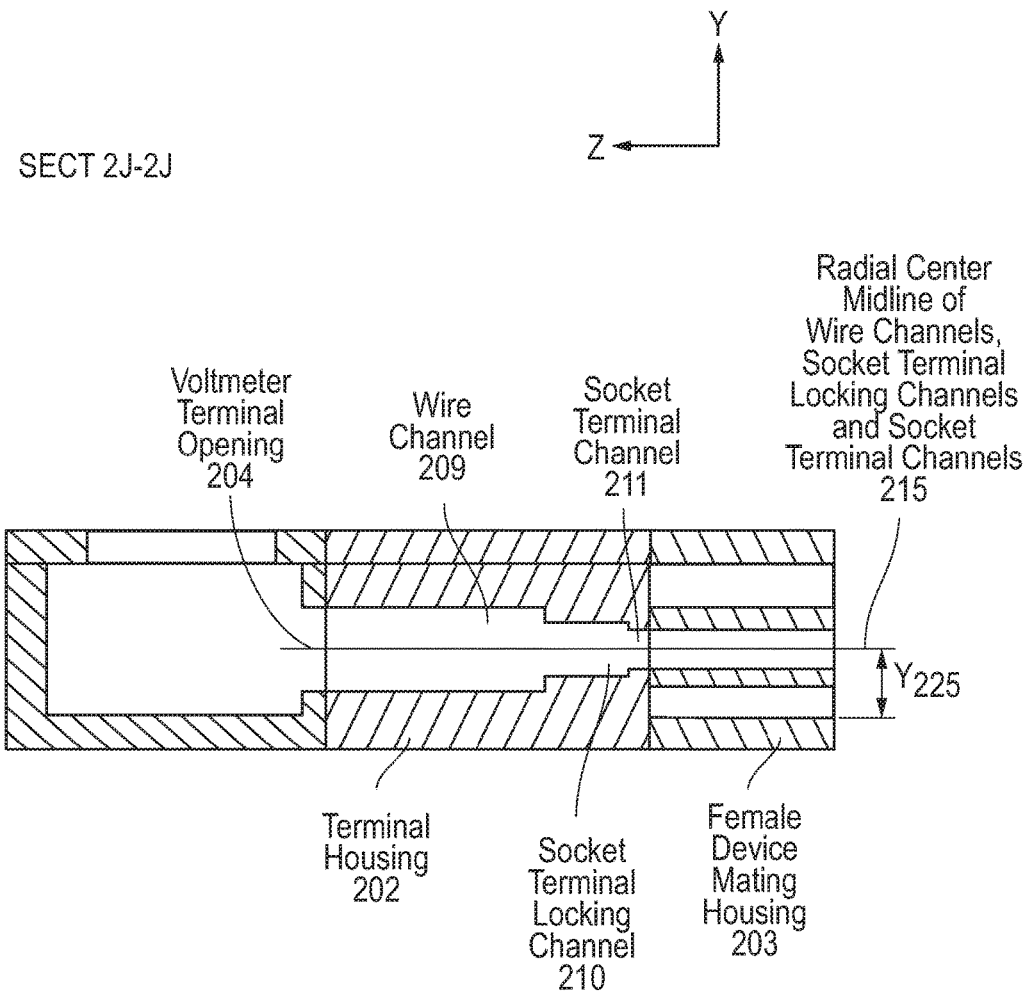

FIG. 2J is a graphical diagram illustrating a cross-sectional view of a three-dimensional digital model of an integrated voltmeter device housing according to an embodiment of the present disclosure. As discussed above and as shown in FIG. 2J, a device socket connector terminal may be operatively connected to an electrically conductive wire and inserted through the voltmeter terminal opening 204, the wire channel 209, the socket terminal locking channel 210, and at least a portion of the socket terminal channel 211, such that a portion of the device socket connector terminal remains within the wire channel 209, the socket terminal locking channel 210, and at least a portion of the socket terminal channel 211, and such that a portion of the device extends beyond the terminal housing 202 and into the female device mating housing 203.

The socket terminal channel 211 in an embodiment may be vertically positioned such that its midline 215 may lie a vertical distance $Y_{225}$ from the interior ceiling of the female device mating housing 203 in an embodiment in which the voltmeter device housing is meant to mate with a male battery terminal housing. In such a way, upon insertion of the male battery terminal housing within the female device mating housing 203, each of the battery pin connector terminals may make electrically conductive contact with each of the device socket connector terminals inserted through the centers of the socket terminal channels 211.

Further, each socket terminal locking channel 210 in an embodiment may share a vertical mid-line with the socket terminal channel 211 to which it is directly adjacent, and each wire channel 209 in an embodiment may share a vertical mid-line with the socket terminal locking channel 210 to which it is directly adjacent.

FIG. 3A

Figure 3A:
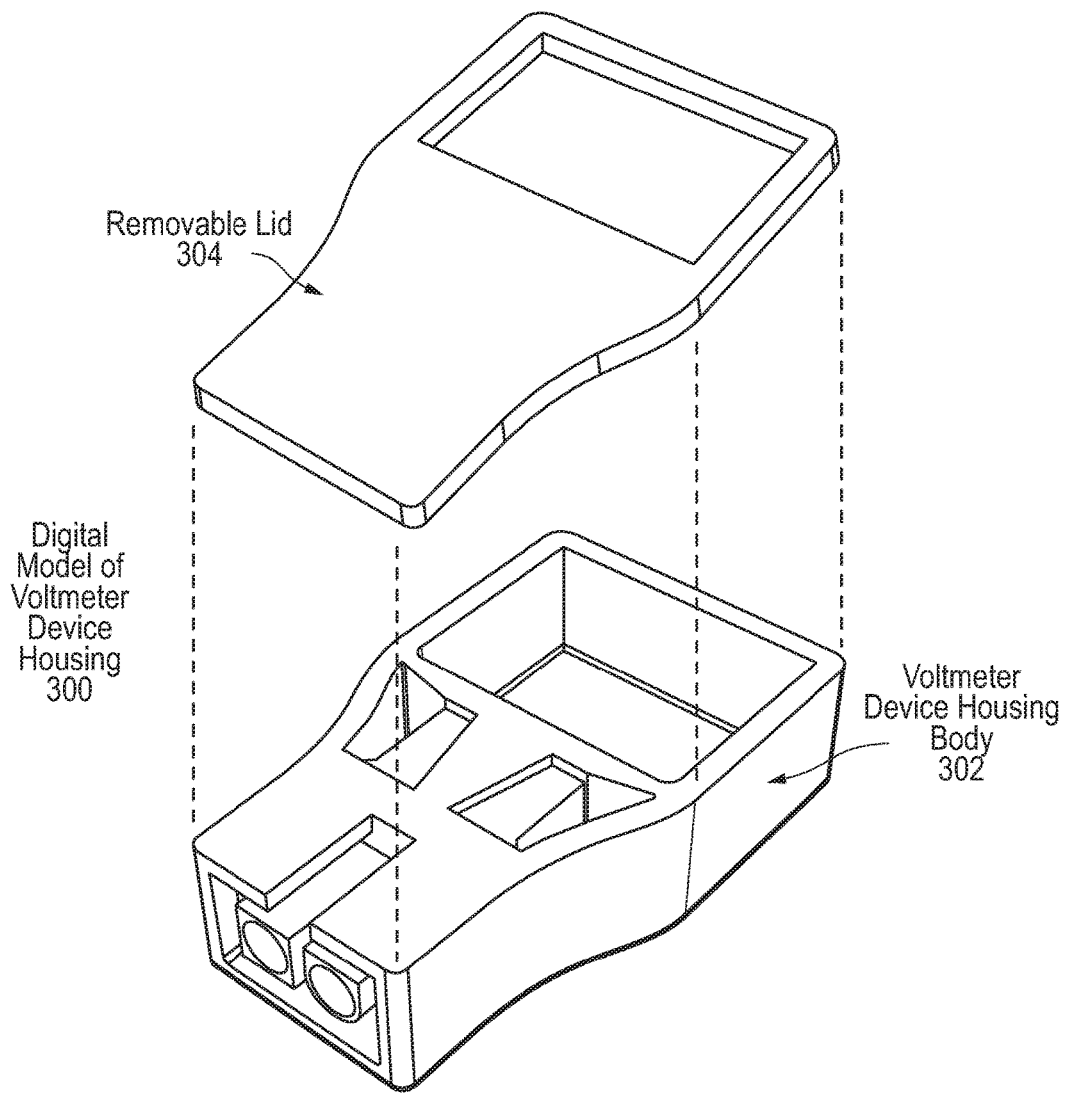
FIG. 3A is a graphical diagram illustrating an exploded view of a three-dimensional digital model of an integrated voltmeter device housing according to an embodiment of the present disclosure.

FIG. 3A is a graphical diagram illustrating an exploded view of a three-dimensional digital model of an integrated voltmeter device housing according to an embodiment of the present disclosure. As shown in FIG. 3A, a voltmeter device housing body 302 in an embodiment may operate to mate with a removable lid 304, allowing for insertion of the voltmeter, electrically conductive wires, and two or more pin connector type terminal within the voltmeter device housing body 302. Following such insertion, the removable lid 304 in an embodiment may mate with to the voltmeter device housing body 302 so as to enclose the voltmeter, electrically conductive wires, and two or more pin connector type terminals within the voltmeter device housing body 302, as described in greater detail below. FIG. 3A shows only one possible configuration of a voltmeter device housing body 302 and a removable lid 304. The removable lid 304 in an embodiment may take any shape, so long as it may not impair functionality of the voltmeter device housing body 302, as described in greater detail below, and so long as it may mate with the voltmeter device housing body 302 to enclose the voltmeter, electrically conductive wires, and two or more pin connector type terminals within the voltmeter device housing body 302, once inserted.

FIG. 3B

Figure 3B:
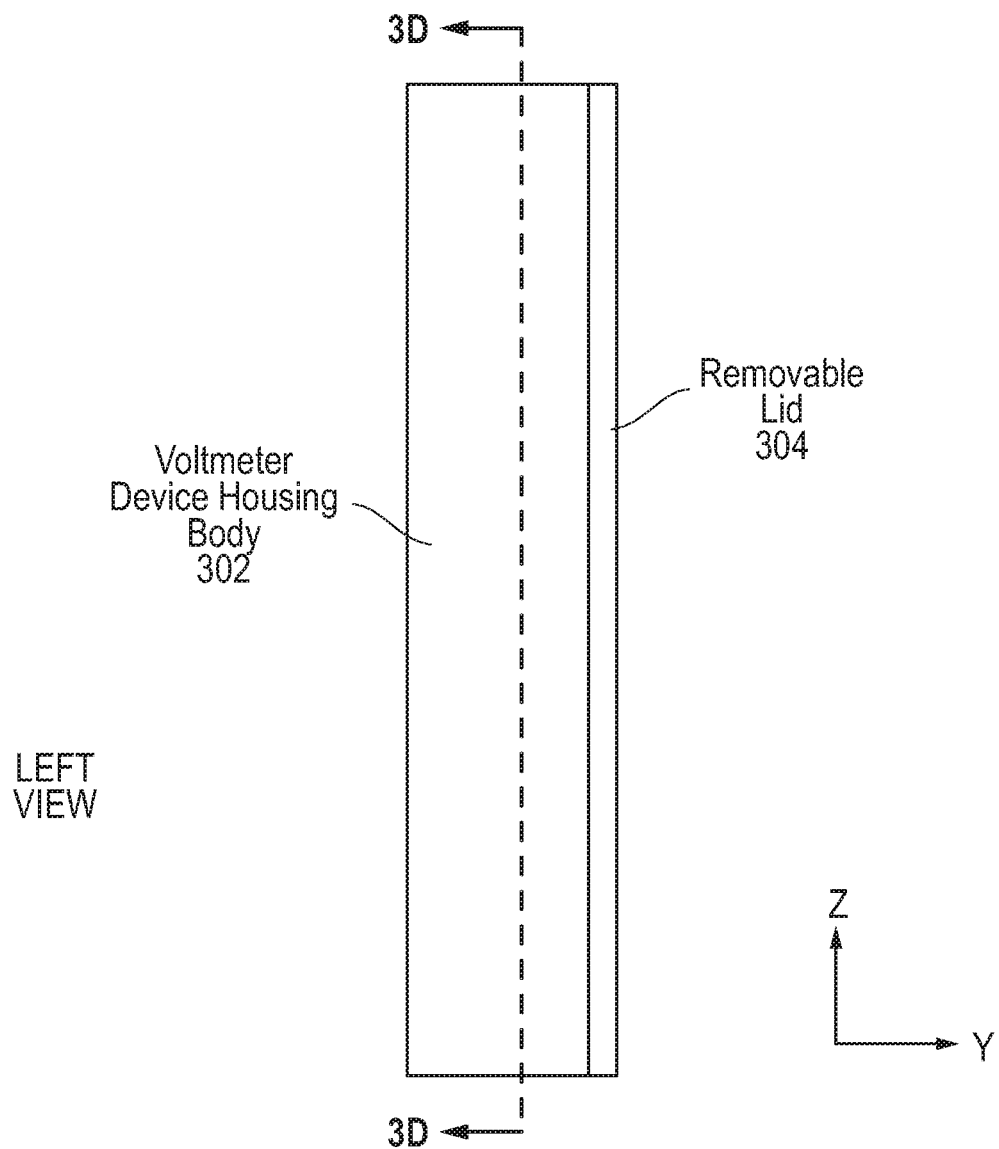
FIG. 3B is a graphical diagram illustrating a left side view of a three-dimensional digital model of an integrated voltmeter device housing according to an embodiment of the present disclosure.

FIG. 3B is a graphical diagram illustrating a left side view of a three-dimensional digital model of an integrated voltmeter device housing according to an embodiment of the present disclosure. As described above, a voltmeter device housing body 302 in an embodiment may operate to mate with a removable lid 304, allowing for insertion of the voltmeter, electrically conductive wires, and two or more pin connector type terminal within the voltmeter device housing body 302. As also described above, and as shown in FIG. 3B, the removable lid 304 in an embodiment may mate with to the voltmeter device housing body 302. The removable lid 304 in an embodiment need not be removable (may be permanently affixed to the voltmeter device housing body 302) after insertion of the voltmeter, electrically conductive wires, and two or more pin connector type terminals into the voltmeter device housing body 302.

FIG. 3C

Figure 3C:
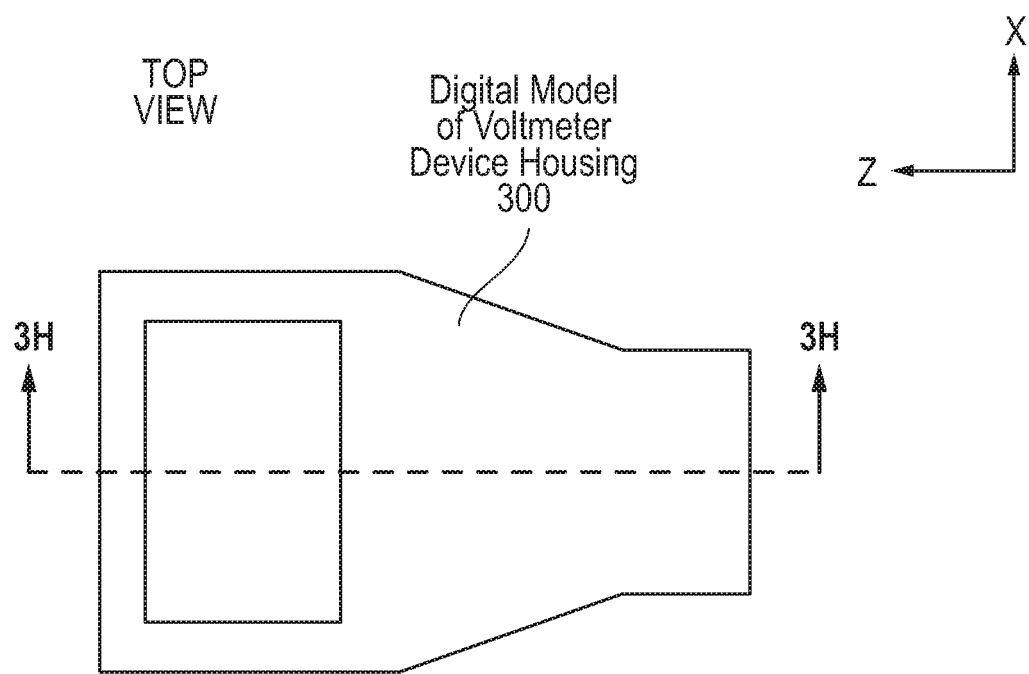
FIG. 3C is a graphical diagram illustrating a top view of a three-dimensional digital model of an integrated voltmeter device housing according to an embodiment of the present disclosure.

FIG. 3C is a graphical diagram illustrating a top view of a three-dimensional digital model of an integrated voltmeter device housing according to an embodiment of the present disclosure. A digital model of the voltmeter device housing 300 may include a voltmeter device housing body and a removable lid. As described above, a voltmeter digital display (not shown) may be enclosed within a voltmeter device housing body in an embodiment by a removable lid adhered to the voltmeter device housing body. As also described above, the voltmeter digital display may be visible through the voltmeter viewing window after the voltmeter digital display is enclosed within the voltmeter device housing body.

FIG. 3D

Figure 3D:
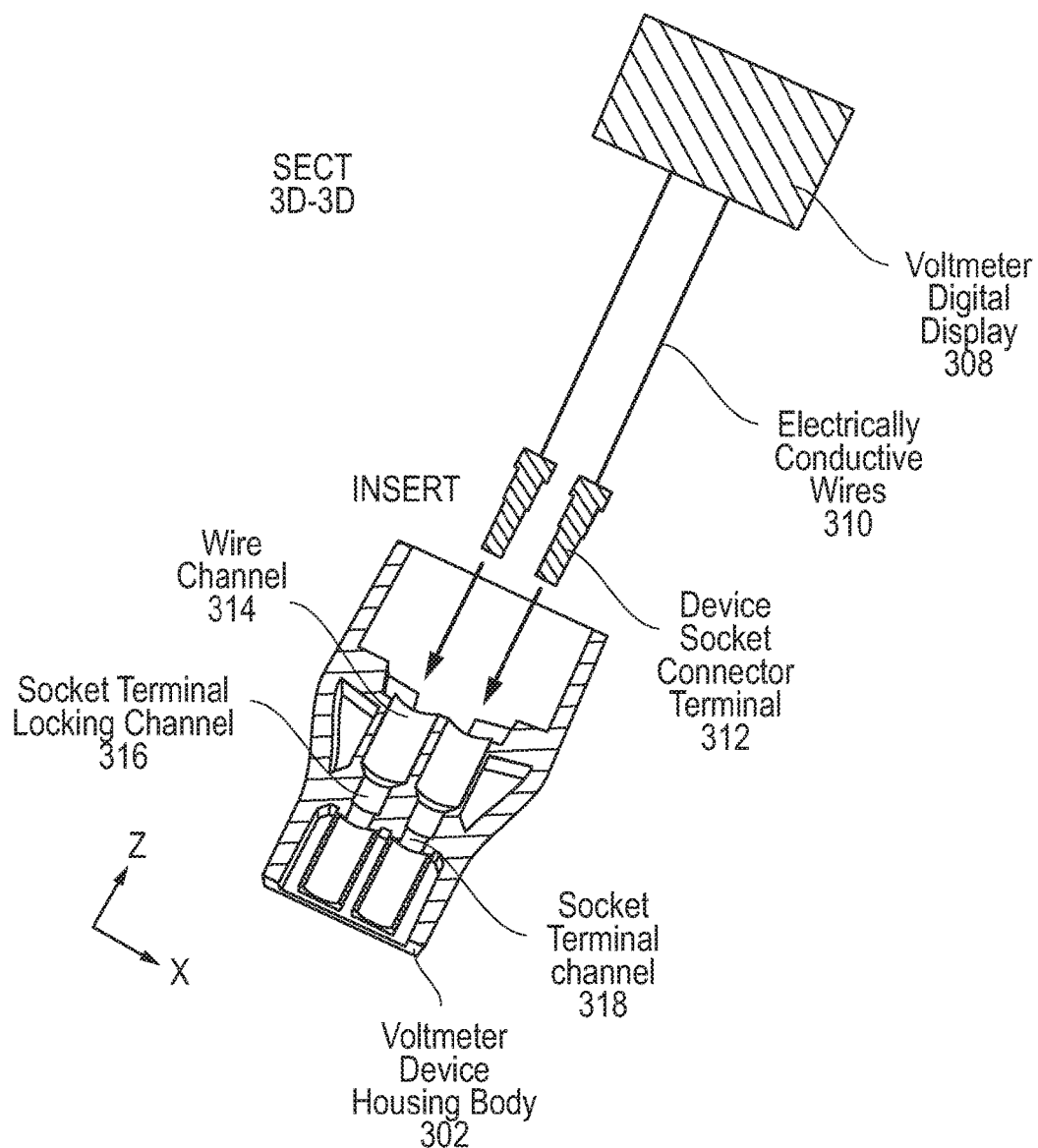
FIG. 3D is a graphical diagram illustrating a cross-sectional view of a three-dimensional digital model of an integrated voltmeter device housing according to an embodiment of the present disclosure.

FIG. 3D is a graphical diagram illustrating a cross-sectional view of a three-dimensional digital model of an integrated voltmeter device housing according to an embodiment of the present disclosure. As shown in FIG. 3D, in an embodiment two electrically conductive wires 310 may each be operably connected on one end a device socket connector terminal 312, and on the other end to a voltmeter digital display 308, and/or a voltmeter microchip (not shown). As also shown in FIG. 3D, each of the two device socket connector terminals 312 in an embodiment may be inserted into a wire channel 314, a socket terminal locking channel 316, and a socket terminal channel 318. Although the voltmeter device housing 300, as shown in FIG. 3D, includes a female mating housing and allows for insertion of device socket connector terminals 312, other embodiments of the voltmeter device housing 300 may include a male mating housing and allow for insertion of device pin connector terminals, as described below. As discussed above, the terminal housing may include terminal insulating channels that may take many shapes. In one embodiment, the terminal insulating channels may incorporate a combination of wire channels 314, socket terminal locking channels 316, and socket terminal channels 318, as shown in FIG. 3D. Also as discussed above, a voltmeter device housing 300 may incorporate a gendered mating housing for mating with a battery terminal housing having the opposite gender. For example, the mating housing may be a female mating housing for partially enclosing device socket connector terminals 312, and for mating with a male battery terminal housing, as shown in FIG. 3D. As shown in FIG. 3D, each device socket connector terminal 312 may be inserted into the voltmeter device housing 300 through a wire channel 314.

As also discussed above, in another embodiment, the terminal insulating channels may incorporate a combination or wire channels 314, pin terminal locking channels (not shown), and pin terminal channels (not shown), as described in greater detail below. In such an embodiment, the mating housing may be male, for partially enclosing device pin connector terminals (not shown) and for mating a female battery terminal housing. In such an embodiment, each device pin connector terminal may be inserted into the voltmeter device housing 300 through a wire channel 314.

FIG. 3E

Figure 3E:
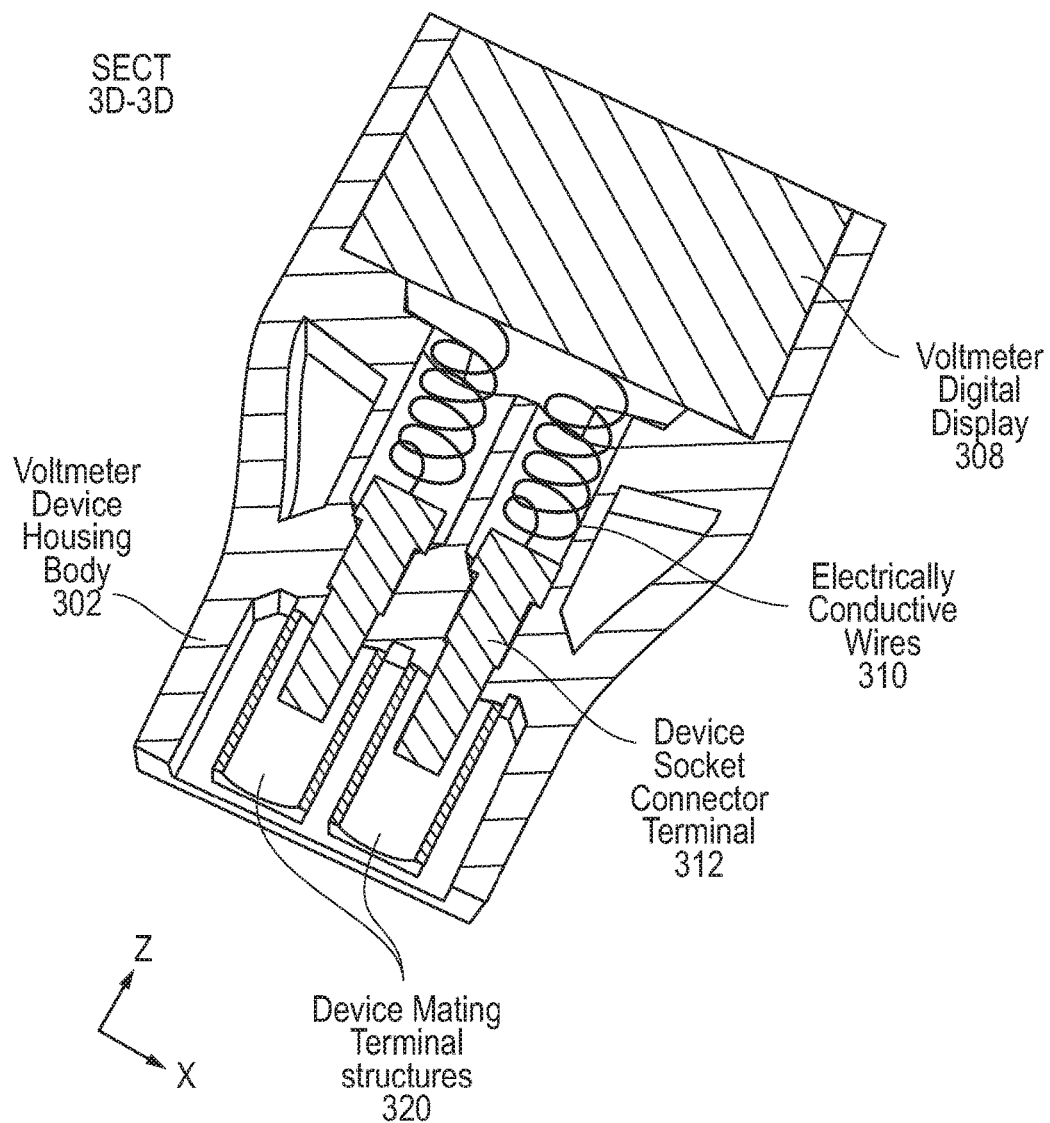
FIG. 3E is a graphical diagram illustrating a cross-sectional view of a three-dimensional digital model of an integrated voltmeter device housing according to an embodiment of the present disclosure.

FIG. 3E is a graphical diagram illustrating a cross-sectional view of a three-dimensional digital model of an integrated voltmeter device housing according to an embodiment of the present disclosure. As shown in FIG. 3E, the device socket connector terminals 312 in an embodiment may be inserted toward the end of the voltmeter device housing 300 which may mate with a battery terminal housing, such that a portion of each of the device socket connector terminals 312 is disposed within the exterior walls of the mating housing. The device socket connector terminals 312 may extend a distance into the mating housing to allow for electrically conductive contact to be made between each of the device socket connector terminals 312 and one of the battery pin connector terminals upon mating of the voltmeter device housing 300 and a battery terminal housing.

As discussed above, a voltmeter device housing may incorporate a gendered mating housing for mating with a battery terminal housing having the opposite gender. For example, the mating housing may be a female mating housing for housing device socket (female) connector terminals 312, and for mating with a male battery terminal housing, as shown in FIG. 3E. In such an embodiment, the mating housing may incorporate device mating terminal structures 320 operating to insert into battery pin connector type terminal channels disposed within the battery terminal housing upon insertion of the male battery terminal housing into the female mating housing. The device socket connector terminals 312 in such an embodiment may be inserted such that a portion of each device socket connector terminal 312 extends into the device mating terminal structures 320, allowing for electrically conductive contact to be made between each device socket connector terminal 312 and one of the battery pin terminals upon insertion of the male battery terminal housing into the female device mating housing. As also shown in FIG. 3E, the electrically conductive wires 310, voltmeter digital display 308, and voltmeter microchip (not shown) may be inserted into the voltmeter device housing 300.

FIG. 3F

Figure 3F:
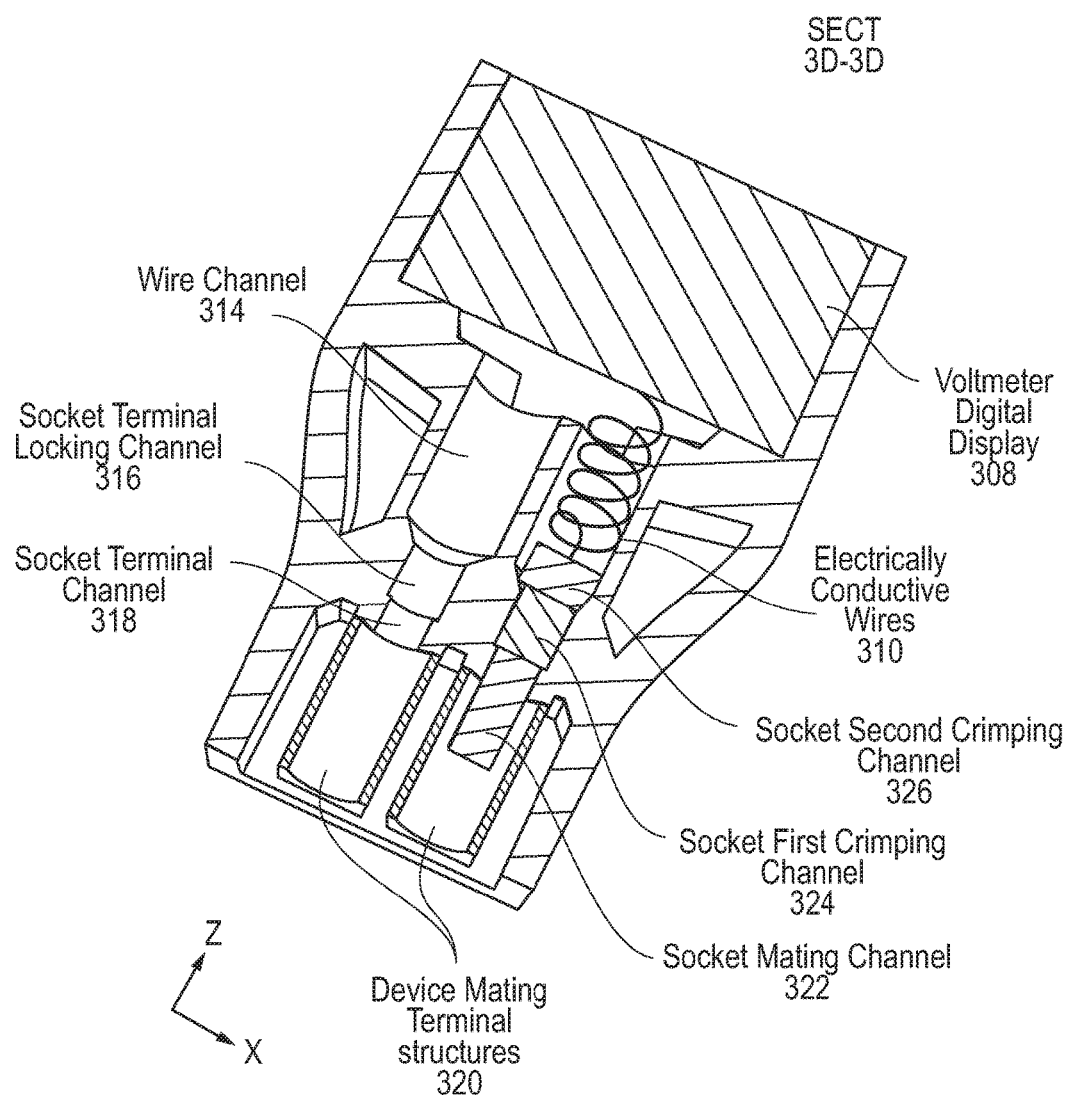
FIG. 3F is a graphical diagram illustrating a cross-sectional view of a three-dimensional digital model of an integrated voltmeter device housing according to an embodiment of the present disclosure.

FIG. 3F is a graphical diagram illustrating a cross-sectional view of a three-dimensional digital model of an integrated voltmeter device housing according to an embodiment of the present disclosure. As discussed in greater detail below, a device pin connector type terminal may be gendered, and may be a device socket connector terminal or a device pin connector terminal. As also discussed below and as shown in FIG. 3F, a socket connector terminal may comprise a socket mating channel 322, a socket first crimping channel 324, and a socket second crimping channel 326. As also described above, a terminal housing in an embodiment may include terminal insulation channels, which may take many forms. In one embodiment, each terminal insulation channel may comprise a combination of a wire channel 314, a socket terminal locking channel 316, and a socket terminal channel 318. In such an embodiment, a socket terminal channel 318 may have a diameter large enough to allow for insertion of a socket mating channel 322, but not large enough to allow for insertion of the socket first crimping channel 324. A socket terminal channel 318 of such an embodiment may operate to disallow insertion of the device socket connector terminal beyond a specified point within the voltmeter device housing body, and may operate to allow for insertion of only a portion of a socket mating channel 322 into each device mating terminal structure 320.

As described above, a voltmeter device housing in an embodiment may operate to enclose device socket connector terminals and to mate with a male battery terminal housing, as shown in FIG. 3F. In other embodiments, the voltmeter device housing may operate to enclose device pin connector terminals and to mate with a female battery terminal housing. As discussed below, a pin connector terminal may comprise a pin mating channel, a pin first crimping channel having a diameter larger than the diameter of the pin mating channel, and a pin second crimping channel having a diameter larger than the diameter of the pin first crimping channel. As also described above, a terminal housing in an embodiment may include terminal insulation channels, which may take many forms. In an embodiment in which the voltmeter device housing may operate to enclose device pin connector terminals and to mate with a female battery terminal housing, each terminal insulation channel may comprise a combination of a wire channel 314, a pin terminal locking channel (not shown), and a pin terminal channel (not shown). In such an embodiment, a pin terminal channel (not shown) may have a diameter large enough to allow for insertion of a pin mating channel, but not large enough to allow for insertion of the pin first crimping channel (not shown). A pin terminal channel (not shown) of such an embodiment may operate to disallow insertion of the device pin connector terminal beyond a specified point within the voltmeter device housing body, and may operate to allow for insertion of only a portion of a pin mating channel (not shown) into each device mating terminal structure.

FIG. 3G

Figure 3G:
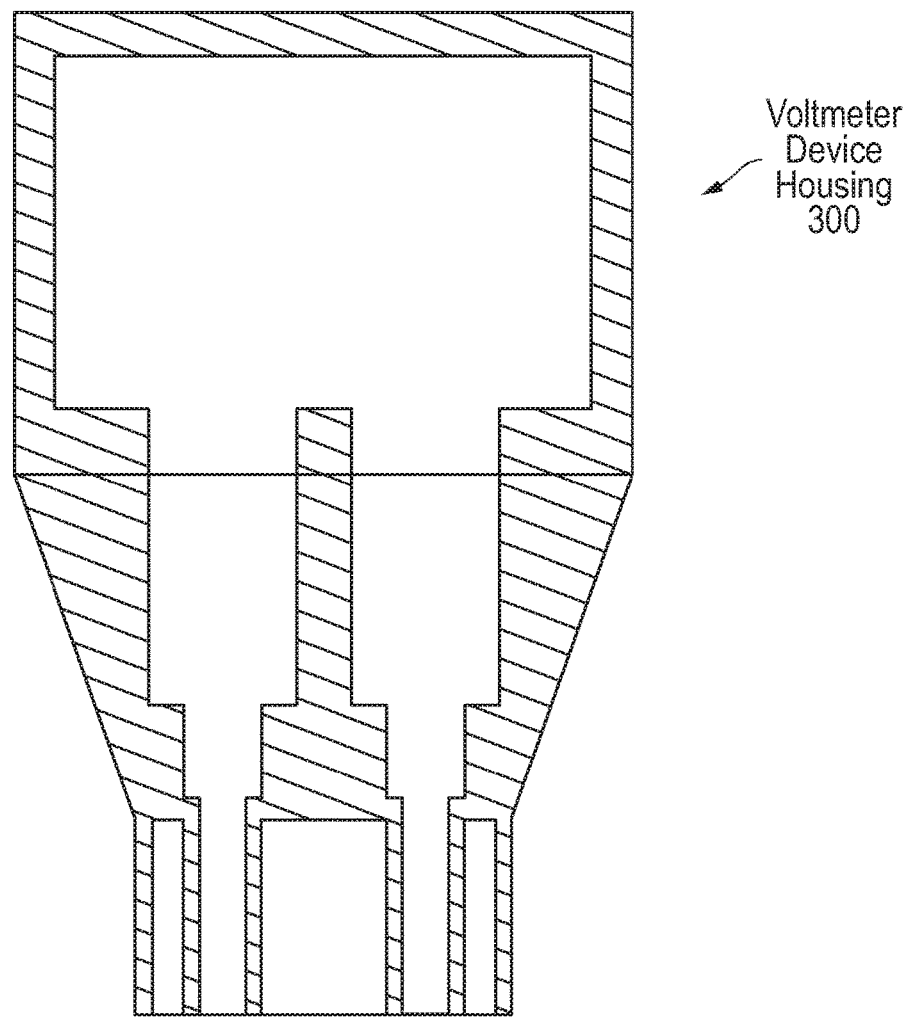
FIG. 3G is a graphical diagram illustrating a cross-sectional view of a three-dimensional digital model of an integrated voltmeter device housing according to an embodiment of the present disclosure.
Figure 3G:
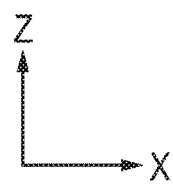

FIG. 3G is a graphical diagram illustrating a cross-sectional view of a three-dimensional digital model of an integrated voltmeter device housing according to an embodiment of the present disclosure. As described above, a three-dimensional digital model of an integrated voltmeter device housing 300 in an embodiment may comprise a voltmeter housing, a terminal housing, and either a female device mating housing or a male device mating housing. As shown in FIG. 3G, a digital model of a voltmeter device housing 300 may be generated by selecting the voltmeter housing, female (or male) device mating housing, and terminal housing of an embodiment and using the join function to join the digital models of those three separate structures into a digital model of the voltmeter device housing 300 single structure.

FIG. 3H

Figure 3H:
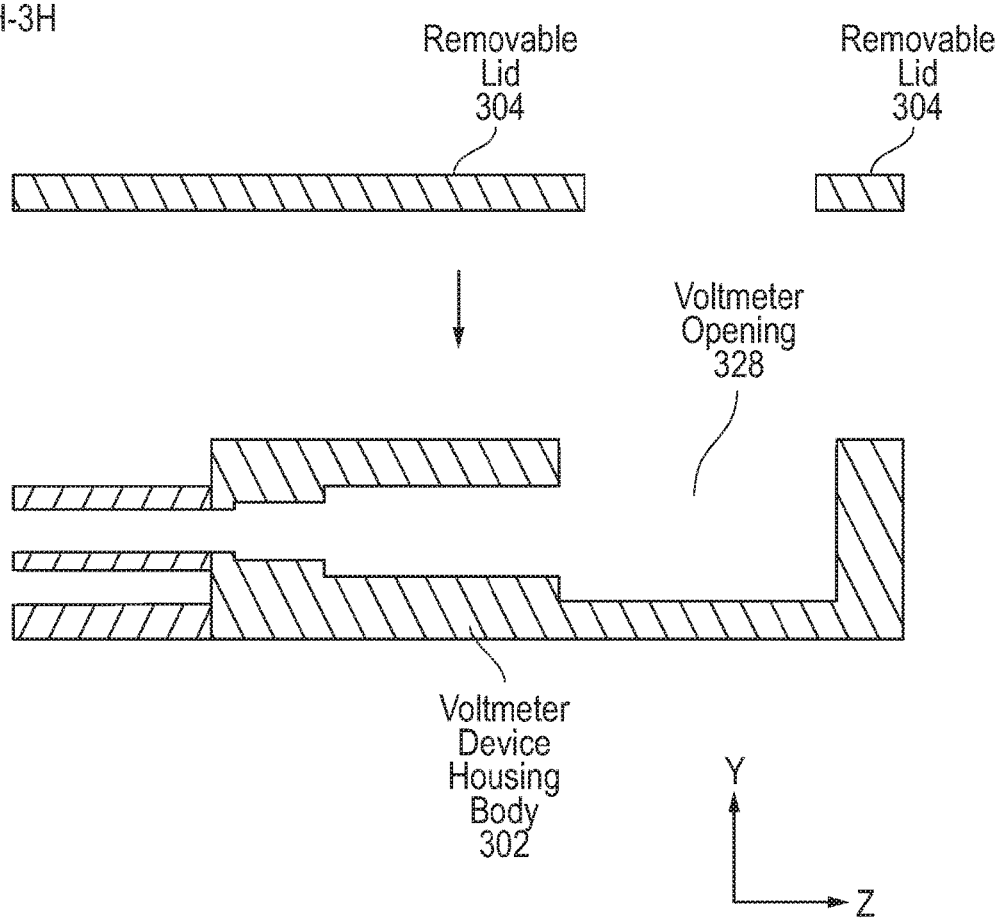
FIG. 3H is a graphical diagram illustrating an exploded cross-sectional view of a three-dimensional digital model of an integrated voltmeter device housing according to an embodiment of the present disclosure.

FIG. 3H is a graphical diagram illustrating an exploded cross-sectional view of a three-dimensional digital model of an integrated voltmeter device housing according to an embodiment of the present disclosure. As shown in FIG. 3H, the digital model of the voltmeter device housing in an embodiment may be separated into two structures, including a voltmeter device housing body 302, and a removable lid 304. The voltmeter device housing may be separated in any number of ways so long as the voltmeter device housing body 302 and removable lid 304 maintain structural integrity upon fabrication, such that an opening in the upper surface of the voltmeter device housing body 302 is formed to allow for insertion of two or more pin connector type terminals, two or more electrically conductive wires, a voltmeter microchip, and a voltmeter digital display within the voltmeter device housing body 302, and such that the removable lid 304 may adhere to the voltmeter device housing body 302 so as to enclose the inserted two or more pin connector type terminals, two or more electrically conductive wires, voltmeter microchip and voltmeter digital display within the voltmeter device housing body 302. As an example, as shown in FIG. 3H, the removable lid 304 may have a rectangular cross sectional shape when viewed from the right side, and the voltmeter device housing body 302 may include a voltmeter opening 328 disposed within its upper surface.

FIG. 4A

Figure 4A:
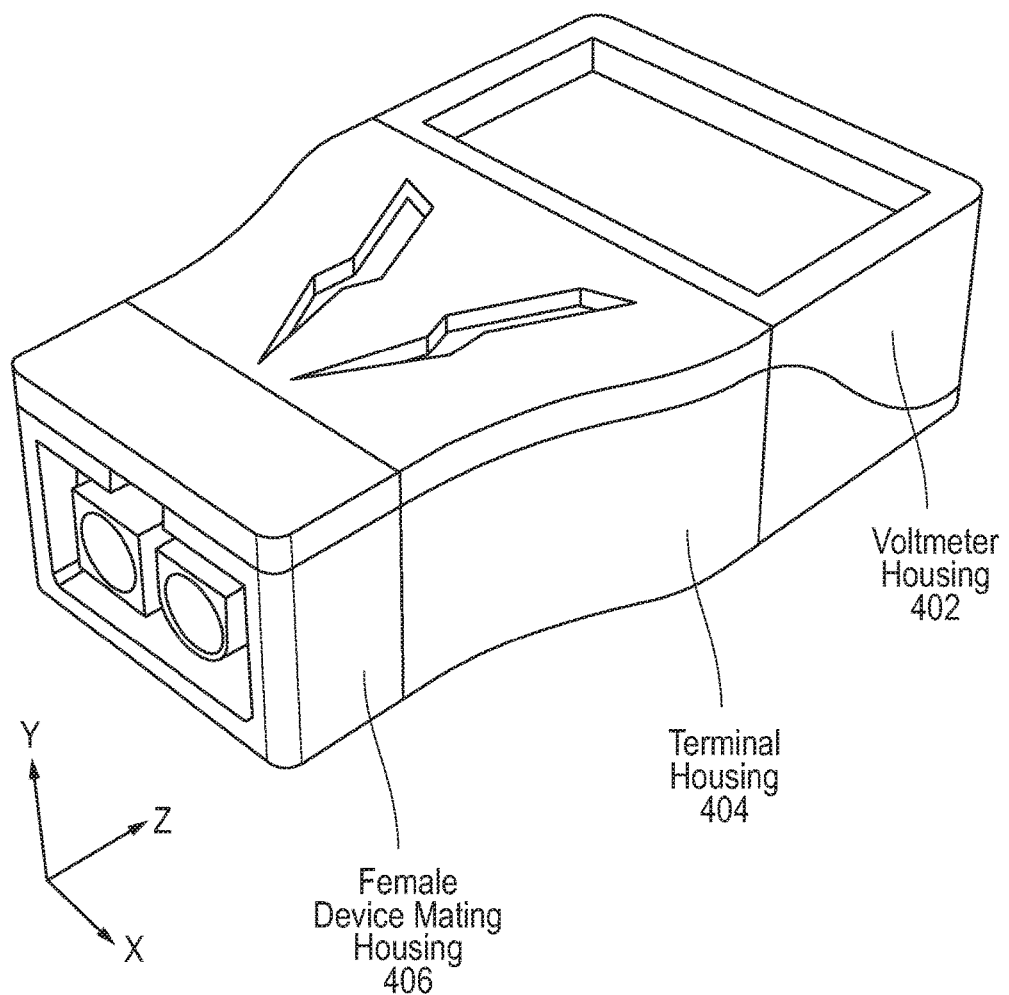
FIG. 4A is a graphical diagram illustrating a perspective view of a three-dimensional digital model of an integrated voltmeter device housing according to an embodiment of the present disclosure.

FIG. 4A is a graphical diagram illustrating a perspective view of a three-dimensional digital model of an integrated voltmeter device housing according to an embodiment of the present disclosure. As shown in FIG. 4A, a voltmeter device housing 400 may comprise a voltmeter housing 402, a female device mating housing 406, and a terminal housing 404.

As discussed above, a mating housing may be female, male, or may incorporate aspects of both genders. A female device mating housing 406 in an embodiment, as shown in FIG. 4A may be a device mating housing for mating with the voltmeter device housing with a DC battery having a battery terminal housing comprising two battery pin connector terminals. For example, in the embodiment described with reference to FIG. 4A, a female device mating housing 406 may comprise one or more exterior walls for partially housing two device socket connector terminals (not shown) disposed throughout the female device mating housing 406, such that each of the device socket connector terminals (not shown) may make electrically conductive contact with one of the battery pin connector terminals (not shown) upon mating the male battery terminal housing (not shown) with the female device mating housing 406, as described in greater detail above.

As described above, the female device mating housing may further comprise each of the device socket connector terminals being disposed throughout the length of a device mating terminal structure (not shown). In other embodiments, for example in the embodiment described with reference to FIG. 4A, the female device mating housing 406 may not include device mating terminal structures (not shown).

In an embodiment, the terminal housing 404 may operate to house a portion of the device pin connector type terminals and the electrically conductive wires. In an embodiment, the terminal housing 404 may also insulate these elements from one another such that the terminal housing 404 disallows electrically conductive contact to be made between each of the device pin connector type terminals, between each of the electrically conductive wires, or between any device pin connector type terminal and any electrically conductive wire not operatively connected to that device pin connector type terminal prior to insertion of the terminals and wires into the voltmeter device housing.

FIG. 4B

Figure 4B:
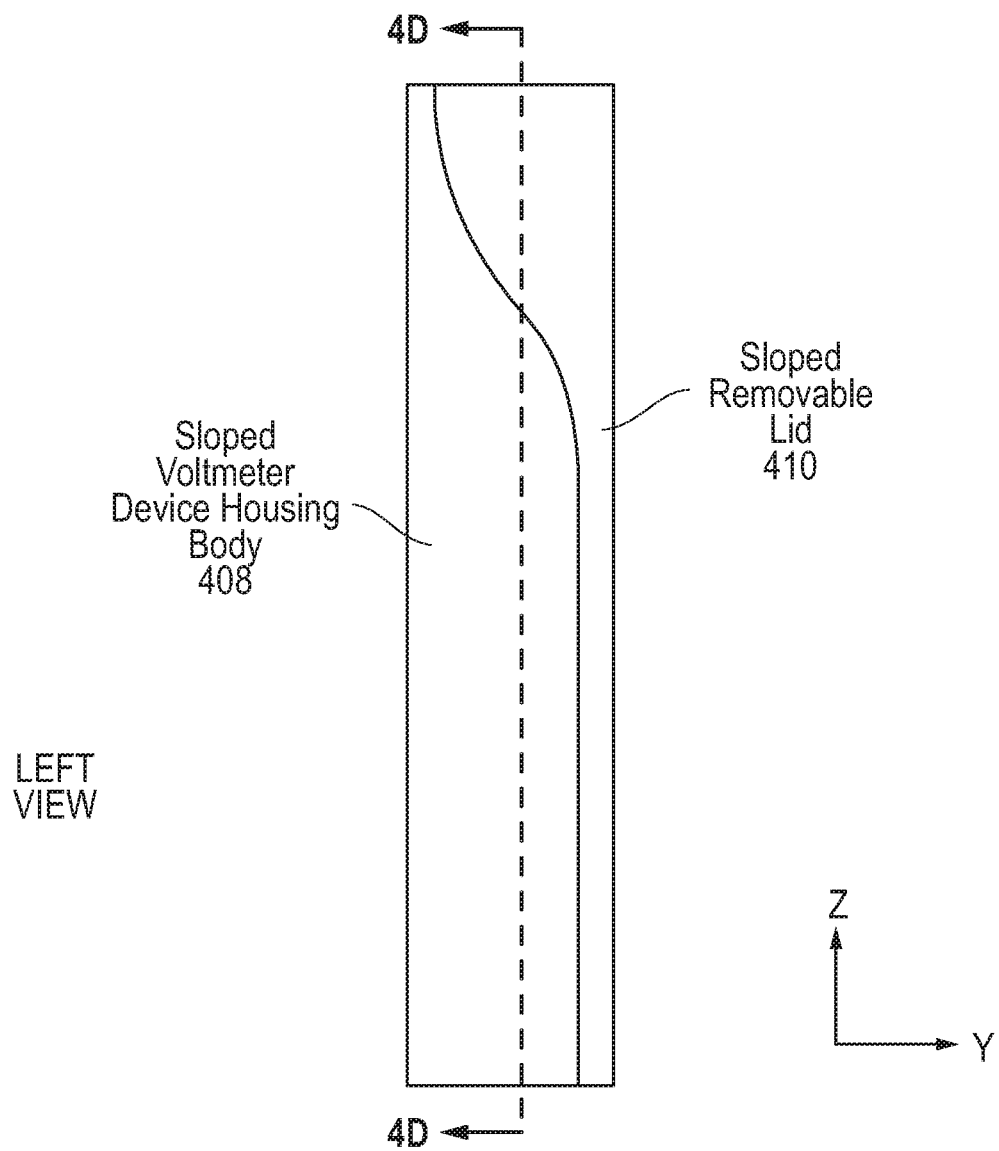
FIG. 4B is a graphical diagram illustrating a left-side view of a three-dimensional digital model of an integrated voltmeter device housing according to an embodiment of the present disclosure.

FIG. 4B is a graphical diagram illustrating a left-side view of a three-dimensional digital model of an integrated voltmeter device housing according to an embodiment of the present disclosure. As described above, a voltmeter device housing in an embodiment may comprise a sloped voltmeter device housing body 408 and a sloped removable lid 410. The sloped voltmeter device housing body 408 and sloped removable lid 410 may operate to enclose a voltmeter digital display, a voltmeter microchip, two or more electrically conductive wires, and two or more pin connector type terminals, such that two or more pin connector type terminals of a battery may mate with the side of the voltmeter device housing opposite the voltmeter digital display, and make electrically conductive contact with the two or more pin connector type terminals housed within the sloped voltmeter device housing, causing the voltmeter digital display to display the voltage remaining within the battery.

FIG. 4C

Figure 4C:
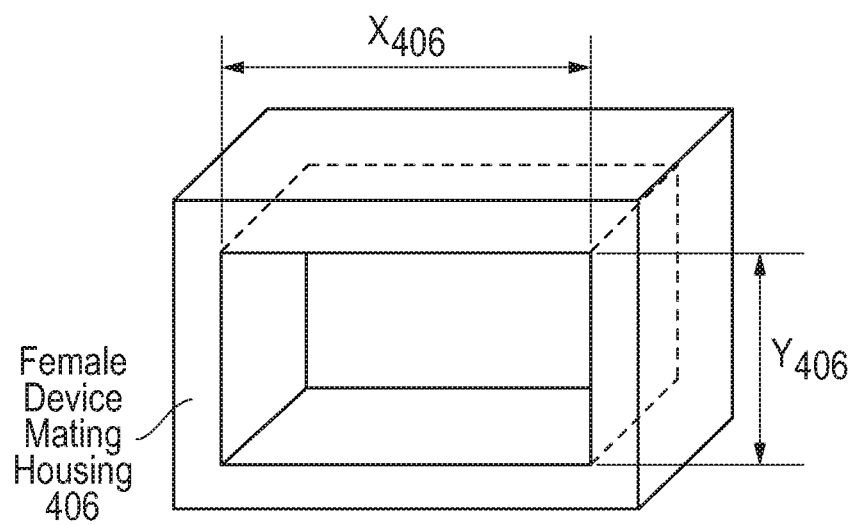
FIG. 4C is a graphical diagram illustrating a partial view of a three-dimensional digital model of an integrated voltmeter device housing according to an embodiment of the present disclosure.

FIG. 4C is a graphical diagram illustrating a partial view of a three-dimensional digital model of an integrated voltmeter device housing according to an embodiment of the present disclosure. More specifically, FIG. 4C depicts a female device mating housing 406 in an embodiment. In an embodiment, a female device mating housing 406 may operate to partially enclose two or more device socket connector terminals and to mate with the male battery terminal housing of the battery of which the user wishes to know the remaining voltage. The female device mating housing 406 in an embodiment may operate to mate with the male battery terminal housing so as to form an electrically conductive contact between each of the device socket connector terminals and one of the battery pin connector terminals. As shown in FIG. 4C, a female device mating housing 406 in an embodiment may have one or more exterior walls for partially enclosing an inserted male battery terminal housing.

In an embodiment, the female device mating housing 406 may have an interior width $X_{406}$ which may be equal to or greater than the exterior width of the male battery terminal housing (not shown), and may have an interior height $Y_{406}$ which may be equal to or greater than the exterior height of the male battery terminal housing (not shown), as described in greater detail below.

FIG. 4D

Figure 4D:
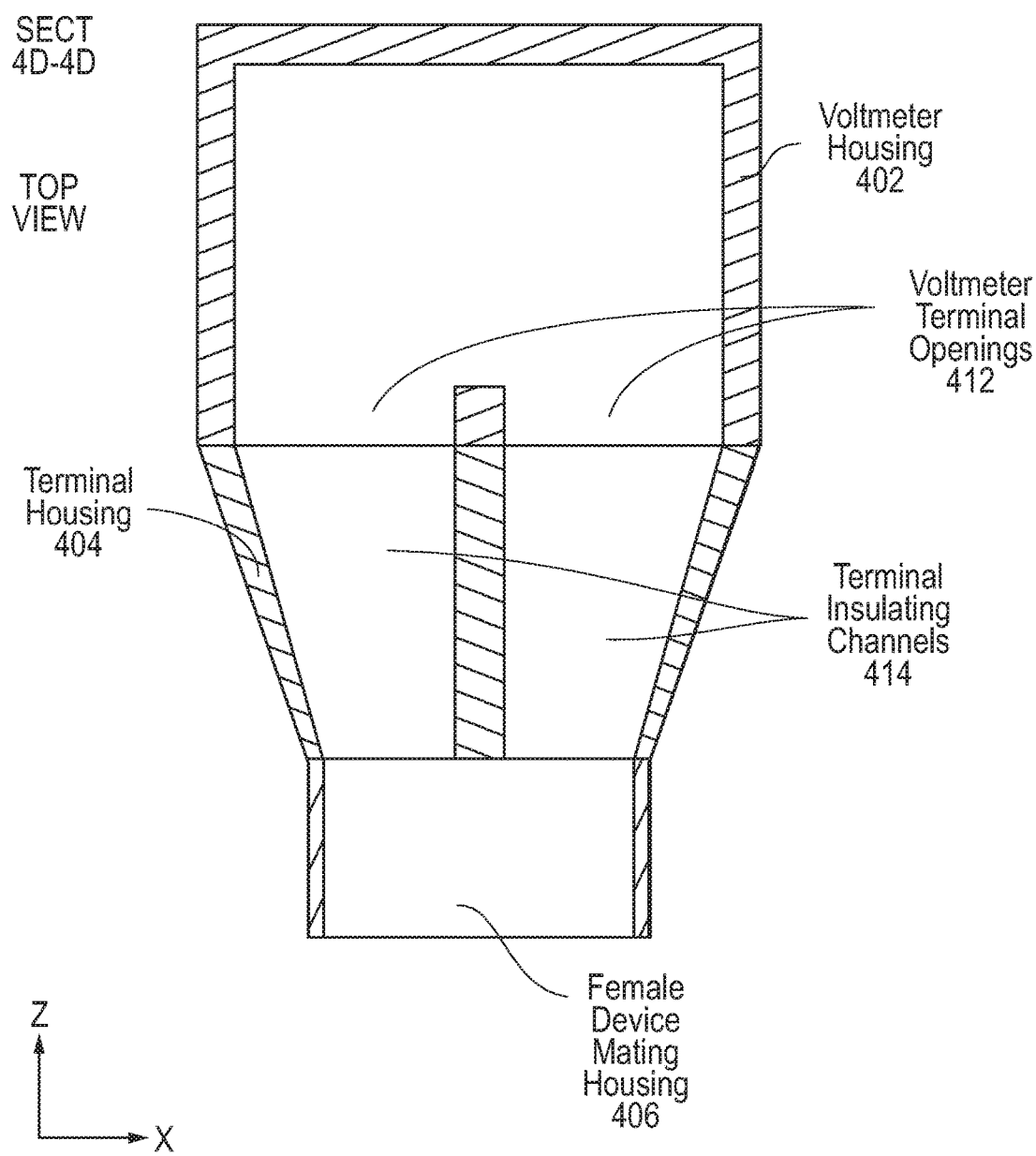
FIG. 4D is a graphical diagram illustrating a cross-sectional view of a three-dimensional digital model of an integrated voltmeter device housing according to an embodiment of the present disclosure.

FIG. 4D is a graphical diagram illustrating a cross-sectional view of a three-dimensional digital model of an integrated voltmeter device housing according to an embodiment of the present disclosure. The terminal housing 404 in an embodiment may include two terminal insulating channels 414 disposed throughout the depth of the terminal housing 404, which form two openings in the leading wall of the terminal housing 404 lying flush with the trailing wall of the voltmeter housing 402, and two openings in the trailing wall of the terminal housing 404 lying flush with the leading wall of the female device mating housing 406. Other embodiments may include more than two terminal insulating channels 414 disposed throughout the terminal housing 404, and may include as many terminal insulating channels 414 as there are pin connector type terminals within the battery terminal housing, such that the terminal housing 404 operates to limit or prohibit electrically conductive contact between each of the pin connector type terminals located within the voltmeter device housing (which may number more than two), and between each of the electrically conductive wires operatively connected to each pin connector type terminal located within the voltmeter device housing.

The terminal housing 404 in an embodiment may include terminal insulating channels that may take many shapes. In one embodiment, the terminal insulating channels may incorporate a combination of wire channels, socket terminal locking channels, and socket terminal channels, as shown in the embodiment described above with reference to FIG. 2G. In other embodiments, for example, in the embodiment described with reference to FIG. 4D, the terminal insulating channels may not include wire channels, socket terminal locking channels, or socket terminal channels.

As also shown in FIG. 4D, in an embodiment, the voltmeter housing 402 may include two voltmeter terminal openings 412. The voltmeter terminal openings 412 in an embodiment may form two openings in the trailing wall of the voltmeter housing 402 lying flush with the leading edge of the terminal housing 404. In an embodiment, the voltmeter terminal openings 412 may have the same dimensions as the openings formed in the trailing wall of the terminal housing 404 by the terminal insulating channels 414. In other embodiments, the voltmeter terminal openings 412 may not have the same dimensions as the openings formed in the trailing wall of the terminal housing 404 by the terminal insulating channels 414. However, the dimensions and placement of the voltmeter terminal openings 412 and the terminal insulating channels 414 with respect to one another in an embodiment may allow for insertion of a pin connector type terminal through the leading edge of each voltmeter terminal opening 412 and into each terminal insulating channel 414. Other embodiments may include more than two voltmeter terminal openings 412 disposed through the trailing wall of the voltmeter housing 402, and may include as many voltmeter terminal openings 412 as there are pin connector type terminals within the battery terminal housing. Other embodiments may include only one voltmeter terminal opening 412.

As also shown in FIG. 4D, in an embodiment, a digital model of a female device mating housing 406 may be placed such that its one or more exterior walls protrude perpendicularly from the exterior wall of the terminal housing 404 having openings formed by the terminal insulating channels 414 that is opposite the exterior wall of the terminal housing 404 lying flush with the voltmeter housing 402.

FIG. 5A

Figure 5A:
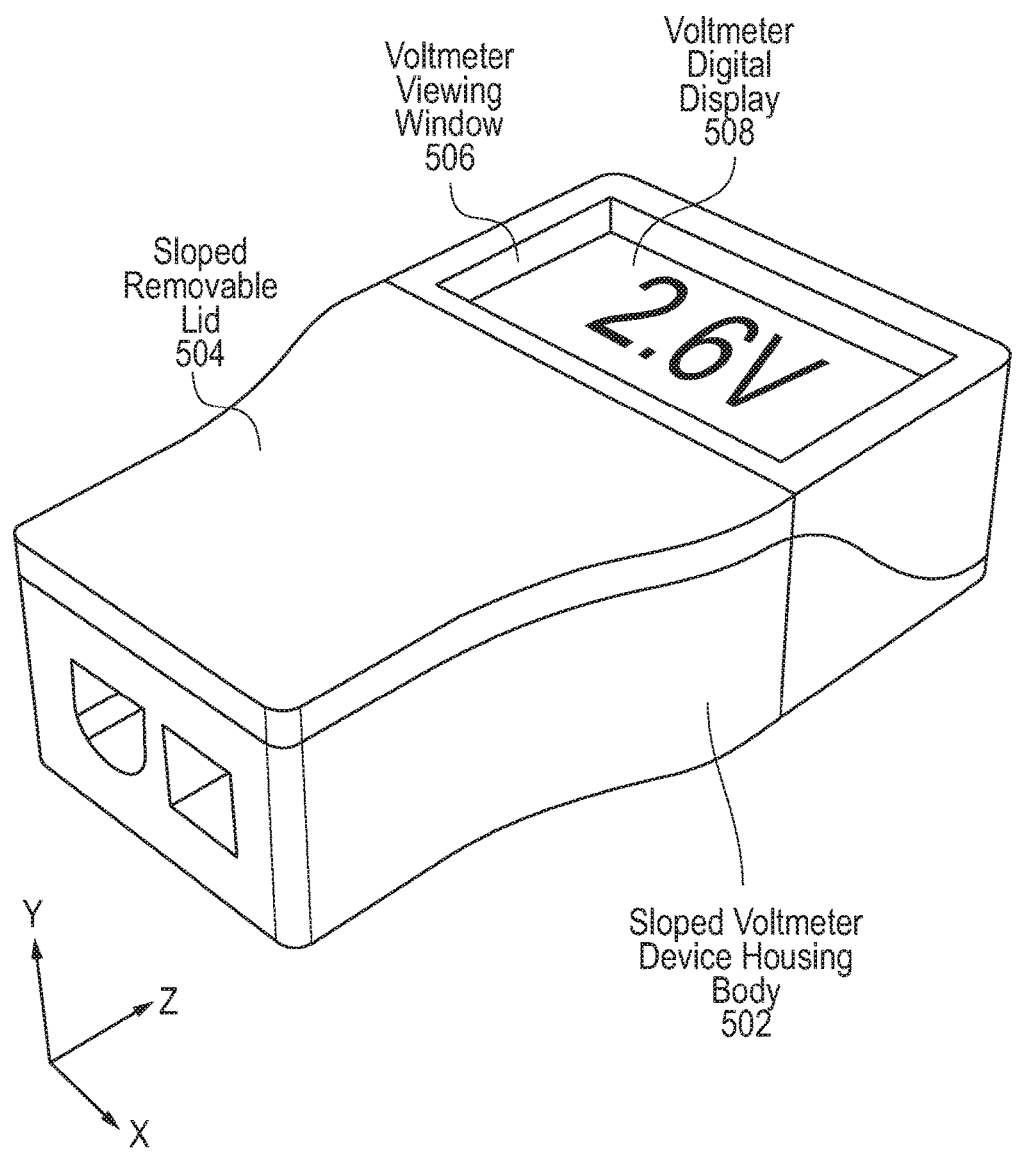
FIG. 5A is a graphical diagram illustrating a perspective view of an integrated voltmeter device housing according to an embodiment of the present disclosure.

FIG. 5A is a graphical diagram illustrating a perspective view of an integrated voltmeter device housing according to an embodiment of the present disclosure. As described in greater detail below, in an embodiment, a voltmeter device comprising a voltmeter digital display 508, a voltmeter microchip (not shown), and two or more electrically conductive wires (not shown) may be operably connected to two or more pin connector type terminals (not shown). A voltmeter device housing in an embodiment may comprise a sloped voltmeter device housing body 502 and a sloped removable lid 504 having a voltmeter viewing window 506. As also described in greater detail below, the voltmeter digital display 508, voltmeter microchip (not shown), two or more electrically conductive wires (not shown), and two or more pin connector type terminals (not shown) may be housed within the voltmeter device housing, such that pin connector type terminals of a battery (not shown) may mate with the side of the voltmeter device housing opposite the voltmeter digital display 508, and make electrically conductive contact with the two or more pin connector type terminals (not shown) housed within the voltmeter device housing, causing the voltmeter digital display 508 to display the voltage remaining within the battery (not shown).

FIG. 5B

Figure 5B:
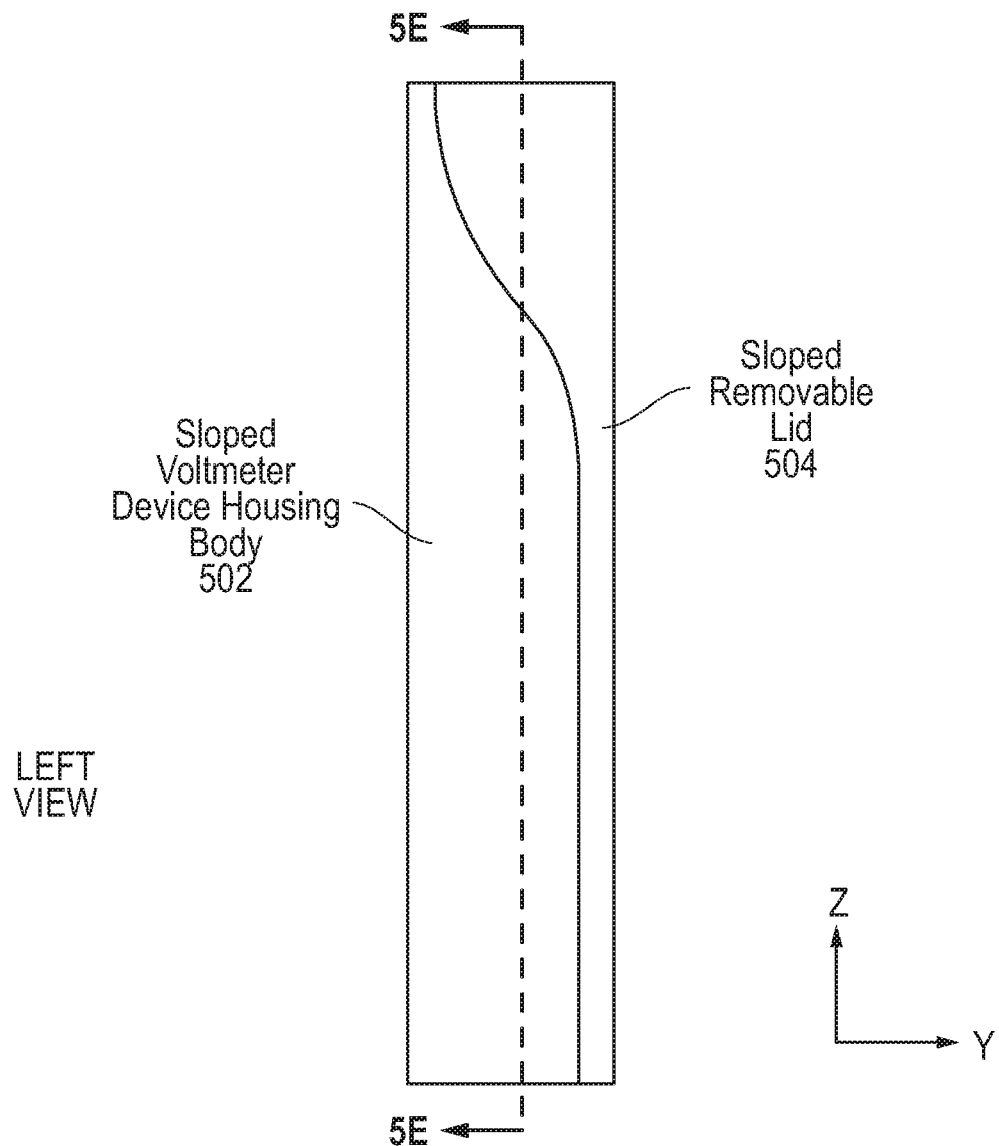
FIG. 5B is a graphical diagram illustrating a left side view of an integrated voltmeter device housing according to an embodiment of the present disclosure.

FIG. 5B is a graphical diagram illustrating a left side view of an integrated voltmeter device housing according to an embodiment of the present disclosure. As described above, a voltmeter device housing in an embodiment may comprise a sloped voltmeter device housing body 502 and a sloped removable lid 504. The sloped voltmeter device housing 502 and sloped removable lid 504 may operate to enclose a voltmeter digital display, a voltmeter microchip, two or more electrically conductive wires, and two or more pin connector type terminals, such that two or more pin connector type terminals of a battery may mate with the side of the voltmeter device housing opposite the voltmeter digital display, and make electrically conductive contact with the two or more pin connector type terminals housed within the voltmeter device housing, causing the voltmeter digital display to display the voltage remaining within the battery.

FIG. 5C

Figure 5C:
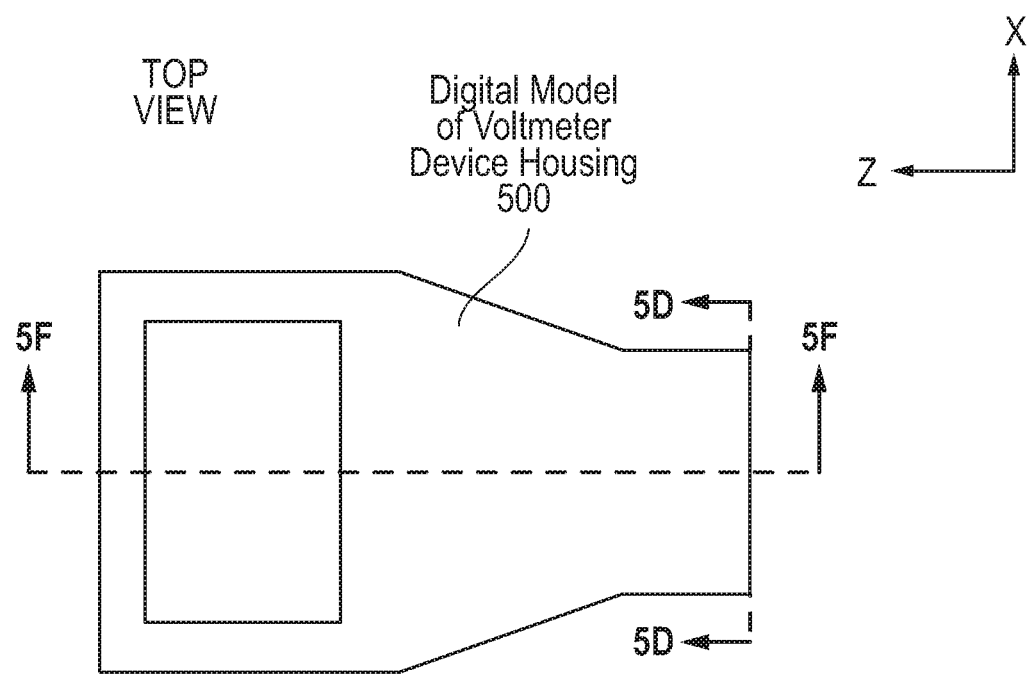
FIG. 5C is a graphical diagram illustrating a top view of an integrated voltmeter device housing according to an embodiment of the present disclosure.

FIG. 5C is a graphical diagram illustrating a top view of an integrated voltmeter device housing according to an embodiment of the present disclosure. As shown in FIG. 5C, the voltmeter digital display in an embodiment may be enclosed within a sloped voltmeter device housing 500. As also shown in FIG. 5C, the voltmeter digital display may be visible through the voltmeter viewing window after the voltmeter digital display is enclosed within the voltmeter device housing 500.

FIG. 5D

Figure 5D:
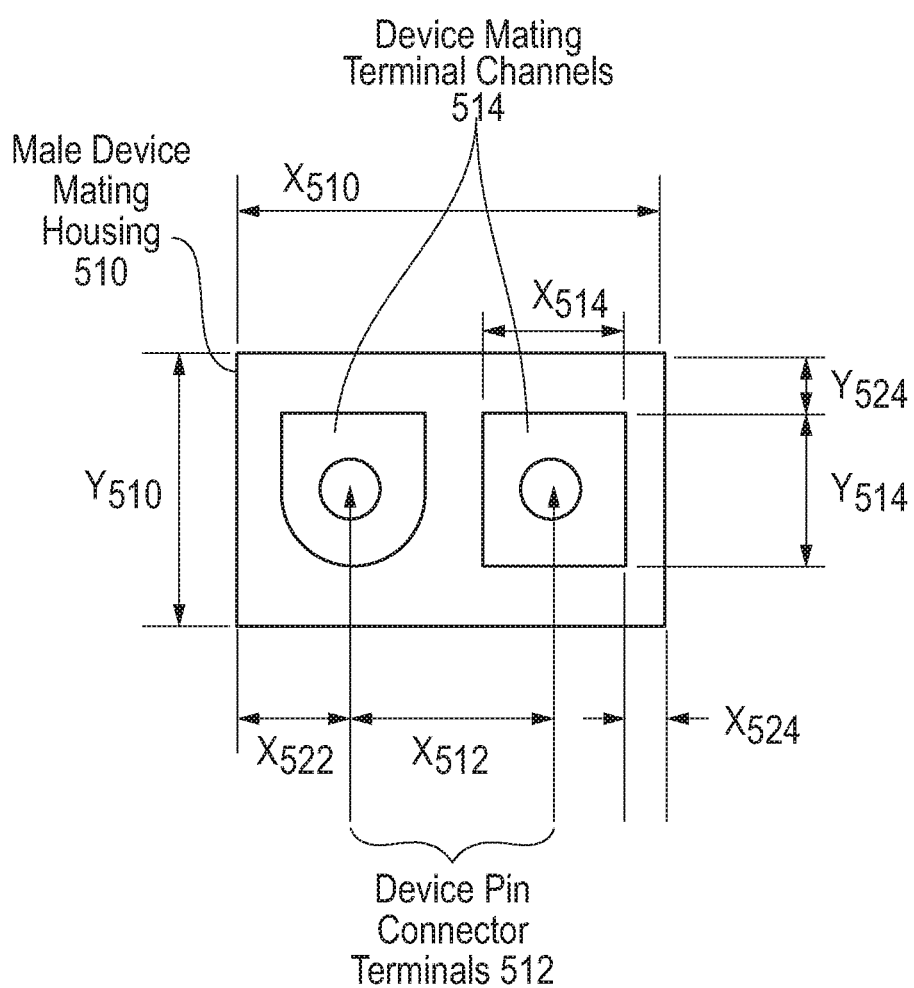
FIG. 5D is a graphical diagram illustrating a rear view of an integrated voltmeter device housing according to an embodiment of the present disclosure.

FIG. 5D is a graphical diagram illustrating a rear view of an integrated voltmeter device housing according to an embodiment of the present disclosure. As discussed above, a mating housing may be female, male, or may incorporate aspects of both genders. The male device mating housing 510 shown in FIG. 5D is only one example of an embodiment and is not intended to limit the scope of this disclosure to a specific gender. A male device mating housing 510 in an embodiment may be a device mating housing for mating the voltmeter device housing with a DC battery having a battery terminal housing comprising two or more battery socket connector terminals. As discussed below, a female battery terminal housing may comprise one or more exterior walls functioning to enclose two or more battery socket (female) connector terminals, and to allow for insertion of a male device mating housing 510 within the one or more exterior walls of the female battery terminal housing. For example, as shown in FIG. 5D, the male device mating housing 510 may have exterior width $X_{510}$ which may be equivalent to the horizontal distance between the interior walls of the female battery terminal housing, and may have an exterior height $Y_{510}$ which may be equivalent to the vertical distance between the interior floor and ceiling of the female battery terminal housing. Each battery socket (female) connector terminal in such a housing may operate to allow for insertion of a device pin (male) connector terminal 512 within itself so as to form an electrically conductive contact between each battery socket (female) connector terminal and one device pin (male) connector terminal 512.

As shown in FIG. 5D, the male device mating housing 510 in an embodiment may operate to partially enclose two or more device pin (male) connector terminals 512. The device pin (male) connector terminals 512 in an embodiment may be partially enclosed within the male device mating housing 510 such that the one or more exterior walls of the male device mating housing 510 enclose the device pin connector terminals 512 for a portion of the device pin connector terminals' 512 depth. In other words, a portion of each of the device pin connector terminals 512 may extend beyond the depth of the male device mating housing 510 in an embodiment.

The radial centers of the device pin connector terminals 512 in an embodiment may also be spaced a horizontal distance $X_{512}$ apart from one another, which may be equivalent to the horizontal distance between the radial centers of the battery socket connector terminals (not shown) housed within the battery terminal housing (not shown), as described in greater detail below. Each device pin connector terminal 512 in an embodiment may also be placed such that their radial centers lie a horizontal distance $X_{522}$ apart from a nearest exterior vertical wall of the male device mating housing 510, which may be equivalent to the horizontal distance between the radial centers of each battery socket connector terminal (not shown) and a nearest vertical interior wall of the female battery terminal housing (not shown), as described in greater detail below. Each device pin connector terminal 512 may also be placed such that its radial center lies a vertical distance $Y_{524}$ apart from the exterior ceiling of the male device mating housing 510, which may be equivalent to the vertical distance between the radial center of each battery socket connector terminal (not shown) and an interior ceiling of the female battery terminal housing (not shown), as described in greater detail below. In such a way, the male device mating housing 510 may insert into the female battery terminal housing (not shown), allowing the battery socket connector terminals (not shown) to make electrically conductive contact with the device pin connector terminals 512.

As described in greater detail below, a battery terminal housing may further comprise each of the battery socket terminals being disposed throughout the length of a battery terminal structure. In an embodiment in which the battery terminal housing with which the sloped voltmeter device housing is intended to mate includes battery terminal structures, the male device mating housing 510 may further comprise two device mating terminal channels 514, as shown in FIG. 5D. Each device mating terminal channel 514 in an embodiment may operate to partially enclose the battery pin connector type terminal structures (not shown) of the female battery terminal housing (not shown) upon insertion of the male device mating housing 510 into the female battery terminal housing, so as to allow electrically conductive contact to be made between each device pin connector terminal 512 and each battery socket connector terminal, as described in greater detail below. The device mating terminal channels 514 in an embodiment may each have a width $X_{514}$, equivalent to or greater than the width of each of the battery terminal structures (not shown) of the female battery terminal housing (not shown), as described in greater detail below. The device mating terminal channels 514 in an embodiment may both have a height $Y_{514}$, which may be equivalent to or greater than the height of each of the battery terminal structures (not shown) of the female battery terminal housing (not shown), as described in greater detail below.

Further, the shape and orientation of the device mating terminal channels 514 in an embodiment may mirror the shape and orientation of the battery terminal structures (not shown) of the female battery terminal housing (not shown), as described in greater detail below. For example, the female battery terminal housing (not shown) in one embodiment may have a rectangular extrusion shaped battery terminal structure, and a u-shaped extrusion battery terminal structure, as described in greater detail below. In such an embodiment, the male device mating housing 510 may comprise a u-shaped device mating terminal channel, the left-most interior wall of the u-shaped device mating terminal channel being located a distance $X_{524}$ away from the left-most exterior wall of the male device mating housing 510, which may be equivalent to the distance between the u-shaped battery terminal structure of the female battery terminal housing and the right-most interior wall of the female battery terminal housing (not shown), as described in greater detail below. Similarly, in such an embodiment, the male device mating housing 510 may comprise a u-shaped device mating terminal channel, the interior ceiling of the u-shaped device mating terminal channel being located a distance $Y_{524}$ away from the top exterior wall of the male device mating housing 510, which may be equivalent to the distance between the top of the u-shaped battery terminal structure of the female battery terminal housing and the interior ceiling of the female battery terminal housing (not shown), as described in greater detail below. In such a way, the shape and orientation of the device mating terminal channels 514 in an embodiment may mirror the shape and orientation of the battery terminal structures (not shown) of the female battery terminal housing (not shown), as described in greater detail below. Further example embodiments may include device mating terminal channels having different dimensions, shapes, and/or orientations within the male device mating housing with respect to one another, as well as device mating terminal channels having the same shape (e.g. two rectangular device mating terminal channels).

FIG. 5E

Figure 5E:
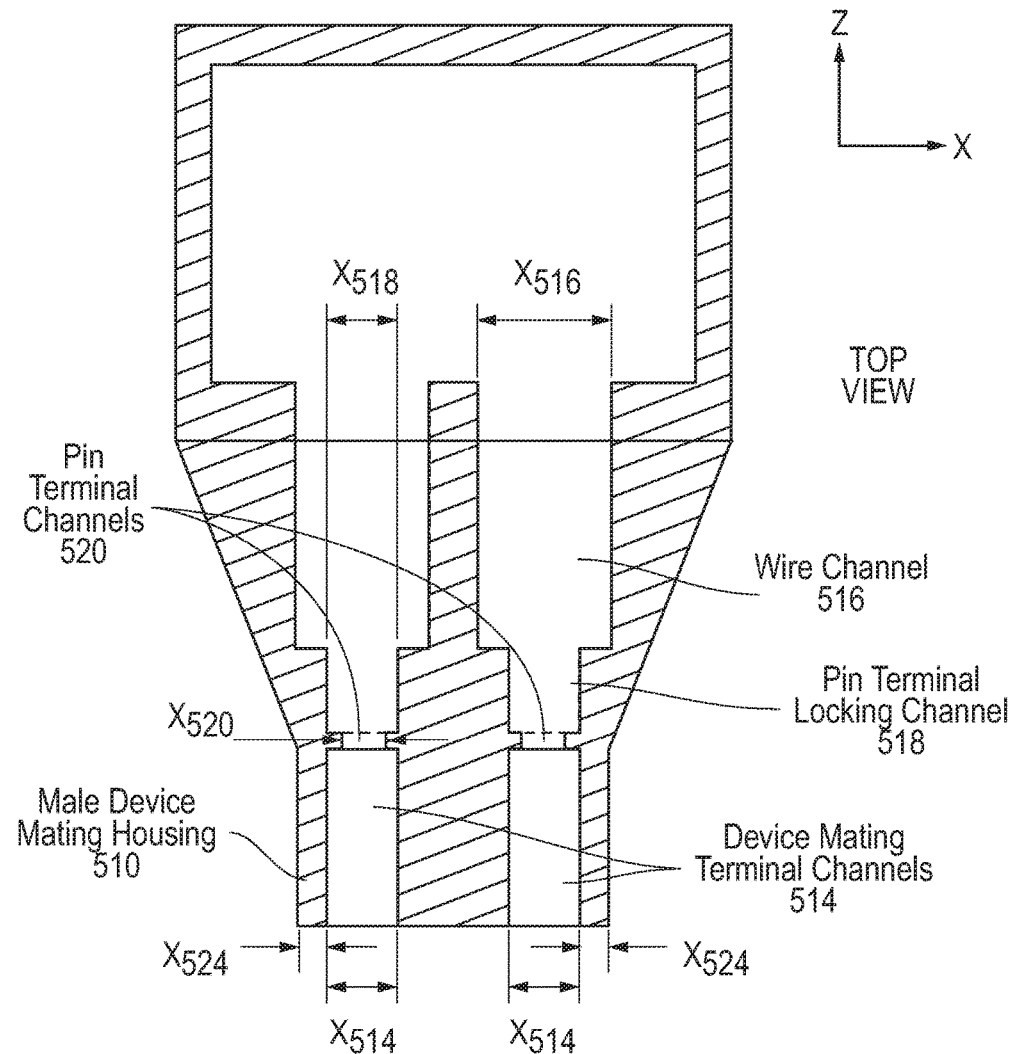
FIG. 5E is a graphical diagram illustrating a cross-sectional view of an integrated voltmeter device housing according to an embodiment of the present disclosure.

FIG. 5E is a graphical diagram illustrating a cross-sectional view of an integrated voltmeter device housing according to an embodiment of the present disclosure. As shown in FIG. 5E, a male device mating housing 510 may include two device mating terminal channels 514, each for partially enclosing a device pin connector terminal (not shown). As discussed above, each pin terminal channel 514 may operate to partially enclose a device pin connector terminal inserted through at least a portion of the pin terminal channel 520, such that a portion of the device pin connector terminal inserted through the pin terminal channel 520 may extend into the male device mating housing 510. In the embodiment described with reference to FIG. 5E, such a device pin connector terminal may insert through each pin terminal channel 520, and extend partially into each device mating terminal channel 514. Each device mating terminal channel 514 in an embodiment may have a width $X_{514}$, which may be equivalent to or greater than the width of the battery pin connector type terminal structures of a female battery terminal housing with which the male device mating housing 510 may mate. Further, each device mating terminal channel 514 in an embodiment may have an interior vertical wall located a horizontal distance $X_{524}$ away from the nearest external wall of the male device mating housing 510, which may be equivalent to or greater than the horizontal distance between one of the exterior vertical walls of each battery pin connector type terminal structure and the external wall of the female battery terminal housing nearest to it.

As described above, some embodiments of the present disclosure may include a female mating housing and allow for insertion of device socket connector terminals within the voltmeter device housing, as described above. Other embodiments of the present disclosure may include a male mating housing and allow for insertion of device pin connector terminals within the voltmeter device housing, as shown in FIG. 5E. As discussed above, the terminal housing may include terminal insulating channels that may take many shapes. As described above, in embodiments including a female mating housing, the terminal insulating channels may incorporate a combination of wire channels, socket terminal locking channels, and socket terminal channels. In embodiments including a male device mating housing 510, as shown in FIG. 5E, the terminal insulating channels may incorporate a combination of wire channels 516, pin terminal locking channels 518, and pin terminal channels 520. Each of the pin terminal locking channels 518 and pin terminal channels 520, as shown in FIG. 5E may operate to partially enclose a device pin connector terminal.

In such an embodiment, a device pin connector terminal may be operatively connected to an electrically conductive wire and inserted through the voltmeter terminal opening, wire channel 516, the pin terminal locking channel 518, and at least partially into a pin terminal channel 520 such that a portion of the device pin connector terminal remains within the pin terminal locking channel 518 and a portion of the device pin connector terminal extends beyond the pin terminal locking channel 518 and into the male device mating housing 510. Another device pin connector terminal and operatively connected electrically conductive wire may be inserted in a similar way into another or the same voltmeter terminal opening, and through a separate wire channel 516, pin terminal locking channel 518, and pin terminal channel 520 in an embodiment. The wire channel 516, pin terminal locking channel 518, and pin terminal channel 520 in an embodiment may be enclosed by electrically insulating material so as to disallow electrically conductive contact to be made between each of the device pin connector terminals, between each of the electrically conductive wires, or between any device pin connector terminal and any electrically conductive wire not operatively connected to that device pin connector terminal prior to insertion of the terminals and wires into the voltmeter device housing.

Each pin terminal channel 520 in an embodiment may have a width $X_{520}$ which may be equivalent to or greater than the width of the pin mating channel of the device pin connector terminal (not shown) which may be inserted within the pin terminal channel 520, but less than the width of the first pin crimping channel of the device pin connector terminal (not shown), as described in greater detail below. In such an embodiment, the width of the pin terminal channel 520 being smaller than the width of the first pin crimping channel (not shown) may operate to inhibit movement of the leading edge of the first pin crimping channel (not shown) beyond the pin terminal locking channel 518, as described in greater detail below.

In an embodiment, the pin terminal locking channels 518 in an embodiment may have a width $X_{518}$ which may be greater than the width of the first pin crimping channel of a device pin connector terminal, as described in greater detail below. Each pin terminal locking channel 518 in an embodiment may share a horizontal mid-line with the pin terminal channel 520 to which it is directly adjacent.

In an embodiment, the wire channels 516 may have a width $X_{516}$ which may be greater than the width of the second pin crimping channel (not shown) of the device pin connector terminal (not shown), as described in greater detail below. The dimensions of the wire channel 516 in an embodiment may vary based upon the type of device pin connector terminals used, and the length of the electrically conductive wires used. The wire channels 516 in an embodiment may have any dimensions so long as three conditions are met. First, the wire channels 516 in an embodiment may remain enclosed within the terminal housing. Second, each wire channel 516 in an embodiment may have sufficient volume to house the second pin crimping channel of a device pin connector terminal, and an electrically conductive wire operatively connected to the device pin connector terminal. Third, the wire channels 516 of an embodiment may operate to disallow electrically conductive contact to be made between each of the device pin connector terminals, between each of the electrically conductive wires, or between any device pin connector terminal and any electrically conductive wire not operatively connected to that device pin connector terminal prior to insertion of the terminals and wires into the voltmeter device housing. Each wire channel 516 in an embodiment may share a horizontal mid-line with the pin terminal locking channel 518 to which it is directly adjacent.

FIG. 5F

Figure 5F:
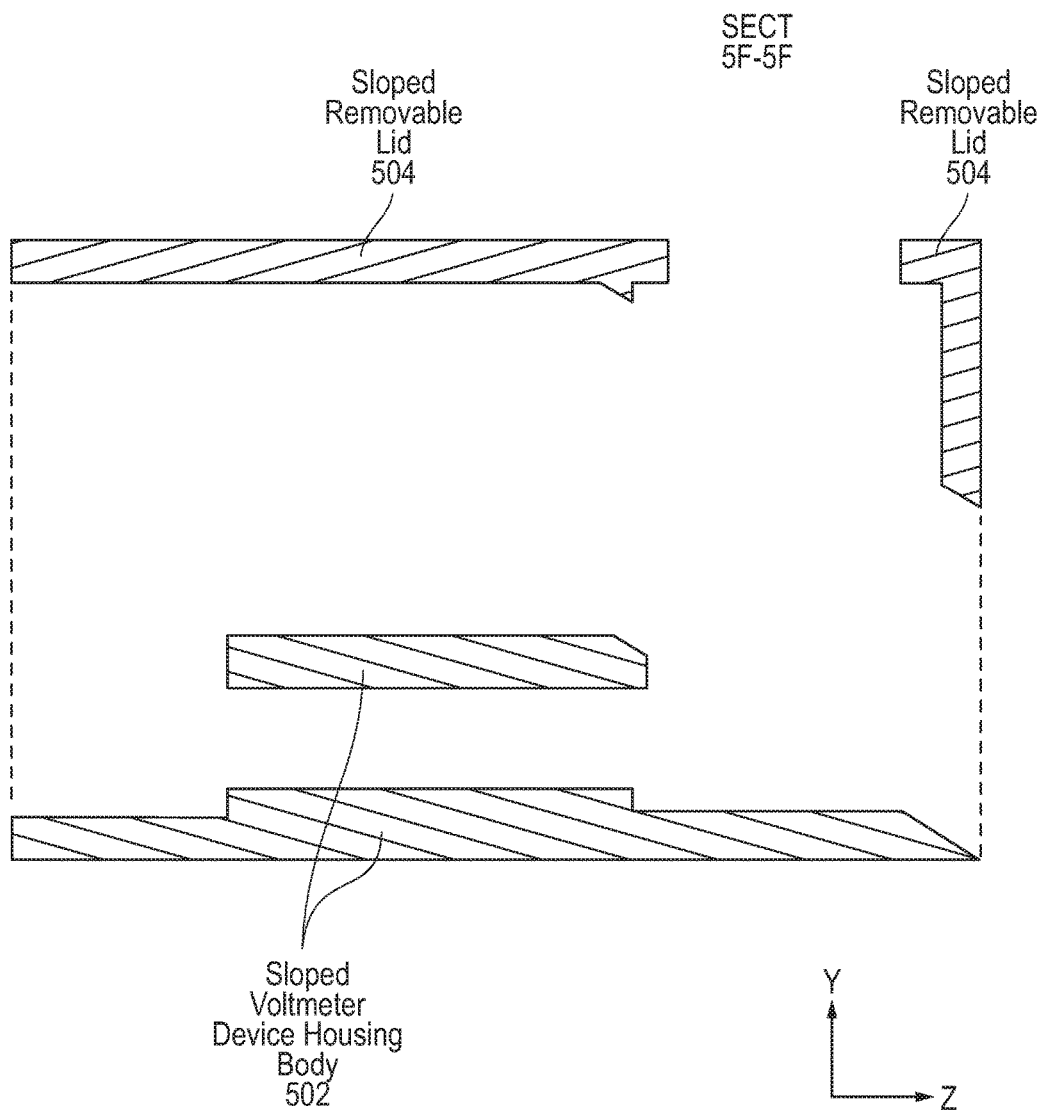
FIG. 5F is a graphical diagram illustrating an exploded, cross-sectional view of an integrated voltmeter device housing according to an embodiment of the present disclosure.

FIG. 5F is a graphical diagram illustrating an exploded, cross-sectional view of an integrated voltmeter device housing according to an embodiment of the present disclosure. As described above, the voltmeter device housing in an embodiment may be separated into a voltmeter device housing body and a removable lid in any number of ways so long as the voltmeter device housing body and removable lid maintain structural integrity upon fabrication, such that an opening in the upper surface of the voltmeter device housing body is formed to allow for insertion of two or more pin connector type terminals, two or more electrically conductive wires, a voltmeter microchip, and a voltmeter digital display within the voltmeter device housing body, and such that the removable lid may adhere to the voltmeter device housing body so as to enclose the inserted two or more pin connector type terminals, two or more electrically conductive wires, voltmeter microchip and voltmeter digital display. For example, and as shown in FIG. 5F, the voltmeter device housing in an embodiment may be separated into a sloped voltmeter device housing body 502 and a sloped removable lid 504. Separating a voltmeter device housing into a sloped voltmeter device housing body 502 and a sloped removable lid 504 may operate to ease the insertion of the two or more pin connector type terminals, two or more electrically conductive wires, voltmeter microchip, and voltmeter digital display within the sloped voltmeter device housing body 502. In such an embodiment, as shown in FIG. 5F, the voltmeter device housing may be separated such that the front exterior wall of the voltmeter device housing is incorporated into the sloped removable lid 504, rather than the sloped voltmeter device housing body 502. Such a separation may operate to make the voltmeter terminal openings into which the two or more pin connector type terminals, two or more electrically conductive wires, voltmeter microchip, and voltmeter digital display will be inserted more easily viewable.

FIG. 5G

Figure 5G:
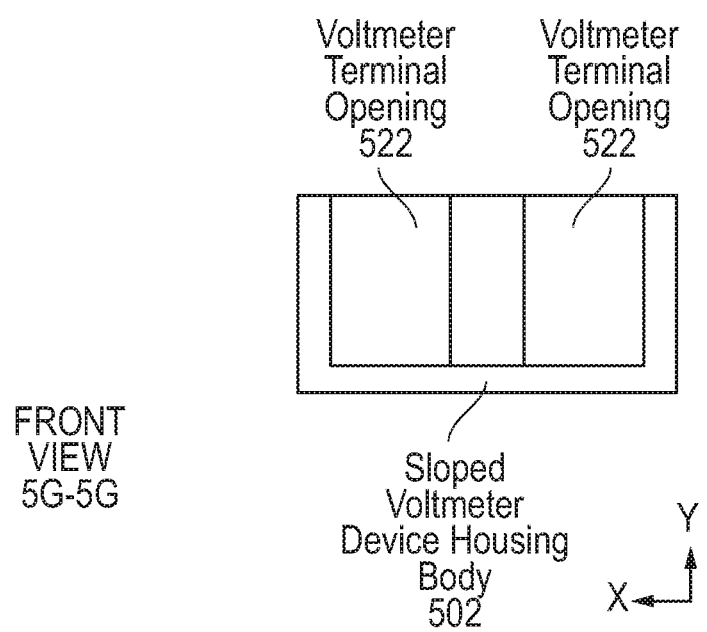
FIG. 5G is a graphical diagram illustrating a front partial view of an integrated voltmeter device housing according to an embodiment of the present disclosure.

FIG. 5G is a graphical diagram illustrating a front partial view of an integrated voltmeter device housing according to an embodiment of the present disclosure. More specifically, FIG. 5G depicts a front view of a sloped voltmeter device housing body in an embodiment. As described directly above, separating a voltmeter device housing into a sloped voltmeter device housing body 502 and a sloped removable lid (not shown) may operate to ease the insertion of the two or more pin connector type terminals, two or more electrically conductive wires, voltmeter microchip, and voltmeter digital display into the voltmeter terminal openings 522 within the sloped voltmeter device housing body 502. In such an embodiment, the voltmeter device housing may be separated such that the front exterior wall of the voltmeter device housing is incorporated into the sloped removable lid, rather than the sloped voltmeter device housing body 502. Such a separation may operate to make the voltmeter terminal openings 522 into which the two or more pin connector type terminals, two or more electrically conductive wires, voltmeter microchip, and voltmeter digital display will be inserted more easily viewable from the front of the sloped voltmeter device housing body 502.

FIG. 6

Figure 6:
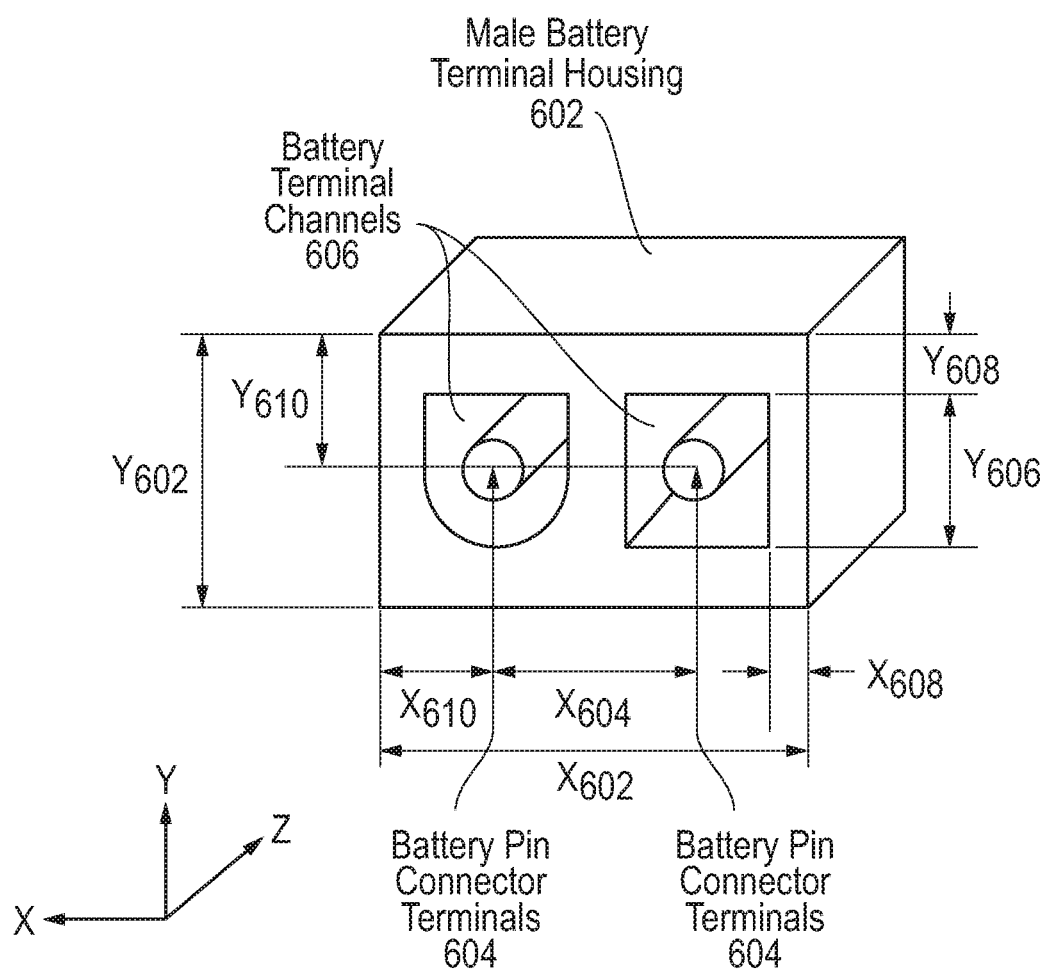
FIG. 6 is a graphical diagram illustrating a male battery terminal housing according to an embodiment of the present disclosure.

FIG. 6 is a graphical diagram illustrating a male battery terminal housing according to an embodiment of the present disclosure. As described above, a device mating housing may be female, male, or may incorporate aspects of both genders. A female device mating housing in an embodiment may be a device mating housing for mating with the voltmeter device housing with a DC battery having a male battery terminal housing comprising two or more battery pin connector terminals. The male battery terminal housing in such an embodiment may operate to insert partially within the female device mating housing. The male battery terminal housing 602 in an embodiment may have a horizontal width $X_{602}$ that may be equivalent to or lesser than the interior horizontal width of the female device mating housing with which it may mate. The male battery terminal housing 602 in an embodiment may also have a vertical height $Y_{602}$ that may be equivalent to or lesser than the interior vertical height of the female device mating housing with which it may mate.

As shown in FIG. 6, a male battery terminal housing 602 may comprise two or more battery pin (male) connector terminals 604. The battery pin connector terminals 604 may function by inserting within a device socket (female) connector terminal (not shown) so as to form an electrically conductive contact between the battery pin (male) connector terminal 604 and the device socket (female) connector terminal (not shown), as described in greater detail above.

In an embodiment, the battery pin (male) connector terminals 604 may each be disposed within a male battery terminal housing 602 such that the radial centers of the battery pin connector terminals 604 may be located a horizontal distance $X_{604}$ apart from one another. Further, each battery pin connector terminal 604 may be located a horizontal distance $X_{610}$ from a nearest outer vertical wall of the male battery terminal housing 602. The radial centers of the battery pin (male) connector terminals 604 in an embodiment may also be located a vertical distance $Y_{610}$ from the upper exterior horizontal wall of the male battery terminal housing 602. In other embodiments, the battery pin connector terminals 602 may number more than two, and may have any orientation with respect to one another, so long as each battery pin connector terminal 604 is enclosed on one all radial sides by the male battery terminal housing 602.

As described above, a female device mating housing in an embodiment may further comprise each of the device socket connector terminals being disposed throughout the length of a device mating terminal structure. For example, the female device mating housing may further comprise each of the device socket terminals being disposed within a device socket terminal channel, and each of the device socket terminal channels being disposed within and throughout a device mating terminal structure. The horizontal center points of each device socket terminal channel in such an embodiment, and thus, the horizontal center points of each device socket terminal housed within a device socket terminal channel may lie a distance apart that is equivalent to the distance between the center midpoints of the battery pin connector terminals 604 housed within the male battery terminal housing 602 with which the female device mating housing may mate.

As shown in FIG. 6, the battery pin connector terminals 604 of a male battery terminal housing 602 may each be disposed within a battery terminal channel 606. The battery terminal channels 606 in an embodiment may take any shape and have any orientation with respect to one another so long as both are disposed within the exterior walls of the male battery terminal housing 602, and a battery pin connector terminal 604 may be disposed within the interior of each battery terminal channel 606. As an example, and as shown in FIG. 6, one battery terminal channel may be rectangular, and one may be u-shaped. The battery terminal channels 606 in an embodiment may have a width $X_{606}$ and a height $Y_{606}$. Each battery terminal channel 606 in an embodiment may be disposed such that its interior vertical wall closest to an exterior vertical wall of the male battery terminal housing 602 lies a horizontal distance $X_{608}$ from the nearest exterior vertical wall of the male battery terminal housing 602 and such that its interior ceiling lies a vertical distance $Y_{608}$ from the exterior ceiling of the male battery terminal housing 602.

As described above, each device mating terminal structure of a female device mating housing in an embodiment may operate to insert into a male battery terminal channel 606 upon insertion of the male battery terminal housing 602 within the female device mating housing (not shown), so as to allow electrically conductive contact to be made between each battery pin connector terminal 604 and each device socket connector terminal disposed within a device socket terminal channel (not shown). Each device mating terminal structure (not shown) in an embodiment may have a width that may be equivalent to or less than the width $X_{606}$ of each battery terminal channel 606 of the male battery terminal housing 602. The device mating terminal structures (not shown) in an embodiment may each have a height that may be equivalent to or less than the height $Y_{606}$ of each battery terminal channel 606 of the male battery terminal housing 602. This is only one example embodiment and is meant to be descriptive, rather than restrictive of the scope of this disclosure. In other embodiments, the battery terminal channels may take any cross-sectional shape or orientation with respect to one another within the exterior walls of the male battery terminal housing, and may have differing widths, heights, or radii with respect to one another.

Further, the shape and orientation of the device terminal mating structures in an embodiment may mirror the shape and orientation of the battery terminal channels 606 of the male battery terminal housing 602, as described in greater detail above. For example, the male battery terminal housing 602 in an embodiment may comprise a u-shaped battery terminal channel having a left interior vertical wall located a horizontal distance $X_{608}$ away from the right-most exterior vertical wall of the male battery terminal housing 602. The female device mating housing that may mate with the male battery terminal housing 602 in such an embodiment may comprise a u-shaped device mating terminal structure having a right-most exterior vertical wall located the same horizontal distance away from the right-most interior vertical wall of the female device mating housing, operating to allow for insertion of the u-shaped device mating terminal structure within the u-shaped battery terminal channel. Each of the device mating terminal structures may be located such that each of their top exterior walls is located a vertical distance from the interior ceiling of the female device mating housing that may be equivalent to or greater than the vertical distance $Y_{608}$ between the interior ceilings of each of the battery terminal channels 606 and the exterior top wall of the male battery terminal housing 602, as described in greater detail below.

FIG. 7

Figure 7:
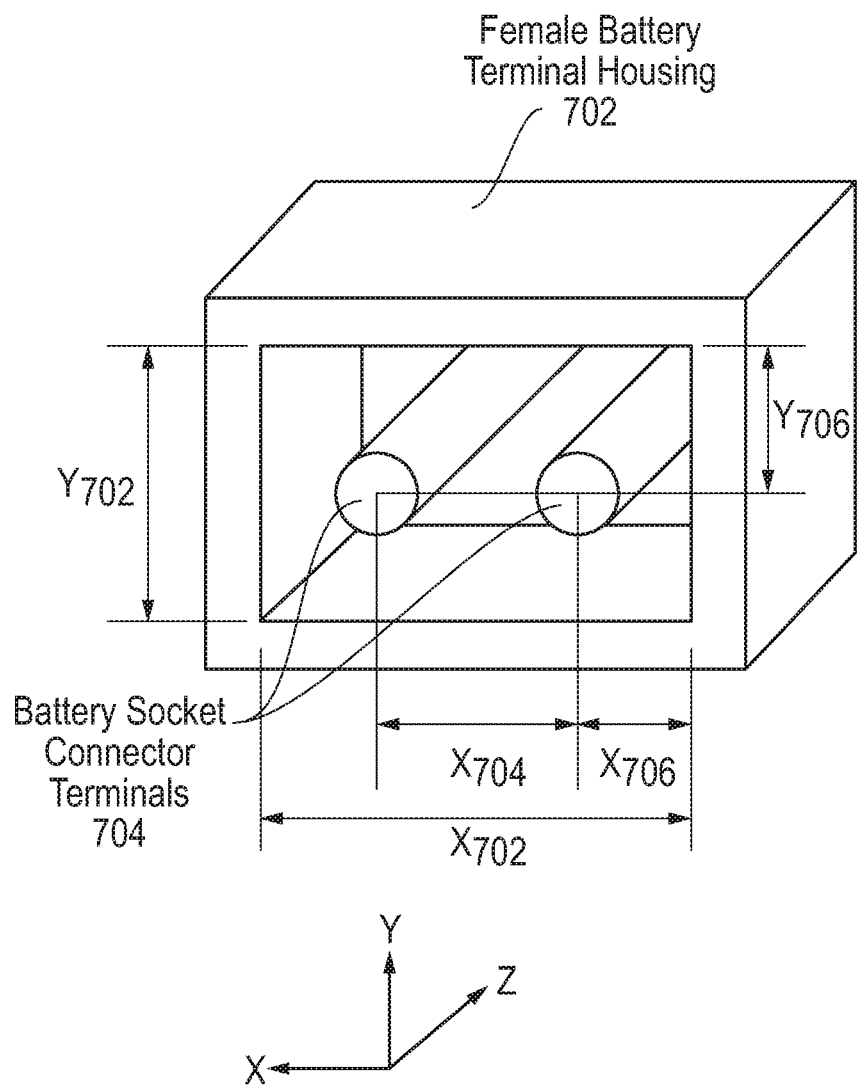
FIG. 7 is a graphical diagram illustrating a female battery terminal housing according to an embodiment of the present disclosure.

FIG. 7 is a graphical diagram illustrating a female battery terminal housing according to an embodiment of the present disclosure. As discussed above, a device mating housing may be female, male, or may incorporate aspects of both genders. A male device mating housing in an embodiment may be a device mating housing for mating the voltmeter device housing with a DC battery having a female battery terminal housing comprising two or more battery socket connector terminals. As shown in FIG. 7, a female battery terminal housing 702 may comprise one or more exterior walls functioning to enclose two or more battery socket (female) connector terminals 704, and to allow for insertion of a male device mating housing (not shown) within the one or more exterior walls of the female battery terminal housing 702. For example and as described above, as shown in FIG. 7, the male device mating housing (not shown) may have an exterior width that may be equivalent to the horizontal distance $X_{702}$ between the interior walls of the female battery terminal housing 702, and may have an exterior height that may be equivalent to the vertical distance $Y_{702}$ between the interior floor and ceiling of the female battery terminal housing 702. As described above, each battery socket (female) connector terminal 704 in an embodiment may operate to allow for insertion of a device pin (male) connector terminal (not shown) within itself so as to form an electrically conductive contact between each battery socket (female) connector terminal 704 and one device pin (male) connector terminal (not shown).

As described above, the radial centers of the device pin connector terminals (not shown) in an embodiment may also be spaced a horizontal distance apart from one another that may be equivalent to the horizontal distance $X_{704}$ between the radial centers of the battery socket connector terminals 704 housed within the battery terminal housing 702. As also described above, each device pin connector terminal (not shown) in an embodiment may also be placed such that their radial centers lie a horizontal distance apart from a nearest exterior vertical wall of the male device mating housing (not shown) that may be equivalent to the horizontal distance $X_{706}$ between the radial centers of each battery socket connector terminal 704 and a nearest vertical interior wall of the female battery terminal housing 702. As further explained above, each device pin connector terminal (not shown) of a male device mating housing (not shown) may also be placed such that its radial center lies a vertical distance apart from the exterior ceiling of the male device mating housing (not shown) that may be equivalent to the vertical distance $Y_{706}$ between the radial center of each battery socket connector terminal 704 and the interior ceiling of the female battery terminal housing 702. In such a way, the male device mating housing in an embodiment may insert into the female battery terminal housing 702, allowing the battery socket connector terminals 704 to make electrically conductive contact with the device pin connector terminals of the male device mating housing.

FIG. 8A

Figure 8A:
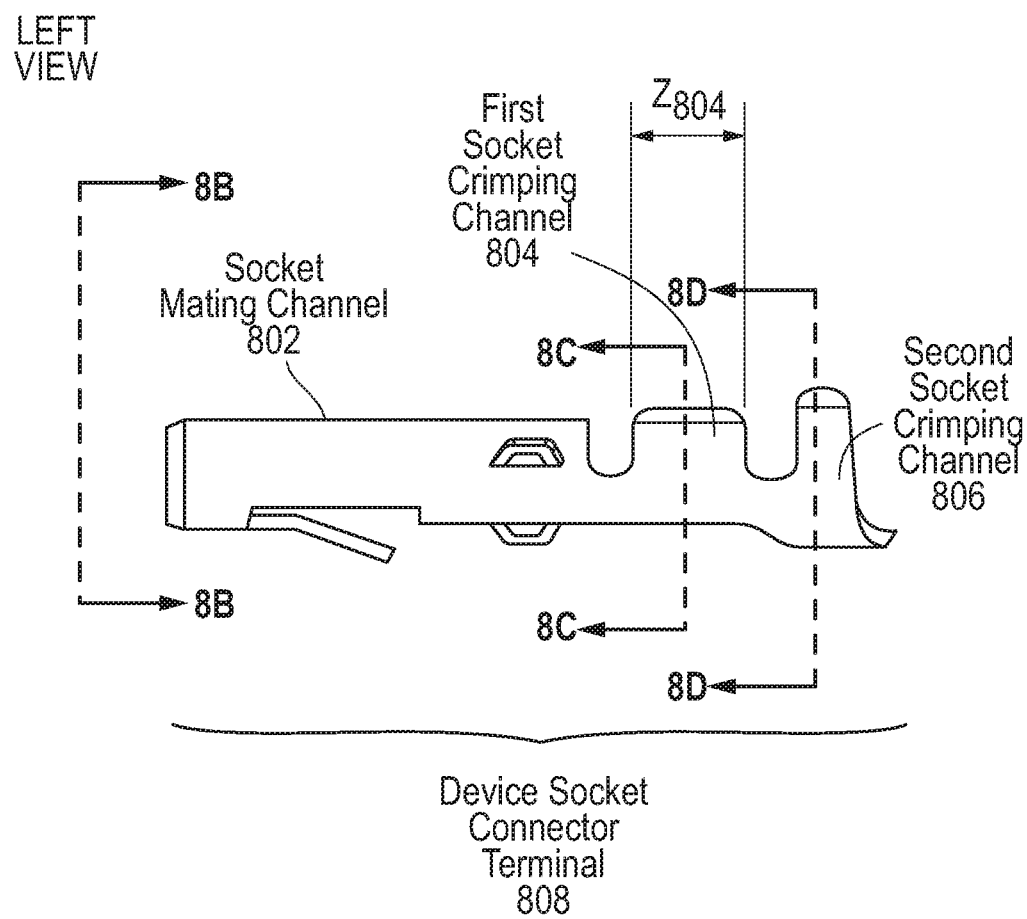
FIG. 8A is a graphical diagram illustrating a device socket connector terminal according to an embodiment of the present disclosure.

FIG. 8A is a graphical diagram illustrating a device socket connector terminal according to an embodiment of the present disclosure. As shown in FIG. 8A, a device socket connector terminal 808 in an embodiment may comprise a socket mating channel 802, a first socket crimping channel 804, and a second socket crimping channel 806. The socket mating channel 802 of an embodiment may operate to make electrically conductive contact with a male pin mating channel inserted into the socket mating channel 802. The first socket crimping channel 804 of an embodiment may operate to inhibit movement of the first socket crimping channel 804 toward the mating channel, beyond a specified point, as described in greater detail above, and may have a length $Z_{804}$. The first and second socket crimping channels 804 and 806, respectively, of an embodiment may both function to make electrically conductive contact with the socket mating channel 802 and an electrically conductive wire inserted through the second socket crimping channel 806 and into the first socket crimping channel 804.

FIG. 8B

Figure 8B:
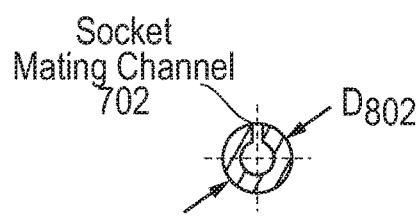
FIG. 8B is a graphical diagram illustrating a front view of a device socket connector terminal according to an embodiment of the present disclosure.

FIG. 8B is a graphical diagram illustrating a front view of a device socket connector terminal according to an embodiment of the present disclosure. As described above, the socket mating channel 802 of an embodiment may operate to make electrically conductive contact with a male pin mating channel inserted into the socket mating channel 802. The socket mating channel 802 of an embodiment may have a diameter $D_{802}$ measuring less than the width of the first socket crimping channel (not shown) and the width of the second socket crimping channel (not shown), as described below.

FIG. 8C

Figure 8C:
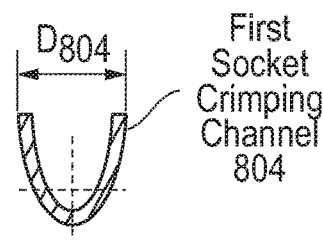
FIG. 8C is a graphical diagram illustrating a cross-sectional view of a device socket connector terminal according to an embodiment of the present disclosure.

FIG. 8C is a graphical diagram illustrating a cross-sectional view of a device socket connector terminal according to an embodiment of the present disclosure. As described above, the first socket crimping channel 804 of an embodiment may operate to inhibit movement of the first socket crimping channel 804 toward the mating channel of a female device mating housing, beyond a specified point, as described in greater detail above. As also described above, the first socket crimping channel 804 of an embodiment may function to make electrically conductive contact with both the socket mating channel (not shown) and an electrically conductive wire (not shown) inserted through the second socket crimping channel (not shown) and into the first socket crimping channel 804. The first socket crimping channel 804 may have a diameter $D_{804}$ that may be larger than the diameter of the socket mating channel (not shown), but smaller than the diameter of the second socket crimping channel (not shown), as described above and below.

FIG. 8D

Figure 8D:
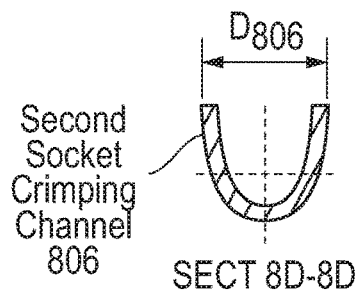
FIG. 8D is a graphical diagram illustrating a cross-sectional view of a device socket connector terminal according to an embodiment of the present disclosure.

FIG. 8D is a graphical diagram illustrating a cross-sectional view of a device socket connector terminal according to an embodiment of the present disclosure. As described above, the second socket crimping channel 806 of an embodiment may operate to make electrically conductive contact with both the first socket crimping channel (not shown) and an electrically conductive wire (not shown) inserted through the second socket crimping channel 806 and into the first socket crimping channel (not shown). The second socket crimping channel 806 may have a diameter $D_{806}$ that may be larger than the diameter of the socket mating channel (not shown) and the diameter of the first socket crimping channel (not shown), as described above.

FIG. 9A

Figure 9A:
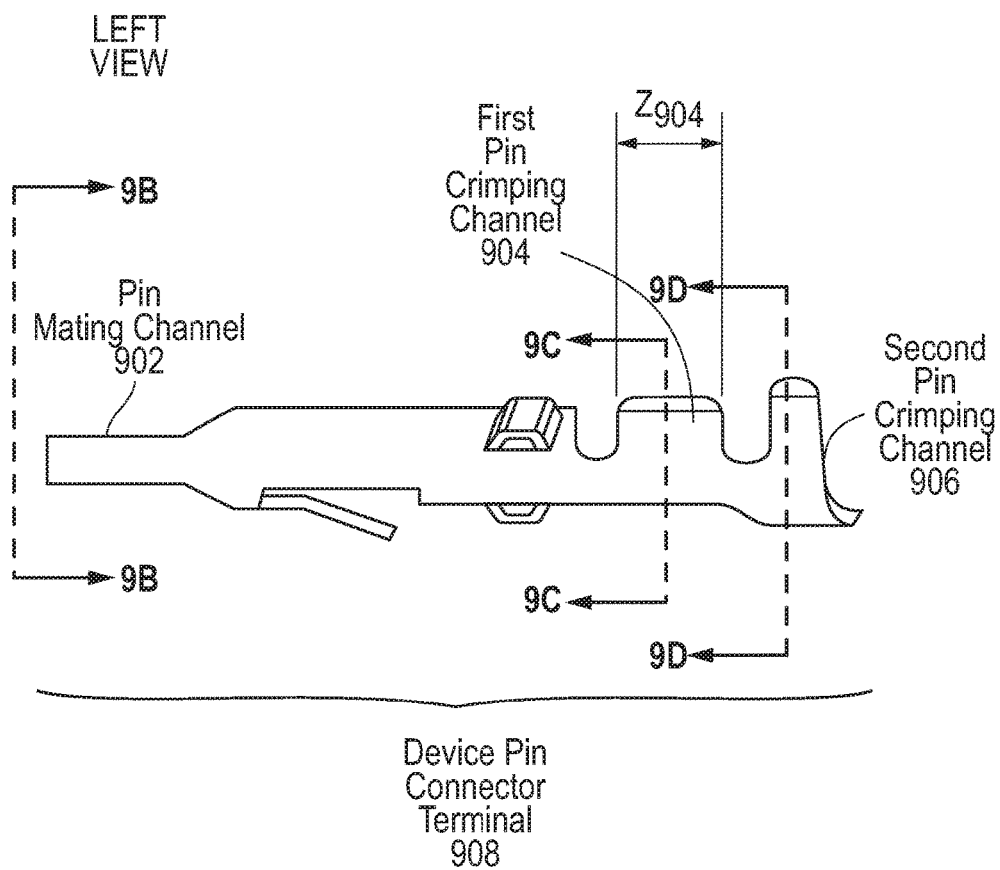
FIG. 9A is a graphical diagram illustrating a device pin connector terminal according to an embodiment of the present disclosure.

FIG. 9A is a graphical diagram illustrating a device pin connector terminal according to an embodiment of the present disclosure. As shown in FIG. 9A, a device pin connector terminal 908 in an embodiment may comprise a pin mating channel 902, a first pin crimping channel 904, and a second pin crimping channel 906. The pin mating channel 902 of an embodiment may operate to make electrically conductive contact with a female socket mating channel into which the pin mating channel 902 may be inserted. The first pin crimping channel 904 of an embodiment may operate to inhibit movement of the first pin crimping channel 904 toward the mating channel, beyond a specified point, as described in greater detail above, and may have a length $Z_{904}$. The first and second pin crimping channels 904 and 906, respectively, of an embodiment may both function to make electrically conductive contact with the pin mating channel 902 and an electrically conductive wire inserted through the second pin crimping channel 906 and into the first pin crimping channel 904.

FIG. 9B

Figure 9B:
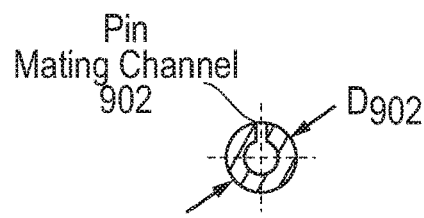
FIG. 9B is a graphical diagram illustrating a front view of a device pin connector terminal according to an embodiment of the present disclosure.

FIG. 9B is a graphical diagram illustrating a front view of a device pin connector terminal according to an embodiment of the present disclosure. As described above, the pin mating channel 902 of an embodiment may operate to make electrically conductive contact with a female socket mating channel into which the pin mating channel 902 may be inserted. The pin mating channel 902 of an embodiment may have a diameter $D_{902}$ measuring less than the width of the first pin crimping channel (not shown) and the width of the second pin crimping channel (not shown), as described below.

FIG. 9C

Figure 9C:
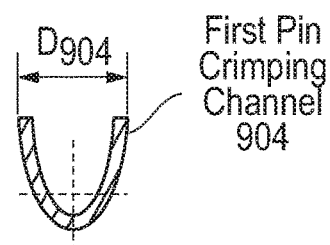
FIG. 9C is a graphical diagram illustrating a cross-sectional view of a device pin connector terminal according to an embodiment of the present disclosure.

FIG. 9C is a graphical diagram illustrating a cross-sectional view of a device pin connector terminal according to an embodiment of the present disclosure. As described above, the first pin crimping channel 904 of an embodiment may operate to inhibit movement of the first pin crimping channel 904 toward the mating channel of a male device mating housing, beyond a specified point, as described in greater detail above. As also described above, the first pin crimping channel 904 of an embodiment may function to make electrically conductive contact with both the pin mating channel (not shown) and an electrically conductive wire (not shown) inserted through the second pin crimping channel (not shown) and into the first pin crimping channel 904. The first pin crimping channel 904 may have a diameter $D_{904}$ that may be larger than the diameter of the pin mating channel (not shown), but smaller than the diameter of the second pin crimping channel (not shown), as described above and below.

FIG. 9D

Figure 9D:
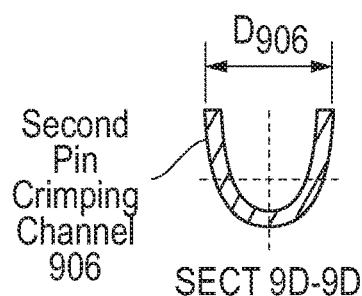
FIG. 9D is a graphical diagram illustrating a cross-sectional view of a device pin connector terminal according to an embodiment of the present disclosure.

FIG. 9D is a graphical diagram illustrating a cross-sectional view of a device pin connector terminal according to an embodiment of the present disclosure. As described above, the second pin crimping channel 906 of an embodiment may operate to make electrically conductive contact with both the first pin crimping channel (not shown) and an electrically conductive wire (not shown) inserted through the second pin crimping channel 906 and into the first pin crimping channel (not shown). The second pin crimping channel 906 may have a diameter $D_{906}$ that may be larger than the diameter of the pin mating channel (not shown) and the diameter of the first pin crimping channel (not shown), as described above.

FIG. 10

Figure 10:
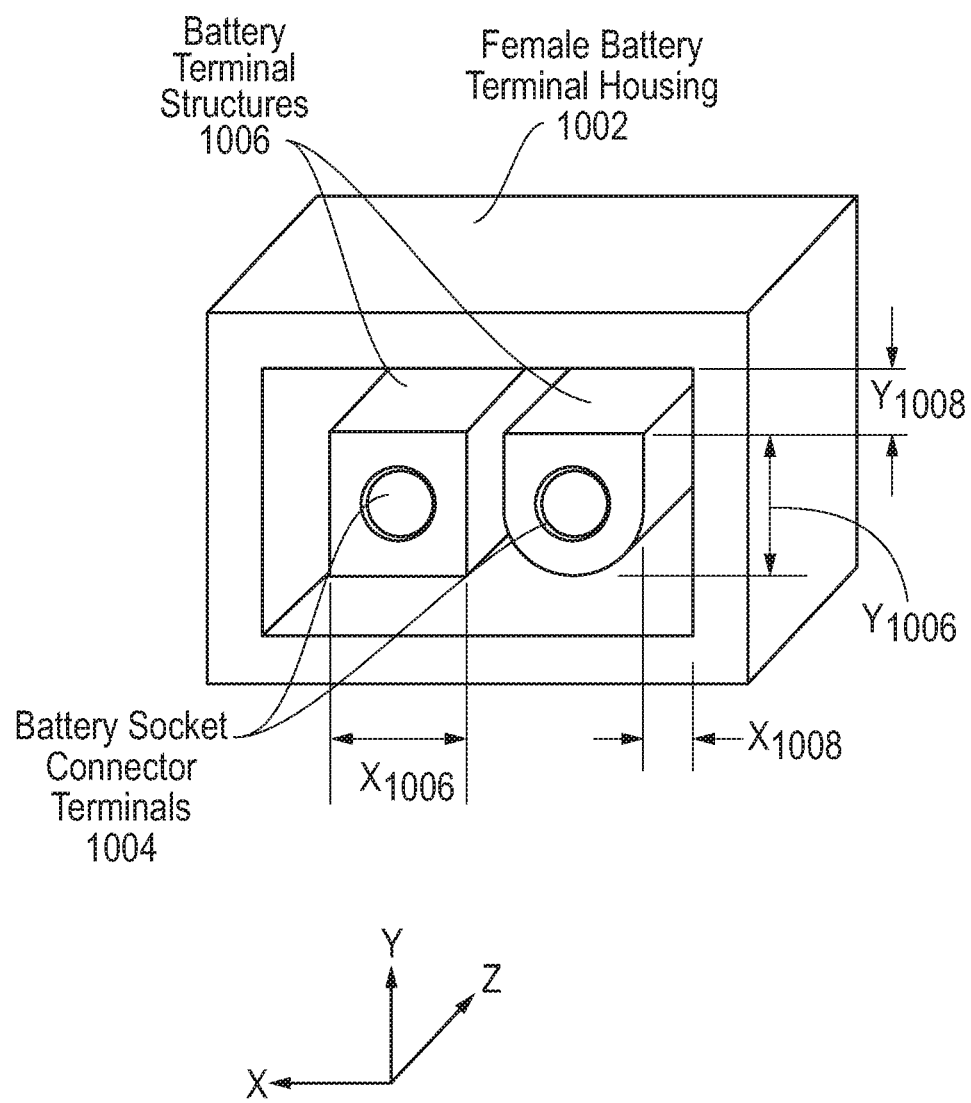
FIG. 10 is a graphical diagram illustrating a female battery terminal housing according to an embodiment of the present disclosure.

FIG. 10 is a graphical diagram illustrating a female battery terminal housing according to an embodiment of the present disclosure. As described above, a female battery terminal housing may further comprise each of the battery socket terminals being disposed throughout the length of a battery mating terminal structure. For example, and as shown in FIG. 10, the female battery terminal housing 1002 in an embodiment may further comprise each of the battery socket connector terminals 1004 being disposed throughout the length of a battery mating terminal structure 1006. In an embodiment in which the female battery terminal housing 1002 with which a male device mating housing is intended to mate includes battery terminal structures 1006, the male device mating housing (not shown) may further comprise two device mating terminal channels, as described above. As described above, each device mating terminal channel (not shown) of a male device mating housing in an embodiment may operate to partially enclose the battery terminal structures 1006 of the female battery terminal housing 1002 upon insertion of the male device mating housing (not shown) into the female battery terminal housing 1002, so as to allow electrically conductive contact to be made between each device pin connector terminal (not shown) and each battery socket connector terminal 1004. As also described above, the device mating terminal channels (not shown) of a male device mating housing in an embodiment may each have a width that is equivalent to or greater than the width X1006 of each of the battery terminal structures 1006 of the female battery terminal housing 1002. As further described above, the device mating terminal channels (not shown) of a male device mating housing in an embodiment may both have a height that may be equivalent to or greater than the height Y1006 of each of the battery terminal structures 1006 of the female battery terminal housing 1002.

As also described above, the shape and orientation of the device mating terminal channels (not shown) of a male device mating housing in an embodiment may mirror the shape and orientation of the battery terminal structures 1006 of the female battery terminal housing 1002. For example and as shown in FIG. 10, the female battery terminal housing 1002 in one embodiment may have a rectangular extrusion shaped battery terminal structure, and a u-shaped extrusion battery terminal structure. In such an embodiment, as described above, the male device mating housing (not shown) may comprise a u-shaped device mating terminal channel, the left-most interior wall of the u-shaped device mating terminal channel being located a distance away from the left-most exterior wall of the male device mating housing (not shown) that may be equivalent to the distance $X_{1008}$ between the u-shaped battery terminal structure of the female battery terminal housing 1002 and the right-most interior wall of the female battery terminal housing 1002. As similarly described above, in such an embodiment, the male device mating housing (not shown) may comprise a u-shaped device mating terminal channel, the interior ceiling of the u-shaped device mating terminal channel being located a distance away from the top exterior wall of the male device mating housing (not shown) that may be equivalent to the distance $Y_{1008}$ between the top of the u-shaped battery terminal structure of the female battery terminal housing 1002 and the interior ceiling of the female battery terminal housing 1002. In such a way, and as described above, the shape and orientation of the device mating terminal channels (not shown) in an embodiment may mirror the shape and orientation of the battery terminal structures 1006 of the female battery terminal housing 1002. Further example embodiments may include battery terminal structures having different dimensions, shapes, and/or orientations within the female battery terminal housing 1002 with respect to one another, as well as battery terminal structures 1006 having the same shape (e.g. two rectangular device mating terminal channels).

FIG. 11

Figure 11:
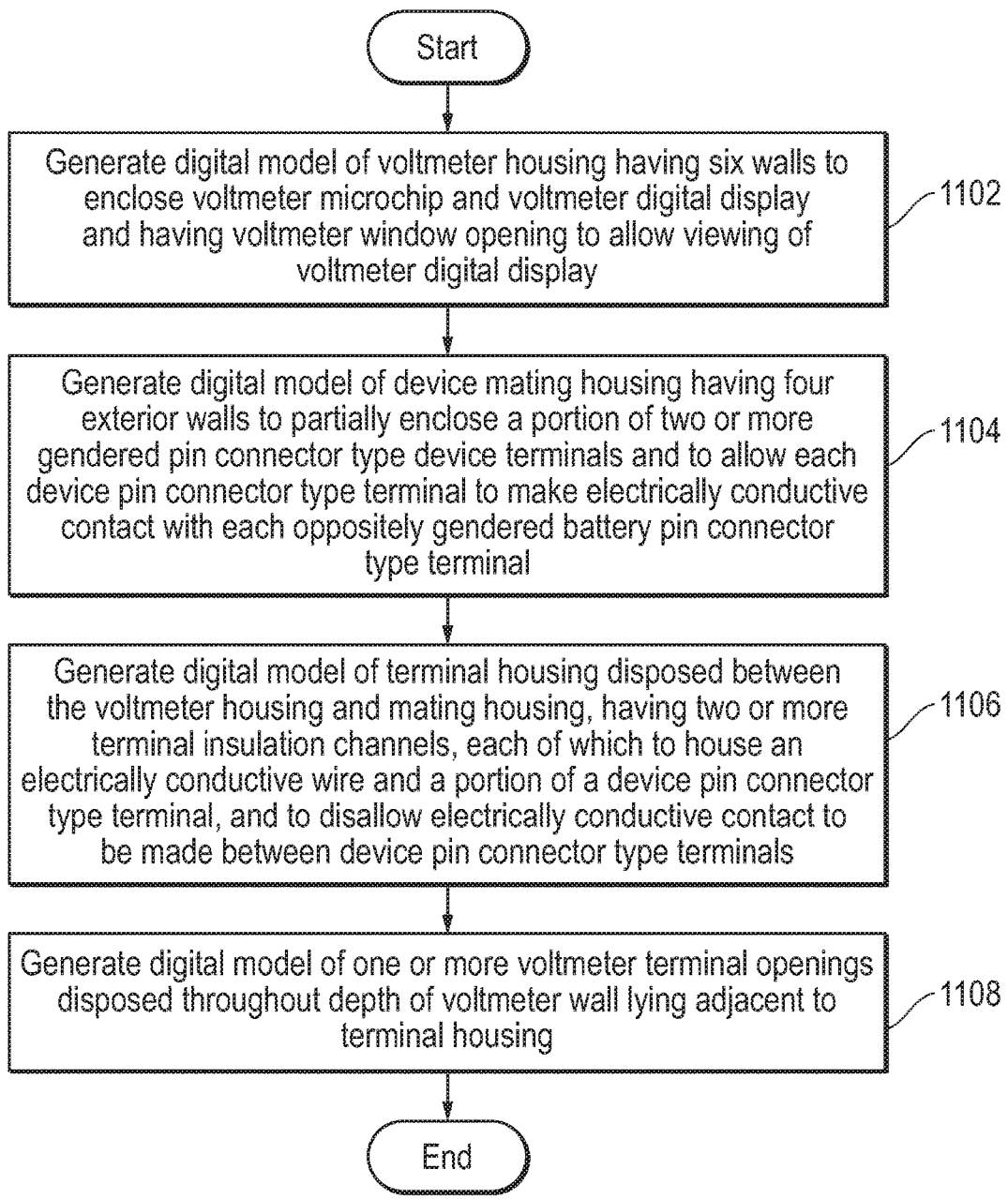
FIG. 11 is a flow-diagram illustrating a method of generating a digital model of a voltmeter housing, a mating housing, and a terminal housing according to an embodiment of the present disclosure.

FIG. 11 is a flow-diagram illustrating a method of generating a digital model of a voltmeter housing, a mating housing, and a terminal housing according to an embodiment of the present disclosure. The method may include one or more of generating a digital model of a voltmeter housing, generating a digital model of a mating housing, generating a digital model of a terminal housing, and generating a digital model of one or more voltmeter terminal openings.

At block 1102 in an embodiment, a digital model of a voltmeter housing may be generated. A voltmeter housing in an embodiment may have one or more walls to enclose a voltmeter microchip and a digital display, and may have a viewing window opening to allow viewing of the voltmeter digital display. For example, in the embodiment described with reference to FIG. 2D, the voltmeter housing 201 may have six walls to enclose a voltmeter microchip and a digital display having a width equivalent to or less than $X_{201}$, a combined height equivalent to or less than $Y_{201}$, and a depth equivalent to or less than $Z_{201}$. As another example, the voltmeter housing may have a voltmeter viewing window 219 to allow for viewing of the voltmeter digital display. The voltmeter viewing window 219 may have a width $X_{219}$ which may be less than the width of the voltmeter digital display, but wide enough that the voltmeter housing 201 does not impair a user's ability to read the voltmeter digital display. The voltmeter viewing window 219 may also have a depth $Z_{219}$ which may be less than the depth of the voltmeter digital display, but deep enough that the voltmeter housing 201 does not impair a user's ability to read the voltmeter digital display.

At block 1104, in an embodiment, a digital model of a device mating housing may be generated. A device mating housing in an embodiment may have four exterior walls to partially enclose a portion of two or more gendered device connector terminals and to allow each gendered device connector terminal to make electrically conductive contact with an oppositely gendered connector terminal of the battery of which the user wishes to know the remaining voltage. A device mating housing in an embodiment may be male, female, or may comprise aspects from both genders.

A female gendered device mating housing in an embodiment may have four exterior walls for partially enclosing a portion of two or more socket (female) device connector terminals, and for allowing each socket (female) connector terminal to make electrically conductive contact with each pin (male) battery connector terminal within a male battery terminal housing. For example, in the embodiment described with respect to FIG. 4C, the female device mating housing 406 in an embodiment may operate to partially enclose two or more device socket connector terminals (not shown). The device socket connector terminals (not shown) in such an embodiment may be partially enclosed within the female device mating housing 406 such that the four exterior walls of the female device mating housing 406 enclose the device socket connector terminals (not shown) for a portion of the device socket terminals' depth. In other words, a portion of the device socket connector terminals (not shown) may extend beyond the depth of the female device mating housing 406 in an embodiment.

As another example, in the embodiment described with respect to FIG. 2G, the female device mating housing 203 in an embodiment may operate to partially enclose two or more device socket connector terminals which may be disposed within the device socket terminal channels 207. The device socket connector terminals disposed within the device socket terminal channels 207 in such an embodiment may be partially enclosed within the female device mating housing 203 such that the four exterior walls of the female device mating housing 203 enclose the device socket connector terminals for a portion of the device socket terminals' depth. In other words, a portion of the device socket connector terminals disposed within the device socket terminal channels 207 may extend beyond the depth of the female device mating housing 203 in an embodiment.

The radial centers of the device socket connector terminals disposed within the device socket terminal channels 207 in such an embodiment may be spaced a horizontal distance X224 apart, which may be equivalent to the horizontal distance between the radial centers of the battery pin connector terminals. Each device socket connector terminal disposed within a device socket terminal channel 207 in such an embodiment may also be placed such that their radial centers lie a horizontal distance X223 apart from a nearest interior vertical wall of the female device mating housing 203. The horizontal distance X223 may be equivalent to the horizontal distance between the radial centers of each battery pin connector terminal and a nearest vertical exterior wall of the male battery terminal housing. Each device socket connector terminal disposed within a device socket terminal channel 207 in an embodiment may also be placed such that their radial centers lie a vertical distance Y223 apart from the interior ceiling of the female device mating housing 203. The vertical distance Y223 may be equivalent to the vertical distance between the radial centers of each battery pin connector terminal and the exterior ceiling of the male battery terminal housing. In such a way, the male battery terminal housing may insert into the female device mating housing 203, allowing each of the battery pin connector terminals to make electrically conductive contact with one of the device socket connector terminals disposed within a device socket terminal channel 207.

A male gendered device mating housing in an embodiment may have four exterior walls for partially enclosing a portion of two or more pin (male) device connector terminals, and for allowing each pin (male) connector terminal to make electrically conductive contact with each a socket (female) battery connector terminal within a female battery terminal housing. For example, in the embodiment described with respect to FIG. 5D, the male device mating housing 510 in an embodiment may operate to partially enclose two or more device pin (male) connector terminals 512. The device pin (male) connector terminals 512 in such an embodiment may be partially enclosed within the male device mating housing 510 such that the four exterior walls of the male device mating housing 510 enclose the device pin connector terminals 512 for a portion of the device pin terminals' 512 depth. In other words, a portion of the device pin connector terminals 512 in such an embodiment may extend beyond the depth of the male device mating housing 510 in an embodiment. The radial centers of the device pin connector terminals 512 in such an embodiment may be spaced a horizontal distance $X_{514}$ apart, which may be equivalent to the horizontal distance between the radial centers of the battery socket connector terminals. Each device pin connector terminal 512 in such an embodiment may also be placed such that their radial centers lie a horizontal distance $X_{522}$ apart from a nearest exterior vertical wall of the male device mating housing 510, wherein the horizontal distance $X_{522}$ may be equivalent to the horizontal distance $X_{522}$ between the radial centers of each battery socket connector terminal and a nearest vertical interior wall of the female battery terminal housing. In such a way, the male device mating housing 510 may insert into the female battery terminal housing, allowing each of the battery socket connector terminals to make electrically conductive contact with one of the device pin connector terminals 512.

At block 1106, in an embodiment, a digital model of a terminal housing may be generated. In an embodiment, a terminal housing may have two terminal insulation channels, each of which may operate to house an electrically conductive wire and a portion of a device pin connector type terminal operatively connected to the electrically conductive wire. In addition, each terminal insulation channel may operate to disallow electrically conductive contact to be made between each device connector terminal, between each electrically conductive wire, or between any electrically conductive wire and any device connector terminal to which the electrically conductive wire is not operatively connected prior to insertion of the electrically conductive wire and device connector terminal into the voltmeter device housing.

As an example, in the embodiment described with reference to FIG. 2E, the terminal housing 202 may have two terminal insulating channels 205, both of which operate to house an electrically conductive wire and a portion of a device connector terminal operatively connected to the electrically conductive wire. In addition, in the embodiment described with reference to FIG. 2E, each terminal insulating channel 205 may operate to disallow electrically conductive contact to be made between each device connector terminal, between each electrically conductive wire, or between any electrically conductive wire and any device connector terminal to which the electrically conductive wire is not operatively connected prior to insertion of the electrically conductive wires and device connector terminals into the voltmeter device housing.

The embodiment described with reference to FIG. 2E is only one example of the shape and/or form each terminal insulating channel 205 may take. Another embodiment may include terminal insulating channels, each comprising a combination of a wire channel, a terminal locking channel, and/or a portion of a mating terminal channel, as described in greater detail below.

At block 1108, in an embodiment, a digital model of one or more voltmeter terminal openings may be generated. A voltmeter terminal opening in an embodiment may be disposed throughout the depth of the wall of the voltmeter housing lying adjacent to the terminal housing, as to allow for insertion of each of the two or more device connector terminals and electrically conductive wires to which each is operatively connected through the voltmeter terminal opening(s) and into a terminal insulation channel. For example, in the embodiment described with respect to FIG. 2F, two voltmeter terminal openings 204 may be disposed throughout the depth of the wall of the voltmeter housing 201 lying adjacent to the terminal housing 202. Further, the voltmeter terminal openings 204 may each have a width X204 which may be equivalent to the width of the terminal insulating channels 205 at the front wall of the terminal housing 202 lying adjacent to the voltmeter housing 201. The voltmeter terminal openings 204 in an embodiment may also have a height Y204 which may be equivalent to the height of the terminal insulating channels 205 at the front wall of the terminal housing 202 lying adjacent to the voltmeter housing 201. Voltmeter terminal openings 204 in such an embodiment may thus allow for the insertion of each of the two or more device connector terminals and electrically conductive wires to which each is operatively connected through the voltmeter terminal openings 204 and into the terminal insulation channels 205. As described above, the embodiment depicted in FIG. 2F is just one example of a voltmeter terminal opening 204 and other embodiments may include other dimensions or shapes, specifically including one or more cylindrical shapes, as described in greater detail below.

FIG. 12

Figure 12:
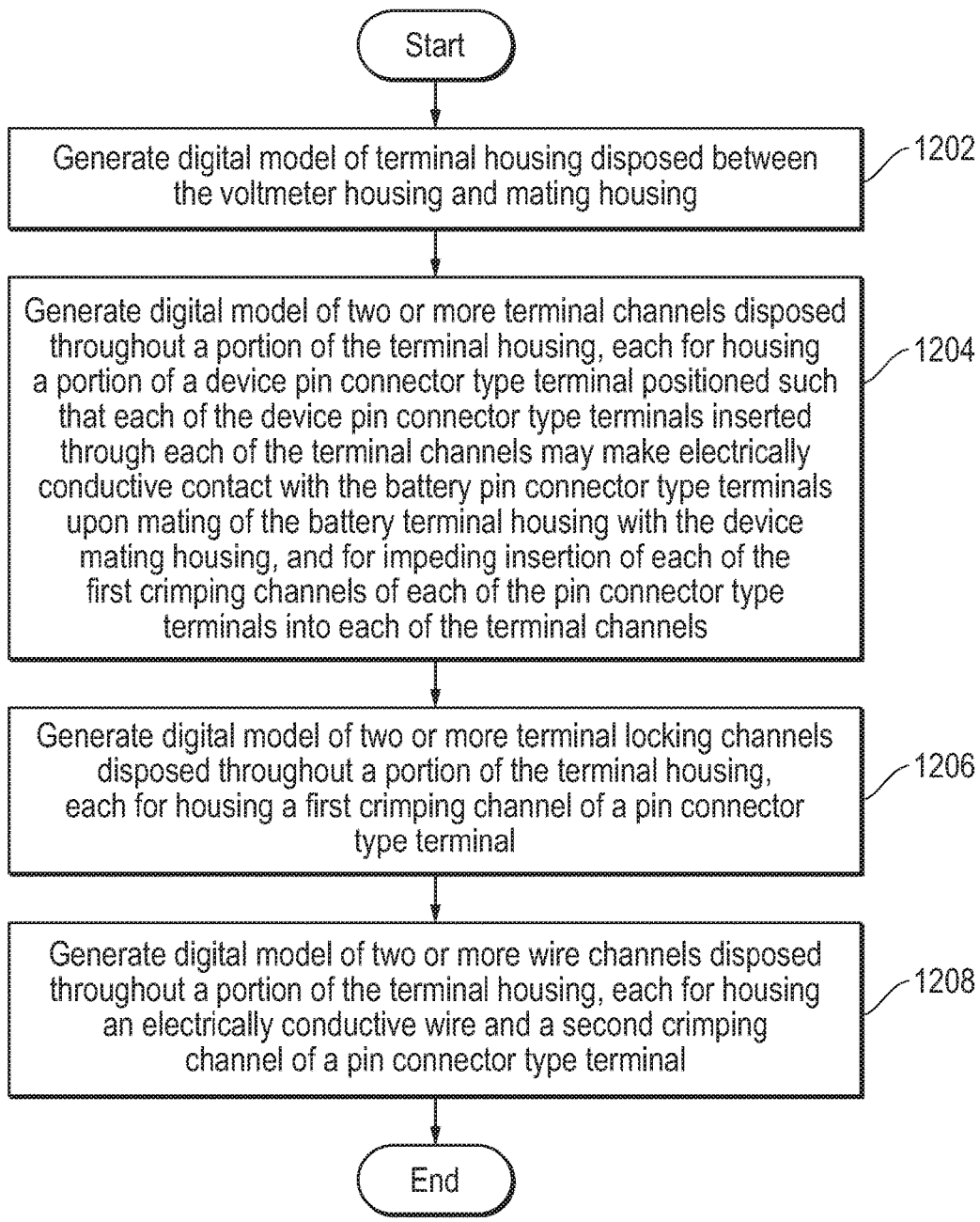
FIG. 12 is a flow diagram illustrating a method of generating a digital model of a terminal housing according to an embodiment of the present disclosure.

FIG. 12 is a flow diagram illustrating a method of generating a digital model of a terminal housing according to an embodiment of the present disclosure. The method may include one or more of generating a digital model of a terminal housing disposed between the voltmeter housing and the mating housing, generating a digital model of two wire channels disposed throughout a portion of the terminal housing, each for housing an electrically conductive wire and a second crimping channel of a pin connector type terminal, generating a digital model of two terminal locking channels disposed throughout a portion of the terminal housing, each sharing a radial center line with a wire channel and lying adjacent to a wire channel, each for housing a first crimping channel of a pin connector type terminal, and/or generating a digital model of two terminal channels disposed throughout a portion of the terminal housing, each sharing a radial center line with a wire channel and a terminal locking channel and lying adjacent to a terminal locking channel, each for housing a portion of a pin connector type terminal.

As described above, two or more device pin connector type terminals may be inserted into the voltmeter device housing so as to allow for electrically conductive contact to be made between the device pin connector type terminals and the battery pin connector type terminals which may be housed in the battery terminal housing once the battery terminal housing mates with the voltmeter device housing body from the opposite end. For example, in an embodiment described above with reference to FIG. 1D, the two or more device pin connector type terminals 114 may be inserted into the voltmeter device housing body 102 from the leading edge of the voltmeter device housing body 102. The battery pin connector type terminals 118 in such an embodiment may be housed within the battery terminal housing 116, both of which may be at least partially inserted into the voltmeter device housing body 102 from the trailing edge of the voltmeter device housing body 102. Upon insertion of the device pin connector type terminals 114 and the battery terminal housing 116, electrically conductive contact may be made between the device pin connector type terminals 114 and the battery pin connector type terminals 118.

In such an embodiment, once the voltmeter has taken a reading of the remaining voltage of the battery, the battery terminal housing 116 may be unmated with the voltmeter device housing body 102. Upon removal of the battery terminal housing 116 from the voltmeter device housing body 102 in such an embodiment, the mating of the battery pin connector type terminals 118 with the device pin connector type terminals 114 may operate to pull the device pin connector type terminals 114 toward the trailing edge of the voltmeter device housing body 102 in such a way as to compromise the electrically conductive contact made between the device pin connector type terminals 114, the electrically conductive wires 112, and the voltmeter microchip digital display 108, unless a mechanism within the voltmeter device housing body 102 impedes insertion of the device pin connector type terminals 114 toward the trailing edge of the voltmeter device housing body 102. One mechanism that may impede movement of the device pin connector type terminals 114, in such a way, may include terminal insulating channels comprising sub-channels, such as a terminal channel, a terminal locking channel, and/or a wire channel.

At block 1202, in an embodiment, a digital model of a terminal housing disposed between the voltmeter housing and mating housing may be generated. A terminal housing in an embodiment may comprise six walls, one of which may share the same dimensions as the wall of the voltmeter housing through which the voltmeter terminal openings are disposed, and one of which may share the same dimensions as the leading edge of the mating housing. For example, in the embodiment described with reference to FIG. 2E, the terminal housing 202 may comprise six walls, one of which having a horizontal width $X_{202}$, and a vertical height $Y_{202}$. The horizontal width $X_{202}$ in an embodiment may be equivalent to the horizontal width of the leading edge of the mating housing, and the vertical height $Y_{202}$ in an embodiment may be equivalent to the vertical height of the leading edge of the mating housing. With reference to the same embodiment, the opposite wall of the terminal housing may have a horizontal width $X_{201}$ and a vertical height of $Y_{201}$. The horizontal width $X_{201}$ in an embodiment may be equivalent to the horizontal width of the wall of the voltmeter housing through which the voltmeter terminal openings may be disposed. The vertical height $Y_{201}$ in an embodiment may be equivalent to the vertical height of the wall of the voltmeter housing through which the voltmeter terminal openings may be disposed.

The terminal housing in an embodiment may be disposed between the voltmeter housing and the mating housing such that the leading wall of the terminal housing lies flush with the trailing wall of the voltmeter housing and the trailing wall of the terminal housing lies flush with the leading wall of the mating housing. For example, in an embodiment described with reference to FIG. 2C, the leading wall of the terminal housing 202 may lie flush wish the trailing wall of the voltmeter housing 201, such that the leading wall of the terminal housing 202 has the same width as the trailing wall of the voltmeter housing 201. As another example, as also described in an embodiment with reference to FIG. 2C, the trailing wall of the terminal housing 202 in an embodiment may lie flush with the leading wall of a female device mating housing 203 such that the trailing wall of the terminal housing 202 has the same width as the leading wall of the female device mating housing 203.

The terminal housing in an embodiment may be disposed between the voltmeter housing and the mating housing such that the bottom of the terminal housing lies flush with the bottoms of the mating housing and the voltmeter housing, and the top of the terminal housing lies flush with the tops of the mating housing and the voltmeter housing. For example, in an embodiment described with reference to FIG. 2B, the top of the terminal housing 202 may lie flush with the tops of the voltmeter housing 201 and the female device mating housing 203, and the bottoms of the terminal housing 202 may lie flush with the bottoms of the voltmeter housing 201 and the female device mating housing 203. Although the embodiment described with reference to FIG. 2B indicates the heights of the voltmeter housing 201, the terminal housing 202, and the female device mating housing 203 are equivalent to one another and remain constant throughout the lengths of those housings, in other embodiments, the height of each housing may vary along its own length, and the height of the voltmeter housing may not be equivalent to the height of the mating housing. The height of the terminal housing may also vary. For example, the terminal housing may have one height at its leading wall, which may be equivalent to the height of the voltmeter housing, and the terminal housing may have a second and different height at its trailing wall, which may be equivalent to the height of the mating housing, where the voltmeter housing and mating housing have differing heights.

At block 1204, in an embodiment, a digital model of two terminal channels disposed throughout a portion of the terminal housing may be generated, each for housing a portion of a device pin connector type terminal positions such that each of the device pin connector type terminals inserted through each of the terminal channels may make electrically conductive contact with the battery pin connector type terminals upon mating of the battery terminal housing with the device mating housing, and for impeding insertion of each of the first crimping channels of each of the pin connector type terminals into each of the terminal channels. For example, in the embodiment described with reference to FIG. 2I, digital models of two socket terminal channels 211, disposed throughout a portion of the terminal housing 202 may be generated. The socket terminal channels 211 in an embodiment may be horizontally positioned such that their radial midpoints may lie a distance $X_{224}$ apart. The horizontal distance $X_{224}$ in an embodiment may be equivalent to the desired horizontal distance between the radial midpoints of the device socket connector terminals (not shown) which may be inserted through the center of the socket terminal channels 211. The distance $X_{211}$ in an embodiment may also be equivalent to the horizontal distance between the radial midpoints of the battery pin connector terminals. Thus, upon mating of the gendered battery terminal housing and the oppositely gendered device mating housing 202, each of the battery pin connector type terminals may make electrically conductive contact with one of the device pin connector type terminals inserted through the centers of the socket terminal channels 211.

Further, each socket terminal channel 211 may have a width $X_{211}$ equivalent to or greater than the width of the mating channel of the pin connector terminal which may be inserted within the socket terminal channel 211, but less than the width of the first socket crimping channel of the socket connector terminal. For example, in the embodiment described with reference to FIG. 8A, a socket terminal channel for partially housing a device socket connector terminal 808 may have a width equivalent to or greater than the width of the socket mating channel 802, but less than the width of the first socket crimping channel 804.

In the embodiment described with reference to FIG. 2I, the width of the socket terminal locking channel 210 being smaller than the width of the first socket crimping channel described directly may operate to inhibit movement of the leading edge of the first socket crimping channel beyond the socket terminal locking channel 210.

As another example, in the embodiment described with reference to FIG. 5E, digital models of two pin terminal channels 520, disposed throughout a portion of the terminal housing may be generated. Each pin terminal channel 520 may have a width $X_{520}$ equivalent to or greater than the width of the mating channel of the device pin connector terminal which may be inserted within the pin terminal channel 520, but less than the width of the first pin crimping channel of the device pin connector terminal. For example, in the embodiment described with reference to FIG. 9A, a pin terminal channel for partially housing a device pin connector terminal 908 may have a width equivalent to or greater than the width of the pin mating channel 902, but less than the width of the first socket crimping channel 904.

In the embodiment described with reference to FIG. 5E, the width of the pin terminal locking channel 518 being smaller than the width of the first pin crimping channel described directly may operate to inhibit movement of the leading edge of the first pin crimping channel beyond the pin terminal locking channel 518.

At block 1206, in an embodiment, a digital model of two terminal locking channels disposed throughout a portion of the terminal housing may be generated, each for housing a first crimping channel of a pin connector type terminal. For example, in the embodiment described with reference to FIG. 2I, the socket terminal locking channels 210 may be disposed throughout a portion of the terminal housing 202. Further, each of the socket terminal locking channels 210 may have a width $X_{210}$ which may be greater than the width of the first crimping channel of a device socket connector terminal. For example, in the embodiment described with reference to FIG. 8A, a socket terminal locking channel for partially housing a device socket connector terminal 808 may have a width equivalent to or greater than the width of the first socket crimping channel 804.

As another example, in the embodiment described with reference to FIG. 5E, the pin terminal locking channels 518 may be disposed throughout a portion of the terminal housing. Further, each of the pin terminal locking channels 518 may have a width $X_{518}$ which may be greater than the width of the first crimping channel of a device pin connector terminal. For example, in the embodiment described with reference to FIG. 9A, a pin terminal locking channel for partially housing a device pin connector terminal 908 may have a width equivalent to or greater than the width of the first pin crimping channel 904.

The terminal locking channels in an embodiment may be disposed within the terminal housing such that each lies flush with the leading edge of a terminal channel, shares a radial center with the radial center of a terminal channel, and has a depth equivalent to or less than the depth of the first crimping channel of the device pin connector type terminal. For example, in the embodiment described with reference to FIG. 2I, the trailing edge of a socket terminal locking channel 210 may lie flush with the leading edge of a socket terminal channel 211, and may share a radial center with a socket terminal channel 211. In addition, the socket terminal locking channel may have a depth $Z_{210}$ that may be equivalent to or less than the depth of the first socket crimping channel of a device socket connector terminal. As discussed above, in an embodiment described with reference to FIG. 8A, a device socket connector terminal 808 may include a first socket crimping channel 804 having a depth $Z_{804}$.

As another example, in the embodiment described with reference to FIG. 5E, the trailing edge of a pin terminal locking channel 518 may lie flush with the leading edge of a pin terminal channel 520, and may share a radial center with a pin terminal channel 520. In addition, the pin terminal locking channel may have a depth that may be equivalent to or less than the depth of the first pin crimping channel of a device pin connector terminal. As discussed above, in an embodiment described with reference to FIG. 9A, a device pin connector terminal 908 may include a first pin crimping channel 904 having a depth $Z_{904}$.

At block 1208, in an embodiment, a digital model of two wire channels disposed throughout a portion of the terminal housing may be generated, each for housing an electrically conductive wire and a second crimping channel of a pin connector type terminal. For example, in the embodiment described with reference to FIG. 2I, the wire channels 209 may have a width $X_{209}$ which may be greater than the width of the second crimping channel of the device socket connector terminal. As another example, in the embodiment described with reference to FIG. 8A, the wire channels may each have a width greater than the width of the second socket crimping channel 806 of the device socket connector terminal 808. As another example, in the embodiment described with reference to FIG. 5E, the wire channels 516 may have a width $X_{516}$ which may be greater than the width of the second crimping channel of the device pin connector terminal. As another example, in the embodiment described with reference to FIG. 9A, the wire channels may each have a width greater than the width of the second pin crimping channel 906 of the device pin connector terminal 908.

The dimensions of the wire channel in an embodiment may vary based upon the type of device pin connector type terminals used, and the length of the electrically conductive wires used. The wire channels in an embodiment may have any dimensions so long as three conditions are met. First, the wire channels in an embodiment may remain enclosed within the terminal housing. Second, each wire channel in an embodiment may have sufficient volume to house the second crimping channel of a device pin connector type terminal, and an electrically conductive wire operatively connected to the device pin connector type terminal. Third, the wire channels of an embodiment may operate to disallow electrically conductive contact to be made between each of the device pin connector type terminals, between each of the electrically conductive wires, or between any device pin connector type terminal and any electrically conductive wire not operatively connected to that device pin connector type terminal prior to insertion of the terminals and wires into the voltmeter device housing. Each wire channel in an embodiment may share a horizontal mid-line with the terminal locking channel to which it is directly adjacent.

FIG. 13

Figure 13:
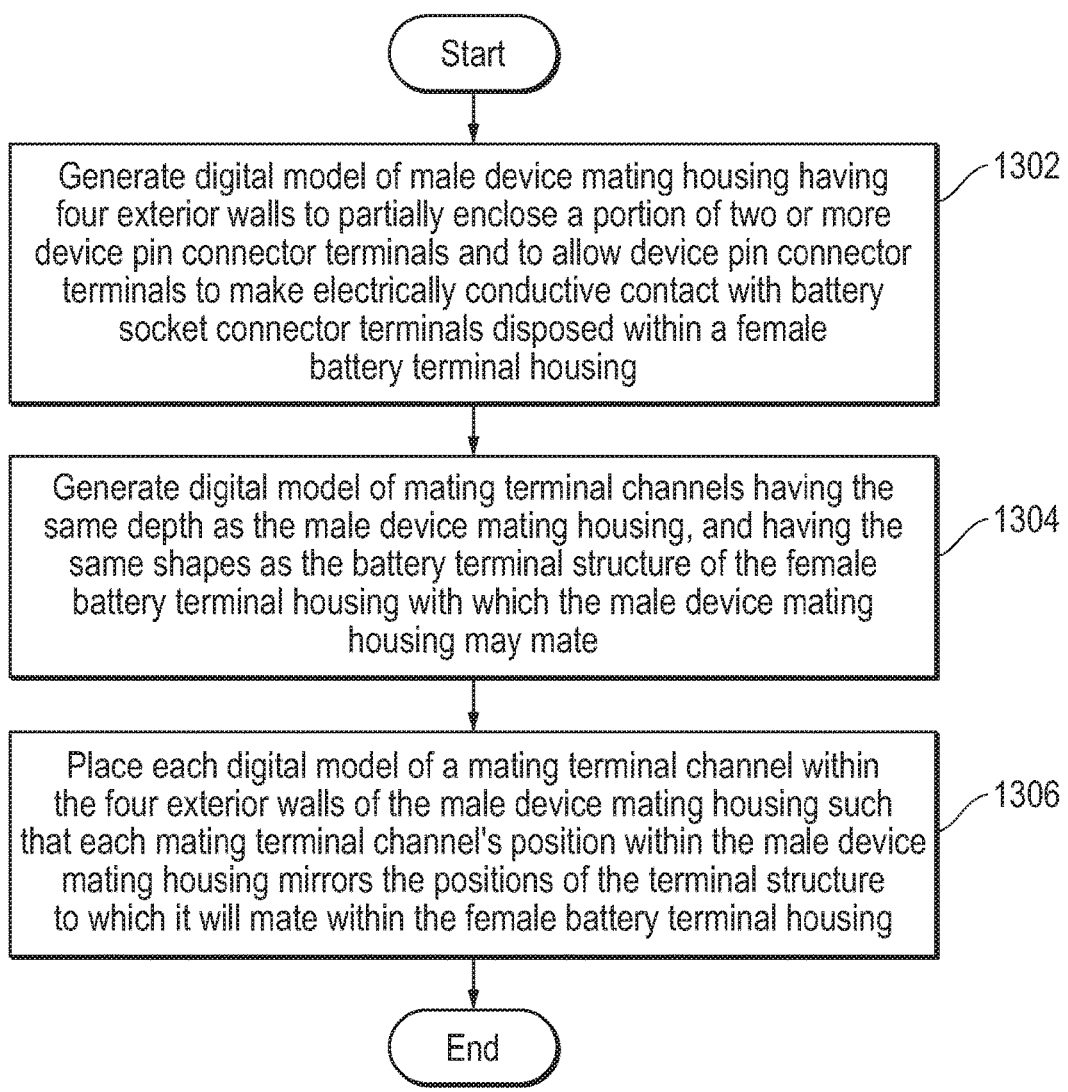
FIG. 13 is a flow diagram illustrating a method for generating a digital model of a male device mating housing according to an embodiment of the present disclosure.

FIG. 13 is a flow diagram illustrating a method for generating a digital model of a male device mating housing according to an embodiment of the present disclosure. A method for generating a digital model of a male device mating housing in an embodiment may include one or more of generating a digital model of a male device mating housing having four exterior walls, generating digital models of two mating terminal channels having the same shapes as the battery pin connector type terminal structures of a female battery terminal housing with which the male device mating housing may mate, and placing each digital model of a mating terminal channel within the four exterior walls of the male device mating housing such that each terminal channel's position within the male device mating housing mirror the positions of the terminal structure to which each will mate within the female battery terminal housing.

At block 1302, in an embodiment, a digital model of a male device mating housing may be generated. A male device mating housing in an embodiment may have four exterior walls to partially enclose a portion of two or more device pin connector terminals and to allow each of the device pin connector terminals to make electrically conductive contact with one of the battery socket connector terminals of the battery of which the user wishes to know the remaining voltage. For example, in the embodiment described with reference to FIG. 5, the male device mating housing 510 may have four exterior walls to partially enclose a portion of two device pin connector terminals 512, and to allow each of the device pin connector terminals 512 to make electrically conductive contact with one of the battery socket connector terminals.

At block 1304, in an embodiment, digital models of two mating terminal channels having the same depth as the male device mating housing and having the same shapes as the battery pin connector type terminal structures of a female battery terminal housing with which the male device mating housing may mate may be generated. For example, in the embodiment described with reference to FIG. 5D, the digital models of the two device mating terminal channels 514 may have a depth which may be equivalent to the depth of the male device mating housing 510. As a further example, in the embodiment described with reference to FIG. 5D, the digital model of the device mating terminal channel which may operate to mate with the rectangular shaped battery pin connector type terminal structure may have a rectangular shape, and the digital model of the device mating terminal channel which operates to mate with the u-shaped battery pin connector type terminal structure may have a u-shape. Further, the device mating terminal channels 514 may each have a width $X_{514}$ that may be equivalent to or greater than the widths of the battery pin connector type terminal structures, and may each have a height $Y_{514}$ that may be equivalent to or greater than the heights of each of the battery pin connector type terminal structures.

At block 1306, in an embodiment, each digital model of a mating terminal channel may be placed within the four exterior walls of the male device mating housing such that each mating terminal channel's position within the male device mating housing mirrors the position of the terminal structure to which it will mate within the female battery terminal housing. As an example, in the embodiment described with reference to FIG. 5D, both of the digital models of the device mating terminal channels 514 may be placed within the four exterior walls of the male device mating housing 510. As a further example, both the device mating terminal channels 514 in that embodiment may be placed a vertical distance $Y_{524}$ from the top exterior wall of the male device mating housing 510, which may be equivalent to or less than the vertical distance between the top of the battery pin connector type terminal structures and the interior ceiling of the female battery terminal housing. As yet another example, in the embodiment described with reference to FIG. 5D, the right-most interior wall of the rectangular device mating terminal channel may be located a horizontal distance $X_{524}$ away from the right exterior wall of the male device mating housing 510, which may be equivalent to or less than the horizontal distance between the left-most exterior wall of the rectangular battery pin connector type terminal structure and the left-most interior wall of the female battery terminal housing.

FIG. 14

Figure 14:
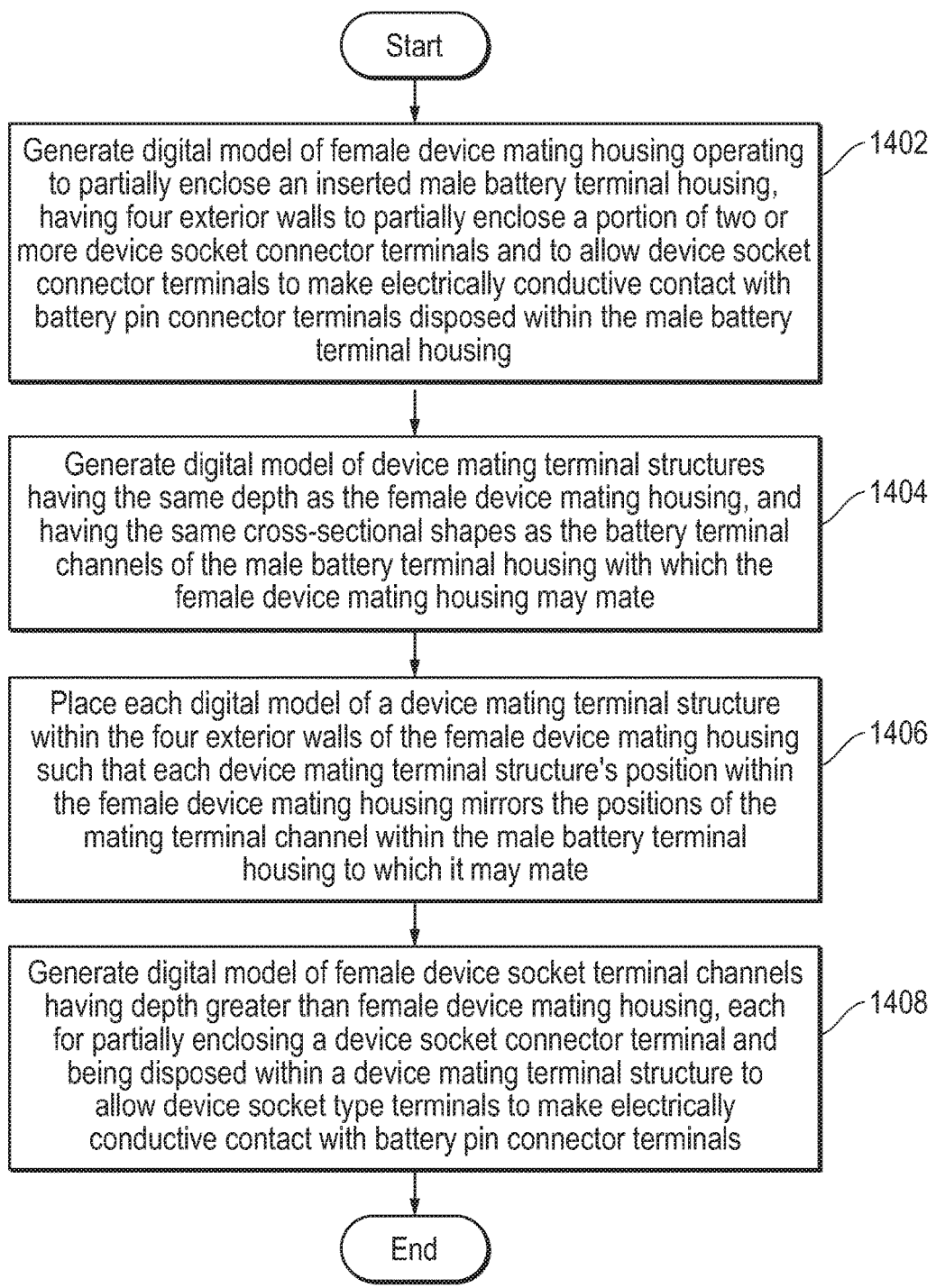
FIG. 14 is a flow diagram illustrating a method for generating a digital model of a female device mating housing according to an embodiment of the present disclosure.

FIG. 14 is a flow diagram illustrating a method for generating a digital model of a female device mating housing according to an embodiment of the present disclosure. A method for generating a digital model of a female device mating housing in an embodiment may include one or more of generating a digital model of a female device mating housing having four exterior walls, generating digital models of two device mating terminal structures having the same shapes as the battery pin connector type terminal channels of a male battery terminal housing with which the female device mating housing may mate, placing each digital model of a device mating terminal structure within the four exterior walls of the female device mating housing such that each device mating terminal structure's position within the female device mating housing mirrors the position of the battery pin connector type terminal channel to which it will mate within the male battery terminal housing, and generating digital models of female device socket terminal channels, each being disposed within one device mating terminal structure.

At block 1402, in an embodiment, a digital model of a female device mating housing may be generated. A female device mating housing in an embodiment may have four exterior walls to partially enclose a portion of two or more device socket connector terminals and to allow the device socket connector terminals to make electrically conductive contact with the pin connector terminals of the battery of which the user wishes to know the remaining voltage. For example, in the embodiment described with reference to FIG. 1F, the female device mating housing 120 may have four exterior walls to partially enclose a portion of a device socket connector terminal 122, and to allow each of the device socket connector terminals 122 to make electrically conductive contact with one of the battery pin connector terminals. As another example, in the embodiment described with reference to FIG. 2G, the female device mating housing 203 may have four exterior walls to partially enclose a portion of a device socket connector terminal disposed within a device socket terminal channel 207, and to allow each of the device socket connector terminals disposed within a device socket terminal channel 207 and within a device mating terminal structure 206 to make electrically conductive contact with one of the battery pin connector terminals.

At block 1404, in an embodiment, digital models of two device mating terminal structures having the same depth as the female device mating housing and having the same cross-sectional shapes as the battery pin connector type terminal channels of a male battery terminal housing with which the female device mating housing may mate may be generated. For example, in the embodiment described with reference to FIG. 2G, the digital models of the two device mating terminal structures 206 may have a depth equivalent to the depth of the female device mating housing 203. As a further example, in the embodiment described with reference to FIG. 2G, the digital model of one device mating terminal structure, which operates to mate with a battery pin connector type terminal channel having a rectangular cross-sectional shape may have a rectangular cross-sectional shape, and the digital model of the device mating terminal structure, which operates to mate with a battery pin connector type terminal channel having a u-shaped cross-section may have a u-shaped cross-section. Further, the device mating device mating terminal structures 206 may both have a width $X_{206}$ which may be equivalent to or less than the widths of the battery terminal channels, and may both have a height $Y_{206}$ which may be equivalent to or less than the heights of the battery terminal channels.

At block 1406, in an embodiment, each digital model of a device mating terminal structure may be placed within the four interior walls of the female device mating housing such that each device mating terminal structure's position within the female device mating housing mirrors the position of the battery terminal channel to which it will mate within the male battery terminal housing. As an example, in the embodiment described with reference to FIG. 2G, both of the digital models of the device mating terminal structures 206 may be placed within the four interior walls of the female device mating housing 203. As a further example, both the device mating terminal structures 206 in that embodiment may be placed such that their exterior ceilings lie a vertical distance $Y_{223}$ from the top interior wall of the female device mating housing 203, which may be equivalent to the vertical distance between the top of the battery terminal channels and the exterior top of the male battery terminal housing. As yet another example, in the embodiment described with reference to FIG. 2G, the u-shaped device mating terminal structure may be located such that it's right-most exterior vertical wall lies a horizontal distance $X_{223}$ away from the right interior wall of the female device mating housing 203, which may be equivalent to the horizontal distance between the left-most interior wall of the u-shaped battery terminal channel and the left-most external wall of the male battery terminal housing.

At block 1408, in an embodiment, digital models of female device socket terminal channels having a depth greater than the mating housing may be generated. In an embodiment, each female device socket terminal channel may operate to partially enclose a device socket connector terminal, and each may be disposed within a device mating terminal structure so as to allow each of the device socket connector terminals to make electrically conductive contact with one of the battery pin connector terminals. For example, in the embodiment described with reference to FIG. 2H, digital models of socket terminal channels 211 may be generated such that the digital models of socket terminal channels 211 have a depth greater than the depth of the female device mating housing 203. As shown in FIG. 2H, the socket terminal channels 211 in an embodiment may extend from one edge of the female device mating housing 203, beyond the other edge of the female device mating housing 203, and into the terminal housing 202. As another example, also in the embodiment described with reference to FIG. 2H, each socket terminal channel 211 may be disposed within a device mating terminal structure 206.

FIG. 15

Figure 15:
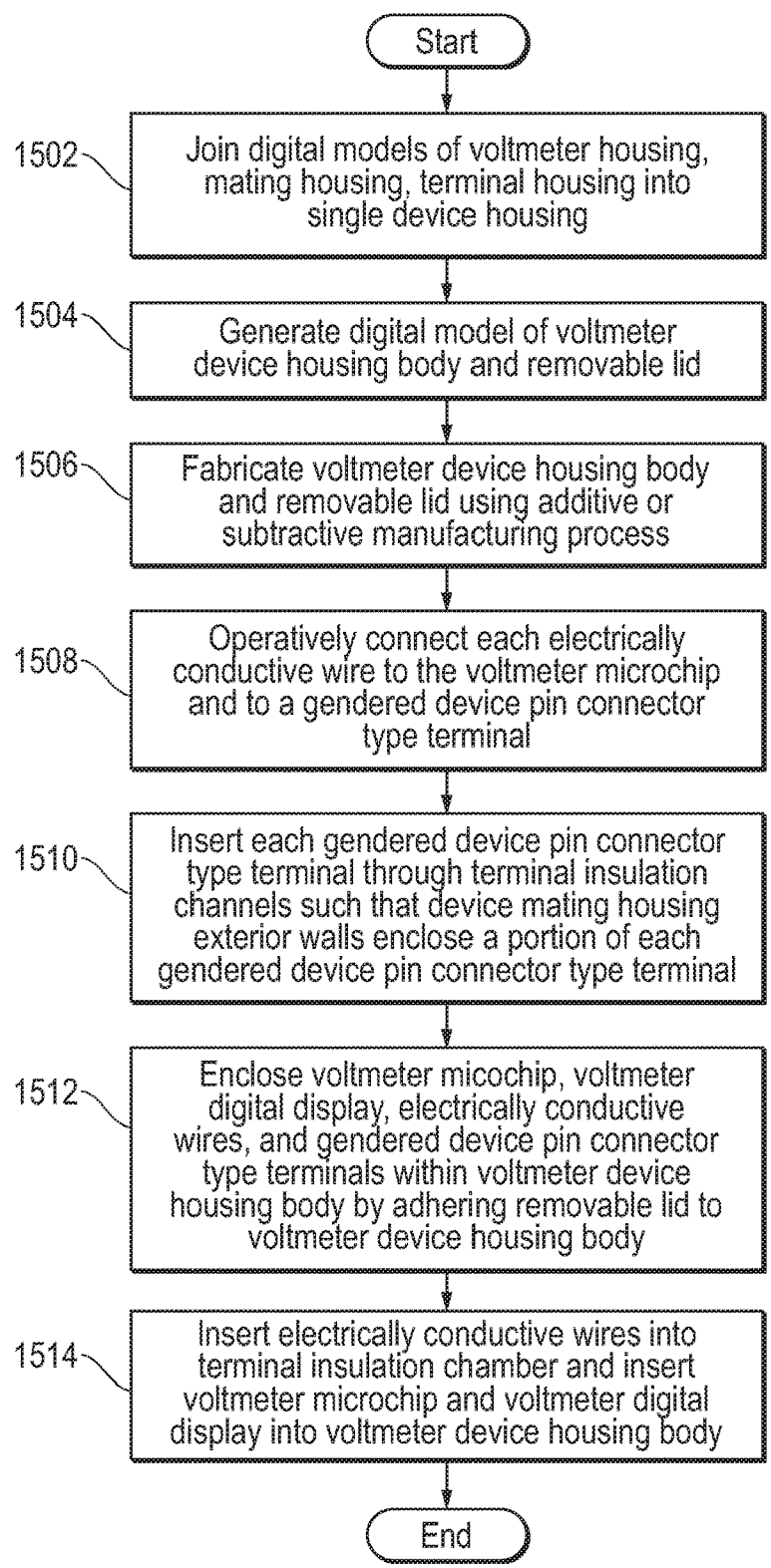
FIG. 15 is a flow diagram illustrating a method of enclosing a voltmeter microchip, voltmeter digital display, device pin connector type terminals, and electrically conductive wires within a fabricated voltmeter device housing with a removable lid.

FIG. 15 is a flow diagram illustrating a method of enclosing a voltmeter microchip, voltmeter digital display, device pin connector type terminals, and electrically conductive wires within a fabricated voltmeter device housing with a removable lid. At block 1502, in an embodiment, digital models of a voltmeter housing structure, mating housing structure, and terminal housing structure may be joined into a single voltmeter device housing structure. The digital models of a voltmeter housing structure, mating housing structure, and terminal housing structure in an embodiment may be placed adjacent to one another such that an exterior wall of the voltmeter housing lies adjacent to an exterior wall of the terminal housing, and the four exterior walls of the mating housing extend perpendicularly outward from the opposite exterior wall of the terminal housing.

For example, in the embodiment described above with reference to FIG. 2F, a digital model of a voltmeter housing 201 may be placed such that the voltmeter housing exterior wall having openings formed by the voltmeter terminal openings 204 may lie flush with an exterior wall of the terminal housing 202 having openings formed by the terminal insulating channels 205. As another example, in the embodiment described above with reference to FIG. 2J, a digital model of a female device mating housing 203 may be placed such that its four exterior walls protrude perpendicularly from the other exterior wall of the terminal housing 202. Also as part of that embodiment, the digital models of the voltmeter housing 201, terminal housing 202, and female device mating housing 203 may be disposed such that the top exterior surfaces of each, and the bottom exterior surfaces of each are coplanar. In other embodiments, the digital models of the voltmeter housing, terminal housing, and mating housing may be disposed such that their top exterior surfaces are not coplanar.

The digital models of the voltmeter housing, terminal housing, and mating housing, once placed adjacent to one another, may be joined into a digital model of a single structure called a voltmeter device housing. For example, in the embodiment described with reference to FIG. 3G, a digital model of a voltmeter device housing 300 may be generated by selecting the voltmeter housing, female device mating housing, and terminal housing of an embodiment and using the join function to join the digital models of those three separate structures into a digital model of a single structure called a voltmeter device housing 300.

At block 1504, in an embodiment, a digital model of a voltmeter device housing body and a removable lid may be generated. In an embodiment, a digital model of a voltmeter device housing body and a removable lid may be generated by separating the digital model of the voltmeter device housing into two separate structures, including a voltmeter device housing body and a removable lid. As an example, in the embodiment described with reference to FIG. 1B, the digital model of the voltmeter device housing may be separated into two structures, including a voltmeter device housing body 102, and a removable lid 104.

Separating the voltmeter device housing single structure into the voltmeter device housing body and the removable lid in an embodiment may allow a user of the physical device fabricated based upon the digital models of the voltmeter device housing body and the removable lid to insert items into the voltmeter device housing body, then enclose those items within the voltmeter device housing body by adhering the removable lid to the voltmeter device housing body. The voltmeter device housing may be separated in any number of ways so long as the voltmeter device housing body and removable lid maintain structural integrity upon fabrication, such that an opening in the upper surface of the voltmeter device housing body is formed to allow for insertion of two or more pin connector type terminals, two or more electrically conductive wires, a voltmeter microchip, and a voltmeter digital display within the voltmeter device housing body, and such that the removable lid may adhere to the voltmeter device housing body so as to enclose the inserted two or more pin connector type terminals, two or more electrically conductive wires, voltmeter microchip and voltmeter digital display. In another embodiment, the removable lid and voltmeter device housing body may take on another shape. For example, in the embodiment described with reference to FIG. 5B, a voltmeter device housing may be separated into a sloped voltmeter device housing body 502 and a sloped removable lid 504 which may operate to ease the insertion of the two or more pin connector type terminals, two or more electrically conductive wires, voltmeter microchip, and voltmeter digital display within the sloped voltmeter device housing body 502. In such an embodiment, as shown in FIG. 5B, the voltmeter device housing may be separated such that the front exterior wall of the voltmeter device housing is incorporated into the sloped removable lid 504, rather than the sloped voltmeter device housing body 502. Such a separation may operate to make the channels into which the two or more pin connector type terminals, two or more electrically conductive wires, voltmeter microchip, and voltmeter digital display will be inserted more easily viewable.

At block 1506, in an embodiment, a voltmeter device housing body and removable lid may be fabricated using additive or subtractive manufacturing processes. In an embodiment, the fabrication process may include any manufacturing process or aggregate of manufacturing processes operable to generate a three-dimensional model of and fabricate an apparatus operable to measure the remaining voltage of a direct current battery with a voltmeter wherein the direct current battery has any orientation of two or more pin connector type terminals in its battery terminal housing. A computer-aided manufacturing process for manufacturing an apparatus for measuring the remaining voltage of a direct current battery having any orientation of two or more pin connector type terminals in its battery terminal housing may vary in method of generating a computer-aided three-dimensional digital model of the apparatus, the method of fabrication of the apparatus, materials used in the fabrication process, performance, manufacturing speed, and price. Additional computer-aided manufacturing processes for manufacturing the apparatus may include three-dimensional printing methods, specifically.

It is contemplated the electronic files of the three-dimensional digital models of the structures described herein may be used to manufacture or fabricate a solid object or apparatus using any type of printing or machining or other manufacturing process wherein the printer, machining device, or other manufacturing device can interface with and interpret CAD electronic file outputs. One such process is three-dimensional printing. Three-dimensional printing may include sequential deposition of material onto a powder bed with printer heads in order to fabricate a solid object one layer at a time, and may also include other additive manufacturing processes such as extrusion, sintering-based processes, Polyjet printing, CLIP printing, SLA printing, SLS printing, and injection molding. It is understood the computer-aided manufacturing processes described herein may include any type, variety or combination of these three-dimensional printing processes, machining processes, or any other manufacturing processes that include the use of CAD output files.

At block 1508, in an embodiment, each of two or more electrically conductive wires may be operatively connected to a voltmeter microchip and to one of two or more gendered device pin connector type terminals. In an embodiment, two or more device pin connector type terminals operating to make electrically conductive contact with each of the two or more battery pin connector type terminals within the battery terminal housing may be needed in order to determine the remaining voltage of the DC battery. An electrically conductive wire may be operatively connected to each device pin connector type terminal, and also to a voltmeter microchip in order to carry current between the DC battery pin connector type terminals and the voltmeter microchip, such that the voltmeter microchip may determine the remaining voltage of the DC battery. As discussed above, the battery pin connector type terminals may be gendered, and the device pin connector type terminals may have an opposite gender. For example, in the embodiment described with reference to FIG. 3D, two or more device socket connector terminals 312, each for mating with a battery pin connector terminal, may be operatively connected to two or more electrically conductive wires 310, which may also be operatively connected to a voltmeter microchip and/or voltmeter digital display 308.

At block 1510, in an embodiment, each device pin connector type terminal may be inserted through a terminal insulation channel within a voltmeter device housing body such that the exterior walls of the device mating housing partially enclose each gendered device pin connector type terminal. In an embodiment, each device pin connector type terminal may be inserted through a terminal insulation channel until a portion of each device pin connector type terminal protrudes into the cavity disposed between the four exterior walls of the device mating housing. For example, in the embodiment described with reference to FIG. 3E, the device socket connector terminals 312 may be inserted into the voltmeter device housing body 302 until a portion of the device socket connector terminals 312 protrudes into the cavity disposed within the device mating terminal structures 320.

As discussed above, the terminal housing of a device may include terminal insulating channels that can take many shapes. Further, the shapes may vary depending on the gender of the device pin connector type terminals. For example, in the embodiment described with reference to FIG. 3D, in which the voltmeter device housing body for mating with a male battery terminal housing acts to enclose device socket connector terminals, the terminal insulating channels may incorporate a combination of wire channels 314, socket terminal locking channels 316, and socket terminal channels 318. As another example, in the embodiment described with reference to FIG. 5E, in which the voltmeter device housing body for mating with a female battery terminal housing acts to enclose device pin connector terminals, the terminal insulating channels may incorporate a combination of wire channels 516, pin terminal locking channels 518, and pin terminal channels 520.

As described above, each device pin connector type terminal may be inserted through a terminal insulation channel until a portion of each device pin connector type terminal protrudes into the cavity disposed between the four exterior walls of the device mating housing. For example, in the embodiment described with reference to FIG. 3D, each device socket connector terminal may be inserted into the voltmeter device housing body 302 through a wire channel 314. As another example, in the embodiment described with reference to FIG. 5E, each device pin connector terminal may be inserted into the voltmeter device housing body 502 through a wire channel 516.

As discussed above, a voltmeter device housing may incorporate a gendered mating housing for mating with a battery terminal housing having the opposite gender. For example, in the embodiment described with reference to FIG. 2G, the mating housing may be a female device mating housing 203 for partially enclosing device socket connector terminals disposed within device socket terminal channels 207, and for mating with a male battery terminal housing. In such an embodiment, the female device mating housing may incorporate mating terminal structures 206 operating to insert into terminal channels disposed within the battery terminal housing upon insertion of the male battery terminal housing into the female mating housing. The device socket connector terminals in such an embodiment may be inserted into the device socket terminal channels 207 such that a portion of each device socket connector terminal extends into the device mating terminal structures 206, allowing for electrically conductive contact to be made between each device socket connector terminal and one of each battery pin connector terminal upon insertion of the male battery terminal housing into the female device mating housing.

As another example, in the embodiment described with reference to FIG. 5D, the mating housing may be a male device mating housing 510 for partially enclosing device pin connector terminals 512, and for mating with a female battery terminal housing. In such an embodiment, the male device mating housing may incorporate device mating terminal channels 514 operating to enclose female battery mating terminal structures inserted into the device mating terminal channels 514 upon insertion of the male device mating housing into the female battery terminal housing. The device pin connector terminals 512 in such an embodiment may be inserted such that a portion of each device pin connector terminal 512 extends into the device mating terminal channel 512, allowing for electrically conductive contact to be made between each device pin connector terminal 512 and one of each battery socket connector terminal upon insertion of the male device mating housing into the female battery terminal housing.

At block 1512, in an embodiment, each of the electrically conductive wires may be inserted into the terminal insulating channels and the voltmeter microchip and voltmeter digital display may be inserted into the voltmeter device housing body. For example, in the embodiment described with reference to FIG. 3E, the electrically conductive wires 310 may be inserted into the voltmeter device housing body 302. In that same embodiment, the voltmeter microchip and voltmeter digital display 308 may be inserted into the voltmeter device housing body 302.

At block 1514, in an embodiment, a voltmeter microchip, voltmeter digital display, two or more electrically conductive wires, and two or more device pin connector type terminal may be enclosed within a voltmeter device housing body by adhering the removable lid to the voltmeter device housing body. For example, in the embodiment described with reference to FIG. 3A, the removable lid 304 may be adhered to the voltmeter device housing body 302.

The blocks of the flow diagrams discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated voltmeter device housing comprising:
   a unified housing including a voltmeter housing portion, a terminal housing portion, and a mating housing portion;
   the voltmeter housing portion configured to hold voltage measurement circuitry and a measurement display, the voltmeter housing portion including:
      a window through which the measurement display is viewed;
      at least one voltmeter terminal opening;
   the terminal housing portion coupled between the voltmeter housing portion and the mating housing portion, the terminal housing portion including a plurality of insulating channels forming conduits operating to route separate electrical conductors from the terminal housing portion to the mating housing portion, the insulating channels configured to prevent electrically conductive contact from occurring between the separate electrical conductors;
   the mating housing portion forming an enclosure with a battery terminal opening, the mating housing portion configured to:
      receive, within the battery terminal opening, a plurality of battery terminals of a battery to be tested;
      mate with the plurality of battery terminals disposed within a battery-terminal housing of the battery to be tested; and
      electrically couple the plurality of battery terminals to the voltmeter measurement circuitry.

2. The integrated voltmeter device housing of claim 1, wherein the battery-terminal housing comprises at least two battery socket connector terminals, further comprising:
   the mating housing portion forming a protrusion configured to partially enclose each of the separate electrical conductors, the protrusion configured to insert within the battery-terminal housing;

wherein each separate electrical conductor comprises an electrically conductive wire operatively connecting the voltage measurement circuitry to a device pin connector terminal;

the mating housing portion having one or more exterior walls and two or more mating terminal channels disposed throughout a length of the mating housing portion, each of the two or more mating terminal channels configured to partially enclose a first portion of one of the device pin connector terminals;

the battery-terminal housing allowing for insertion of at least a portion of the mating housing portion within the battery-terminal housing so as to allow electrically conductive contact to be made between each of the battery socket connector terminals and each of the device pin connector terminals disposed within one of the two or more mating terminal channels; and each of the two or more mating terminal channels having a shape and orientation with respect to one another and with respect to the one or more exterior walls of the mating housing portion to allow electrically conductive contact to be made between each of the battery socket connector terminals and each of the device pin connector terminals.

3. The integrated voltmeter device housing of claim 2, wherein each of the insulating channels further comprises:

a pin terminal channel configured to enclose a first portion of one of the device pin connector terminals;

a pin terminal locking channel configured to enclose a second portion of one of the device pin connector terminals and to provide resistance against insertion of a first pin crimping channel of one of the device pin connector terminals into the pin terminal channel; and a wire channel configured to partially enclose one of the electrically conductive wires.

4. The integrated voltmeter device housing of claim 2, further comprising:

each of the device pin connector terminals operatively connected to the voltage measurement circuitry via one of the electrically conductive wires;

the measurement display operatively connected to the voltage measurement circuitry, both the measurement display and the voltage measurement circuitry being disposed within the voltmeter housing portion; and each of the device pin connector terminals being disposed throughout a portion of a length of one of the two or more mating terminal channels, and being partially enclosed by one of the two or more mating terminal channels so as to allow electrically conductive contact to be made between each of the battery socket connector terminals and each of the device pin connector terminals.

5. The integrated voltmeter device housing of claim 1, wherein the battery-terminal housing comprises two or more battery pin connector terminals, each battery pin connector terminal partially enclosed within a battery pin terminal channel, further comprising:

the mating housing portion forming an enclosure with a battery opening, the mating housing portion configured to receive, within the battery opening, the battery-terminal housing;

wherein each separate electrical conductor comprises an electrically conductive wire operatively connecting the voltage measurement circuitry to a device socket connector terminal;

the mating housing portion having two or more mating terminal structures disposed throughout a length of the mating housing portion;

each of the mating terminal structures having a mating terminal channel configured to partially enclose a first portion of one of the device socket connector terminals and being disposed throughout the length of the mating housing portion;

the mating housing portion allowing for insertion of a portion of the battery-terminal housing within the mating housing portion so as to allow electrically conductive contact to be made between each of the battery pin connector terminals and each of the device socket connector terminals; and the mating terminal structures having a shape and orientation with respect to one another to allow for insertion of one of each of the mating terminal structures into one of each of the battery pin terminal channels.

6. The integrated voltmeter device housing of claim 5, wherein each of the insulating channels further comprises:

a socket terminal channel configured to enclose a first portion of one of the device socket connector terminals;

a socket terminal locking channel configured to enclose a second portion of one of the device socket connector terminals and to provide resistance against insertion of a first socket crimping channel of one of the device socket connector terminals into the socket terminal channel; and a wire channel configured to partially enclose one of the electrically conductive wires.

7. The integrated voltmeter device housing of claim 6, further comprising:

each of the device socket connector terminals operatively connected to the voltage measurement circuitry via one of the electrically conductive wires;

the measurement display operatively connected to the voltage measurement circuitry, both the measurement display and the voltage measurement circuitry being disposed within the voltmeter housing portion; and each of the device socket connector terminals being disposed throughout a portion of the length of each of the mating terminal channels, and being partially enclosed by one of the mating terminal channels so as to allow electrically conductive contact to be made between each of the battery pin connector terminals and each of the device socket connector terminals.

8. A computer-aided manufacturing process for generating an integrated voltmeter device housing comprising:

generating in three-dimensional modeling software a digital model of a unified housing including a voltmeter housing portion, a terminal housing portion, and a mating housing portion;

configuring the digital model of the voltmeter housing portion to hold voltage measurement circuitry and a measurement display, the voltmeter housing portion including:

a window through which the measurement display is viewed;

at least one voltmeter terminal opening;

configuring the digital model of the terminal housing portion to be coupled between the voltmeter housing portion and the mating housing portion, and to include a plurality of insulating channels forming conduits routing separate electrical conductors from the terminal housing portion to the mating housing portion, the insulating channels configured to prevent electrically conductive contact from occurring between the separate electrical conductors;

configuring the digital model of the mating housing portion to form an enclosure with a battery terminal opening, the mating housing portion configured to:
receive, within the battery terminal opening, a plurality of battery terminals of a battery to be tested;
mate with the plurality of battery terminals disposed within a battery-terminal housing of the battery to be tested; and
electrically couple the plurality of battery terminals to the voltmeter measurement circuitry; and fabricating the digital model of the integrated voltmeter device housing using additive or subtractive manufacturing processes.

9. The computer-aided manufacturing process for generating an integrated voltmeter device housing of claim 8, wherein the battery-terminal housing comprises at least two battery socket connector terminals, further comprising:
configuring the mating housing portion to form a protrusion operating to partially enclose each of the separate electrical conductors, the protrusion configured to insert within the battery-terminal housing;
wherein each separate electrical conductor comprising an electrically conductive wire operatively connecting the voltage measurement circuitry to a device pin connector terminal;
configuring the mating housing portion to have one or more exterior walls and two or more mating terminal channels disposed throughout a length of the mating housing portion, each of the two or more mating terminal channels configured to partially enclose a first portion of a device pin connector terminal;
configuring the battery-terminal housing to allow for insertion of at least a portion of the mating housing portion within the battery-terminal housing so as to allow electrically conductive contact to be made between each of the battery socket connector terminals and each of the device pin connector terminals disposed within one of the two or more mating terminal channels; and
configuring each of the two or more mating terminal channels to have a shape and orientation with respect to one another and with respect to the one or more exterior walls of the mating housing portion to allow electrically conductive contact to be made between each of the battery socket connector terminals and each of the device pin connector terminals.

10. The computer-aided manufacturing process for generating an integrated voltmeter device housing of claim 9, further comprising:
configuring each of the insulating channels to further comprise:
a pin terminal channel configured to enclose a first portion of one of the device pin connector terminals;
a pin terminal locking channel configured to enclose a second portion of one of the device pin connector terminals and to provide resistance against insertion of a first pin crimping channel of one of the device pin connector terminals into the pin terminal channel; and
a wire channel configured to partially enclose one of the electrically conductive wires.

11. The computer-aided manufacturing process for generating an integrated voltmeter device housing of claim 10, further comprising:

operatively connecting each device pin connector terminal to the voltage measurement circuitry via one of the electrically conductive wires;
partially inserting each of the device pin connector terminals into one of the two or more mating terminal channels, so as to partially enclose each of the device pin connector terminals within one of the two or more mating terminal channels, and to allow electrically conductive contact to be made between each of the battery socket connector terminals and each of the device pin connector terminals;
inserting each of the electrically conductive wires into one of the wire channels; and
inserting the measurement display and the voltage measurement circuitry into the voltmeter housing portion.

12. The computer-aided manufacturing process for generating an integrated voltmeter device housing of claim 8, wherein the battery-terminal housing comprises two or more battery pin connector terminals, each battery pin connector terminal partially enclosed within a battery pin terminal channel, further comprising:
configuring the mating housing portion to form an enclosure with a battery opening, the mating housing portion configured to receive, within the battery opening, the battery-terminal housing;
wherein each separate electrical conductor comprises an electrically conductive wire operatively connecting the voltage measurement circuitry to a device socket connector terminal;
configuring the mating housing portion to have two or more mating terminal structures disposed throughout a length of the mating housing portion;
configuring each of the mating terminal structures to have a mating terminal channel configured to partially enclose a first portion of one of the device socket connector terminals and being disposed throughout the length of the mating housing portion;
configuring the mating housing portion to allow for insertion of a portion of the battery-terminal housing within the mating housing portion so as to allow electrically conductive contact to be made between each of the battery pin connector terminals and each of the device socket connector terminals; and
configuring the mating terminal structures to have a shape and orientation with respect to one another to allow for insertion of one of each of the mating terminal structures into one of each of the battery pin terminal channels.

13. The computer-aided manufacturing process for generating an integrated voltmeter device housing of claim 12, further comprising:
configuring each of the insulating channels to further comprise:
a socket terminal channel configured to enclose a first portion of one of the device socket connector terminals;
a socket terminal locking channel configured to enclose a second portion of one of the device socket connector terminals and to provide resistance against insertion of a first socket crimping channel of one of the device socket connector terminals into the socket terminal channel; and
a wire channel configured to partially enclose one of the electrically conductive wires.

14. The computer-aided manufacturing process for generating an integrated voltmeter device housing of claim 13, further comprising:

operatively connecting each device socket connector terminal to the voltage measurement circuitry via one of the electrically conductive wires;

partially inserting each of the device socket connector terminals into one of the mating terminal channels, so as to partially enclose each of the device socket connector terminals within one of the mating terminal channels, and to allow electrically conductive contact to be made between each of the battery pin connector terminals and each of the device socket connector terminals;

inserting each of the electrically conductive wires into one of the wire channels; and inserting the measurement display and the voltage measurement circuitry into the voltmeter housing portion.

15. An integrated voltmeter device housing prepared by a computer-aided manufacturing process comprising the steps of:

generating in three-dimensional modeling software a digital model of a unified housing including a voltmeter housing portion, a terminal housing portion, and a mating housing portion;

configuring the digital model of the voltmeter housing portion to hold voltage measurement circuitry and a measurement display, the voltmeter housing portion including:
a window through which the measurement display is viewed;
at least one voltmeter terminal opening;

configuring the digital model of the terminal housing portion to be coupled between the voltmeter housing portion and the mating housing portion, and to include a plurality of insulating channels forming conduits routing separate electrical conductors from the terminal housing portion to the mating housing portion, the insulating channels configured to prevent electrically conductive contact from occurring between the separate electrical conductors;

configuring the digital model of the mating housing portion to form an enclosure with a battery terminal opening, the mating housing portion configured to:
receive, within the battery terminal opening, a plurality of battery terminals of a battery to be tested;
mate with the plurality of battery terminals disposed within a battery-terminal housing of the battery to be tested; and
electrically couple the plurality of battery terminals to the voltmeter measurement circuitry; and fabricating the digital model of the integrated voltmeter device housing using additive or subtractive manufacturing processes.

16. The integrated voltmeter device housing prepared by a computer-aided manufacturing process of claim 15, wherein each separate electrical conductor comprises an electrically conductive wire operatively connecting the voltage measurement circuitry to a device terminal, further comprising the steps of:

partially inserting each of the device terminals into one of the plurality of insulating channels, so as to partially enclose each of the device terminals within one of the insulating channels, and to allow electrically conductive contact to be made between each of the plurality of battery terminals and each of the device terminals; and inserting the measurement display and the voltage measurement circuitry into the voltmeter housing portion.

17. The integrated voltmeter device housing prepared by a computer-aided manufacturing process of claim 15, wherein the battery-terminal housing comprises at least two battery socket connector terminals, further comprising the steps of:

configuring the mating housing portion to form a protrusion operating to partially enclose each of the separate electrical conductors, the protrusion configured to insert within the battery-terminal housing;

wherein each separate electrical conductor comprising an electrically conductive wire operatively connecting the voltage measurement circuitry to a device pin connector terminal;

configuring the mating housing portion to have one or more exterior walls and two or more mating terminal channels disposed throughout a length of the mating housing portion, each of the two or more mating terminal channels configured to partially enclose a first portion of a device pin connector terminal;

configuring the battery-terminal housing to allow for insertion of at least a portion of the mating housing portion within the battery-terminal housing so as to allow electrically conductive contact to be made between each of the battery socket connector terminals and each of the device pin connector terminals disposed within one of the two or more mating terminal channels;

configuring each of the two or more mating terminal channels to have a shape and orientation with respect to one another and with respect to the one or more exterior walls of the mating housing portion to allow electrically conductive contact to be made between each of the battery socket connector terminals and each of the device pin connector terminals;

configuring each of the insulating channels to further comprise:
a pin terminal channel configured to enclose a first portion of one of the device pin connector terminals;
a pin terminal locking channel configured to enclose a second portion of one of the device pin connector terminals and to provide resistance against insertion of a first pin crimping channel of one of the device pin connector terminals into the pin terminal channel; and
a wire channel configured to partially enclose one of the electrically conductive wires.

18. The integrated voltmeter device housing prepared by a computer-aided manufacturing process of claim 17, further comprising the steps of:

operatively connecting each device pin connector terminal to the voltage measurement circuitry via one of the electrically conductive wires;

partially inserting each of the device pin connector terminals into one of the two or more mating terminal channels, so as to partially enclose each of the device pin connector terminals within one of the two or more mating terminal channels, and to allow electrically conductive contact to be made between each of the battery socket connector terminals and each of the device pin connector terminals;

inserting each of the electrically conductive wires into one of the wire channels; and inserting the measurement display and the voltage measurement circuitry into the voltmeter housing portion.

19. The integrated voltmeter device housing prepared by a computer-aided manufacturing process of claim 15, wherein the battery-terminal housing comprises two or more battery pin connector terminals, each battery pin connector terminal partially enclosed within a battery pin terminal channel, further comprising the steps of:

configuring the mating housing portion to form an enclosure with a battery opening, the mating housing portion configured to receive, within the battery opening, the battery-terminal housing;

wherein each separate electrical conductor comprises an electrically conductive wire operatively connecting the voltage measurement circuitry to a device socket connector terminal;

configuring the mating housing portion to have two or more mating terminal structures disposed throughout a length of the mating housing portion;

configuring each of the mating terminal structures to have a mating terminal channel configured to partially enclose a first portion of one of the device socket connector terminals and being disposed throughout the length of the mating housing portion;

configuring the mating housing portion to allow for insertion of a portion of the battery-terminal housing within the mating housing portion so as to allow electrically conductive contact to be made between each of the battery pin connector terminals and each of the device socket connector terminals;

configuring the mating terminal structures to have a shape and orientation with respect to one another to allow for insertion of one of each of the mating terminal structures into one of each of the battery pin terminal channels;

configuring each of the insulating channels to further comprise:

a socket terminal channel configured to enclose a first portion of one of the device socket connector terminals;

a socket terminal locking channel configured to enclose a second portion of one of the device socket connector terminals and to provide resistance against insertion of a first socket crimping channel of one of the device socket connector terminals into the socket terminal channel; and a wire channel configured to partially enclose one of the electrically conductive wires.

20. The integrated voltmeter device housing prepared by a computer-aided manufacturing process of claim 19, further comprising the steps of:

operatively connecting each device socket connector terminal to the voltage measurement circuitry via one of the electrically conductive wires;

partially inserting each of the device socket connector terminals into one of the mating terminal channels, so as to partially enclose each of the device socket connector terminals within one of the mating terminal channels, and to allow electrically conductive contact to be made between each of the battery pin connector terminals and each of the device socket connector terminals;

inserting each of the electrically conductive wires into one of the wire channels; and inserting the measurement display and the voltage measurement circuitry into the voltmeter housing portion.

* * * * *